US012414337B2

(12) United States Patent
Ha et al.

(10) Patent No.: US 12,414,337 B2
(45) Date of Patent: Sep. 9, 2025

(54) SEMICONDUCTOR DEVICE INCLUDING REFLOW LAYERS

(71) Applicant: SAMSUNG ELECTRONICS CO., LTD., Suwon-si (KR)

(72) Inventors: Ryong Ha, Seoul (KR); Seokhoon Kim, Suwon-si (KR); Dohyun Go, Suwon-si (KR); Jungtaek Kim, Yongin-si (KR); Moon Seung Yang, Hwaseong-si (KR); Sanggil Lee, Ansan-si (KR); Seojin Jeong, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 569 days.

(21) Appl. No.: 17/815,187

(22) Filed: Jul. 26, 2022

(65) Prior Publication Data

US 2023/0111579 A1 Apr. 13, 2023

(30) Foreign Application Priority Data

Sep. 28, 2021 (KR) ........................ 10-2021-0127862

(51) Int. Cl.
*H10D 30/67* (2025.01)
*H10D 30/01* (2025.01)
(Continued)

(52) U.S. Cl.
CPC ....... *H10D 30/6757* (2025.01); *H10D 30/014* (2025.01); *H10D 30/43* (2025.01);
(Continued)

(58) Field of Classification Search
CPC ............... H10D 30/6757; H10D 30/43; H10D 30/6735; H10D 30/6748; H10D 30/689;
(Continued)

(56) References Cited

U.S. PATENT DOCUMENTS 8,785,907 B2 7/2014 Goel et al.
10,461,167 B2 * 10/2019 Lee ...................... H10D 84/014
(Continued)

FOREIGN PATENT DOCUMENTS

CN 112349716 2/2021
EP 4009377 8/2022
(Continued)

OTHER PUBLICATIONS

Office Action dated Feb. 26, 2025 issued in corresponding to Korean Patent Application No. 10-2021-0127862.

*Primary Examiner* — Ida M Soward
(74) *Attorney, Agent, or Firm* — Morgan, Lewis & Bockius LLP

(57) ABSTRACT

A semiconductor device includes a substrate that includes an active pattern, a channel pattern disposed on the active pattern, where the channel pattern includes a plurality of semiconductor patterns that are vertically stacked and spaced apart from each other, a source/drain pattern connected to the semiconductor patterns, and a gate electrode disposed on the semiconductor patterns. The gate electrode includes a plurality of portions that are respectively interposed between the semiconductor patterns, and the source/drain pattern includes a buffer layer in contact with the semiconductor patterns and a main layer disposed on the buffer layer. The buffer layer contains silicon germanium (SiGe) and includes a first semiconductor layer and a first reflow layer thereon. A germanium concentration of the first reflow layer is less than that of the first semiconductor layer.

20 Claims, 36 Drawing Sheets

(51) Int. Cl.
*H10D 30/43* (2025.01)
*H10D 62/10* (2025.01)
*H10D 62/13* (2025.01)
*H10D 64/01* (2025.01)
*H10D 64/23* (2025.01)
*H10D 84/01* (2025.01)
*H10D 84/03* (2025.01)
*H10D 84/85* (2025.01)

(52) U.S. Cl.
CPC ..... *H10D 30/6735* (2025.01); *H10D 30/6748* (2025.01); *H10D 62/121* (2025.01); *H10D 62/151* (2025.01); *H10D 64/01* (2025.01); *H10D 64/258* (2025.01); *H10D 84/0167* (2025.01); *H10D 84/017* (2025.01); *H10D 84/038* (2025.01); *H10D 84/85* (2025.01)

(58) Field of Classification Search
CPC .. H10D 62/121; H10D 62/151; H10D 64/258; H10D 64/252; H10D 84/85; H10D 84/852; H10D 84/201; H10D 84/135; H10D 84/144; H10D 84/903; H10D 44/474; H01H 20/826
See application file for complete search history.

(56) References Cited

U.S. PATENT DOCUMENTS

| | | | |
|---|---|---|---|
| 10,720,530 B2 | 7/2020 | Ma et al. | |
| 11,069,776 B2 | 7/2021 | Lee et al. | |
| 11,133,383 B2 * | 9/2021 | Noh | H01L 21/02532 |
| 11,145,720 B2 * | 10/2021 | Lee | H10D 30/62 |
| 11,233,122 B2 | 1/2022 | Kim et al. | |
| 11,495,682 B2 * | 11/2022 | Yang | H10D 30/031 |
| 11,688,778 B2 | 6/2023 | Ha et al. | |
| 2005/0151228 A1 | 7/2005 | Tanida et al. | |
| 2016/0133748 A1 * | 5/2016 | Kang | H10D 62/151 438/285 |
| 2017/0077244 A1 | 3/2017 | Chang et al. | |
| 2018/0286861 A1 * | 10/2018 | Choi | H10D 30/62 |
| 2018/0374926 A1 * | 12/2018 | Lee | H10D 86/471 |
| 2019/0027475 A1 * | 1/2019 | Suk | H10D 84/0167 |
| 2020/0013898 A1 * | 1/2020 | Yim | H10D 30/6735 |
| 2020/0013899 A1 * | 1/2020 | Kim | H10D 30/0415 |
| 2020/0287013 A1 * | 9/2020 | Lee | H01L 21/28088 |
| 2020/0381311 A1 * | 12/2020 | Kim | H10D 30/6739 |
| 2020/0381546 A1 | 12/2020 | Cho et al. | |
| 2020/0381564 A1 | 12/2020 | Kang et al. | |
| 2021/0013204 A1 * | 1/2021 | Choi | H10D 84/017 |
| 2021/0057579 A1 | 2/2021 | Chen et al. | |
| 2021/0082914 A1 | 3/2021 | Lee et al. | |
| 2021/0104612 A1 * | 4/2021 | Bae | B82Y 10/00 |
| 2021/0118880 A1 * | 4/2021 | Kim | H10D 30/797 |
| 2021/0126102 A1 * | 4/2021 | Nakjin | H01L 21/02603 |
| 2021/0183786 A1 * | 6/2021 | Hong | H01L 23/5226 |
| 2021/0210608 A1 * | 7/2021 | Shih | H10D 30/62 |
| 2021/0242203 A1 * | 8/2021 | Ding | H01L 21/76898 |

FOREIGN PATENT DOCUMENTS

| | | |
|---|---|---|
| JP | 2005167093 | 6/2005 |
| KR | 10-2021-0091478 A | 7/2021 |
| KR | 10-2021-0092360 A | 7/2021 |

* cited by examiner

SEMICONDUCTOR DEVICE INCLUDING REFLOW LAYERS

CROSS-REFERENCE TO RELATED APPLICATIONS

This U.S. non-provisional patent application claims priority under 35 U.S.C. § 119 from Korean Patent Application No. 10-2021-0127862, filed on Sep. 28, 2021 in the Korean Intellectual Property Office, the contents of which are herein incorporated by reference in their entirety.

TECHNICAL FIELD

Embodiments of the present disclosure are directed to a semiconductor device and a method of fabricating the same, and in particular, to a semiconductor device that includes a field effect transistor and a method of fabricating the same.

DISCUSSION OF THE RELATED ART

A semiconductor device includes an integrated circuit that includes metal-oxide-semiconductor field-effect transistors (MOS-FETs). To provide a semiconductor device with a small pattern size and a reduced design rule, the MOS-FETs are being scaled down. The scaling-down of the MOS-FETs may degrade operational properties of the semiconductor device.

SUMMARY

An embodiment of the inventive concept provides a semiconductor device with increased reliability.

An embodiment of the inventive concept provides a method of fabricating a semiconductor device with increased reliability.

According to an embodiment of the inventive concept, a semiconductor device includes a substrate that includes an active pattern, a channel pattern disposed on the active pattern, where the channel pattern includes a plurality of semiconductor patterns that are vertically stacked and spaced apart from each other, a source/drain pattern connected to the plurality of semiconductor patterns, and a gate electrode disposed on the plurality of semiconductor patterns. The gate electrode includes a plurality of portions that are respectively interposed between the plurality of semiconductor patterns, and the source/drain pattern includes a buffer layer in contact with the plurality of semiconductor patterns and a main layer disposed on the buffer layer. The buffer layer contains silicon germanium (SiGe) and includes a first semiconductor layer and a first reflow layer disposed on the first semiconductor layer. A germanium concentration of the first reflow layer is less than a germanium concentration of the first semiconductor layer. The first semiconductor layer includes a protruding side surface that protrudes toward a first portion of the plurality of portions of the gate electrode, and a concave side surface in contact with a first semiconductor pattern of the plurality of semiconductor patterns. The first reflow layer includes a protruding portion that corresponds to the protruding side surface and a concave portion that corresponds to the concave side surface.

According to an embodiment of the inventive concept, a semiconductor device includes a substrate that includes an active pattern, a pair of channel patterns disposed on the active pattern, a source/drain pattern interposed between the pair of channel patterns, a pair of gate electrodes disposed on the pair of channel patterns, respectively, and a gate spacer disposed on a side surface of each of the pair of gate electrodes. When viewed in a plan view, the source/drain pattern include a buffer layer interposed between a first end and a second end of the gate spacer and a main layer disposed on the buffer layer, and the buffer layer includes at least one reflow layer. An edge portion of the buffer layer has a first thickness, and a center portion of the buffer layer has a second thickness greater than the first thickness. A ratio of the first thickness to the second thickness ranges from 0.2 to 0.8.

According to an embodiment of the inventive concept, a semiconductor device includes a substrate that includes a PMOSFET region and an NMOSFET region that are spaced apart from each other, a first active pattern disposed on the PMOSFET region and a second active pattern disposed on the NMOSFET region, a first channel pattern and a first source/drain pattern disposed on the first active pattern, a second channel pattern and a second source/drain pattern disposed on the second active pattern, a gate electrode disposed on the first and second channel patterns, a gate insulating layer interposed between the gate electrode and the first and second channel patterns, a gate spacer disposed on a side surface of the gate electrode, a gate capping pattern disposed on a top surface of the gate electrode, a gate cutting pattern that penetrates the gate electrode, an interlayer insulating layer disposed on the gate capping pattern and the gate cutting pattern, first and second active contacts that penetrate the interlayer insulating layer and are electrically connected to the first and second source/drain patterns, respectively, metal-semiconductor compound layers respectively interposed between the first and second active contacts and the first and second source/drain patterns, a gate contact that penetrates the interlayer insulating layer and the gate capping pattern and is electrically connected to the gate electrode, a first metal layer disposed on the interlayer insulating layer, where the first metal layer includes a power line that vertically overlaps the gate cutting pattern, and first interconnection lines that are electrically and respectively connected to the first and second active contacts and the gate contact, and a second metal layer disposed on the first metal layer. The second metal layer includes second interconnection lines electrically connected to the first metal layer. The first channel pattern includes a plurality of semiconductor patterns that are vertically stacked and are spaced apart from each other. The first source/drain pattern includes a buffer layer in contact with the plurality of semiconductor patterns and a main layer disposed on the buffer layer. The buffer layer includes a first semiconductor layer and a first reflow layer disposed on the first semiconductor layer.

According to an embodiment of the inventive concept, a method of fabricating a semiconductor device includes forming a stacking pattern on a substrate, where the stacking pattern includes active layers and sacrificial layers that are alternately stacked, forming a sacrificial pattern on the stacking pattern, where the stacking pattern is adjacent to a side portion of the sacrificial pattern, etching the stacking pattern to form a recess, forming a source/drain pattern in the recess, and replacing the sacrificial pattern and the sacrificial layers with a gate electrode. The formation of the source/drain pattern includes performing a first selective epitaxial growth (SEG) process on an inner surface of the recess to form a first semiconductor layer and performing a first reflow process on the first semiconductor layer to form a first reflow layer. A germanium concentration of the first reflow layer is less than a germanium concentration of the first semiconductor layer.

DETAILED DESCRIPTION

Figure 1:
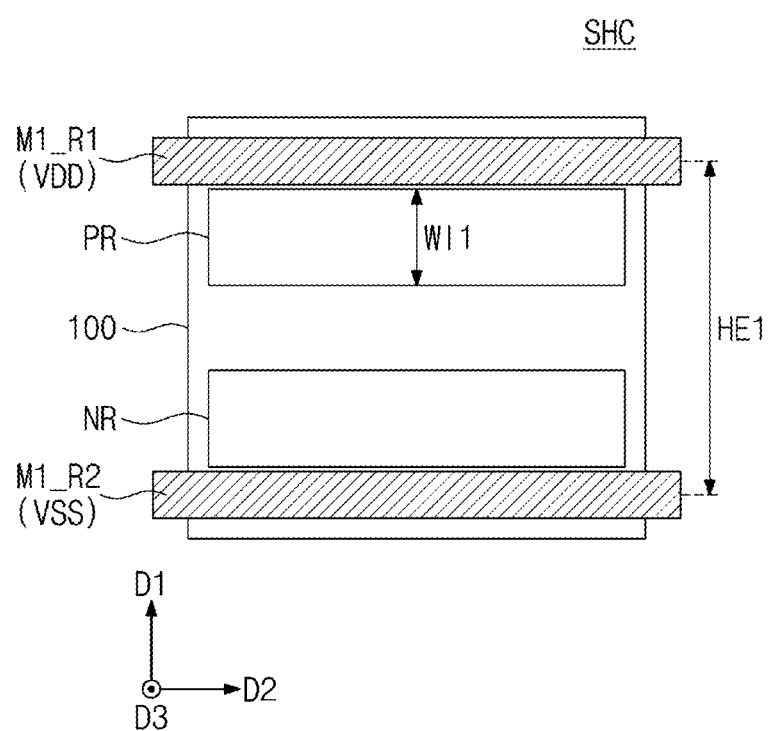
FIGS. 1 to 3 are plan views of logic cells of a semiconductor device according to an embodiment of the inventive concept.
Figure 2:
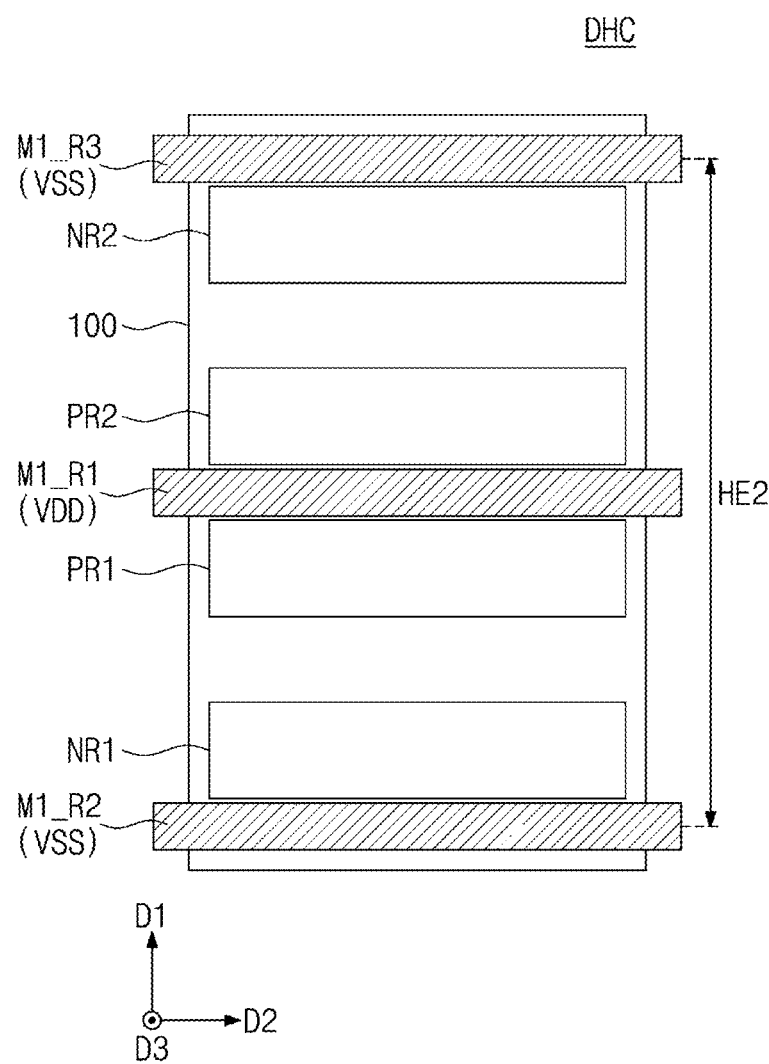
Figure 3:
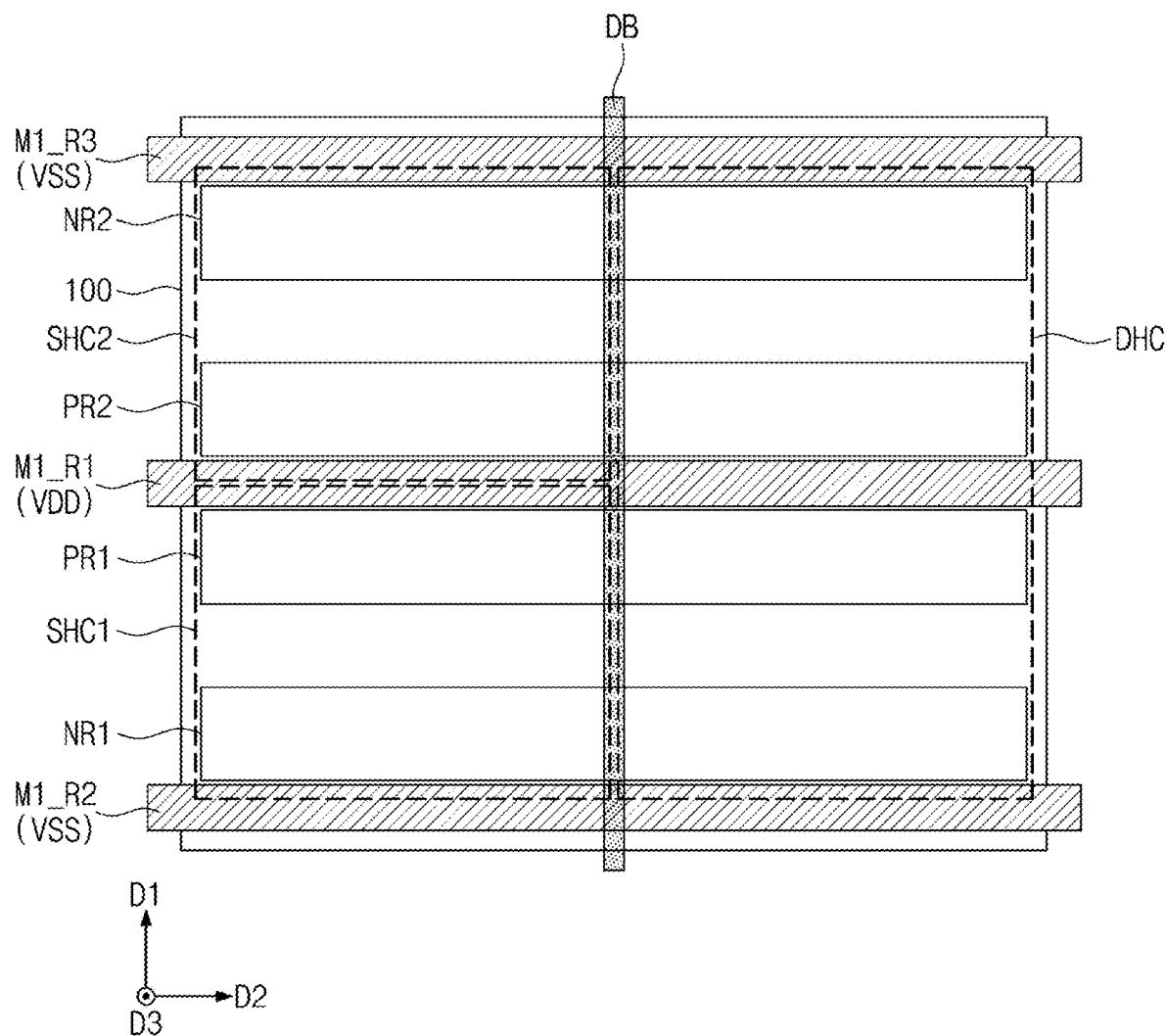

FIGS. 1 to 3 are plan views of logic cells of a semiconductor device according to an embodiment of the inventive concept.

Referring to FIG. 1, in an embodiment, a single height cell SHC is provided. In detail, a first power line M1_R1 and a second power line M1_R2 are disposed on a substrate 100. The first power line M1_R1 may be a conduction path through which a drain voltage VDD, such as a power voltage, is transmitted. The second power line M1_R2 may be a conduction path through which a source voltage VSS, such as a ground voltage, is transmitted.

The single height cell SHC is formed between the first power line M1_R1 and the second power line M1_R2. The single height cell SHC includes one PMOSFET region PR and one NMOSFET region NR. For example, the single height cell SHC has a CMOS structure provided between the first and second power lines M1_R1 and M1_R2.

Each of the PMOSFET and NMOSFET regions PR and NR has a first width WII in a first direction D1. A length of the single height cell SHC in the first direction D1 is defined as a first height HE1. The first height HE1 is substantially equal to a distance, such as a pitch, between the first and second power lines M1_R1 and M1_R2.

The single height cell SHC constitutes a single logic cell. In a present embodiment, the logic cell may mean a logic device, such as AND, OR, XOR, XNOR, inverter, etc., that is configured to execute a specific function. For example, the logic cell includes transistors that constitute the logic device and interconnection lines that connect transistors to each other.

Referring to FIG. 2, in an embodiment, a double height cell DHC is provided. In detail, the first power line M1_R1, the second power line M1_R2, and a third power line M1_R3 are disposed on the substrate 100. The first power line M1_R1 is disposed between the second power line M1_R2 and the third power line M1_R3. The third power line M1_R3 is a conduction path through which the drain voltage VDD is transmitted.

The double height cell DHC is formed between the second power line M1_R2 and the third power line M1_R3. The double height cell DHC includes a first PMOSFET region PR1, a second PMOSFET region PR2, a first NMOSFET region NR1, and a second NMOSFET region NR2.

The first NMOSFET region NR1 is adjacent to the second power line M1_R2. The second NMOSFET region NR2 is adjacent to the third power line M1_R3. The first and second PMOSFET regions PR1 and PR2 are adjacent to the first power line M1_R1. When viewed in a plan view, the first power line M1_R1 is disposed between the first and second PMOSFET regions PR1 and PR2.

A length of the double height cell DHC in the first direction D1 is defined as a second height HE2. The second height HE2 is about twice the first height HE1 of FIG. 1. The first and second PMOSFET regions PR1 and PR2 of the double height cell DHC may be combined to form a single PMOSFET region.

Thus, a channel size of a PMOS transistor of the double height cell DHC is greater than a channel size of a PMOS transistor of the single height cell SHC previously described with reference to FIG. 1. For example, the channel size of the PMOS transistor of the double height cell DHC is about twice the channel size of the PMOS transistor of the single height cell SHC. The double height cell DHC can operate at a higher speed than the single height cell SHC. In an embodiment, the double height cell DHC shown in FIG. 2 is defined as a multi-height cell. A multi-height cell includes a triple height cell whose cell height is about three times that of the single height cell SHC.

Referring to FIG. 3, in an embodiment, a first single height cell SHC1, a second single height cell SHC2, and the double height cell DHC are two-dimensionally disposed on the substrate 100. The first single height cell SHC1 is disposed between the first and second power lines M1_R1 and M1_R2. The second single height cell SHC2 may be disposed between the first and third power lines M1_R1 and M1_R3. The second single height cell SHC2 is adjacent to the first single height cell SHC1 in the first direction D1.

The double height cell DHC is disposed between the second and third power lines M1_R2 and M1_R3. The double height cell DHC is adjacent to the first and second single height cells SHC1 and SHC2 in a second direction D2 that crosses the first direction D1.

A division structure DB is disposed between the first single height cell SHC1 and the double height cell DHC and between the second single height cell SHC2 and the double height cell DHC. The active region of the double height cell DHC is electrically separated from the active region of each of the first and second single height cells SHC1 and SHC2 by the division structure DB.

Figure 4:
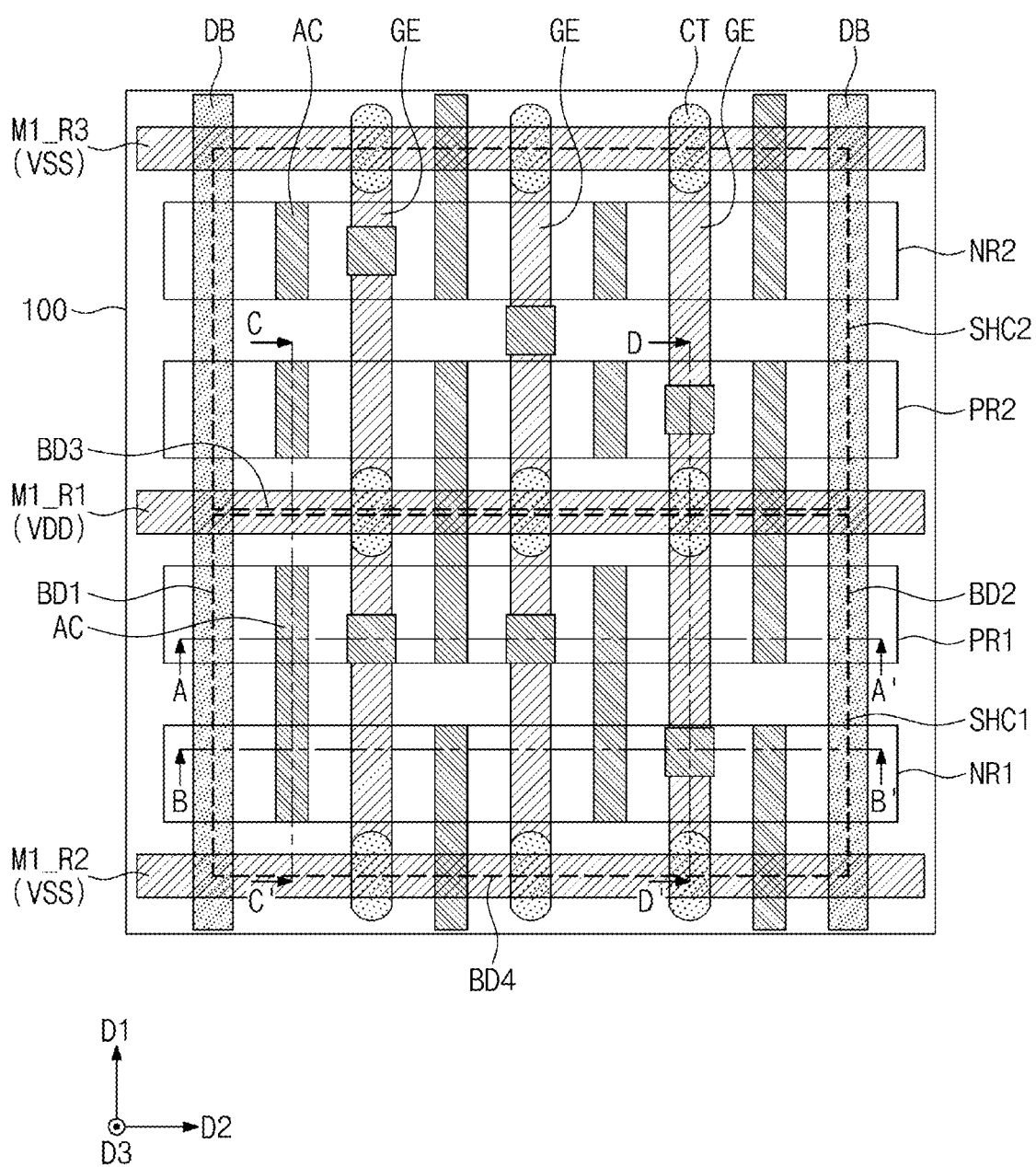
FIG. 4 is a plan view of a semiconductor device according to an embodiment of the inventive concept.
Figure 6:
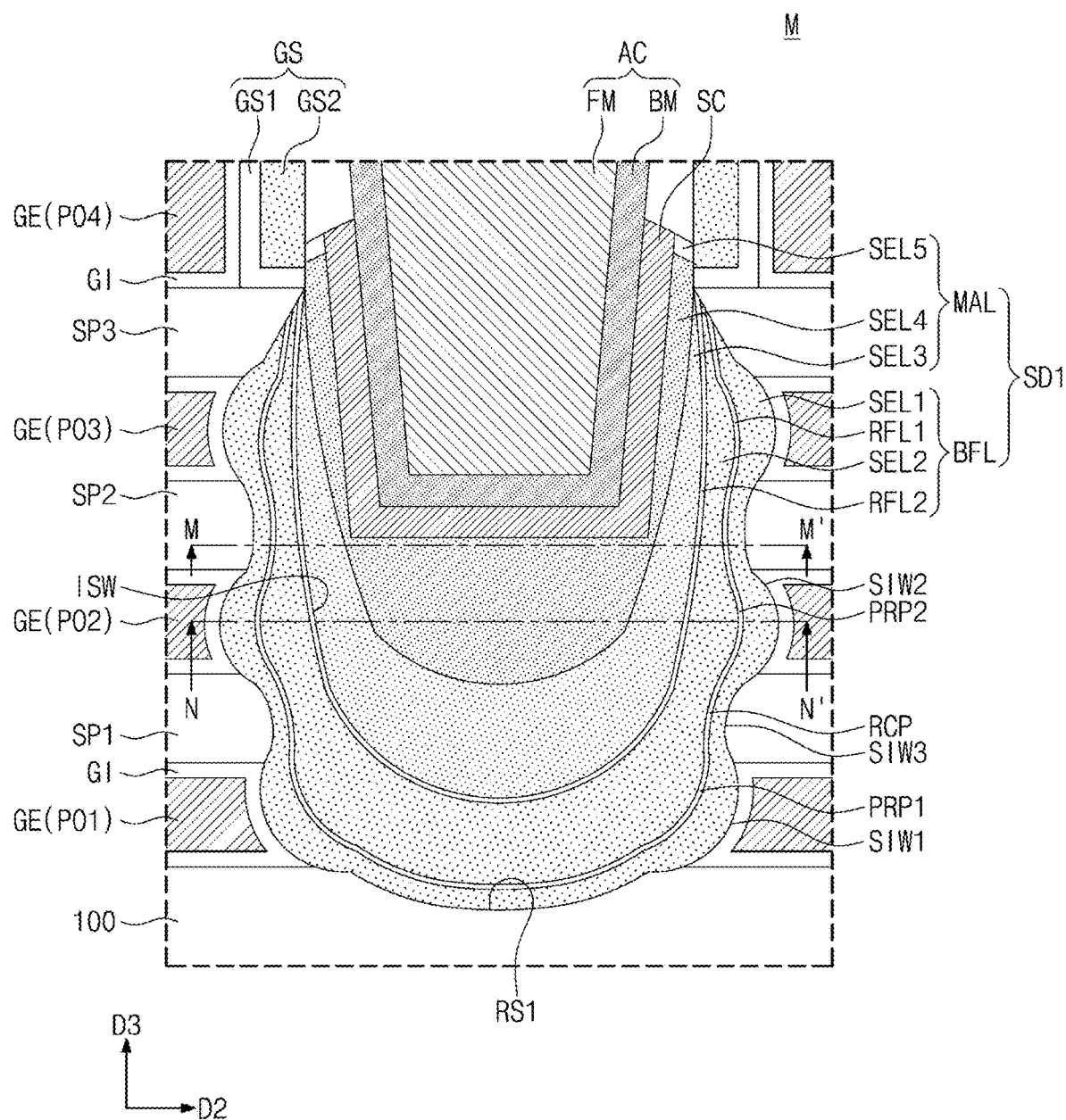
FIG. 6 is an enlarged view of a portion 'M' of FIG. 5A.
Figure 7A:
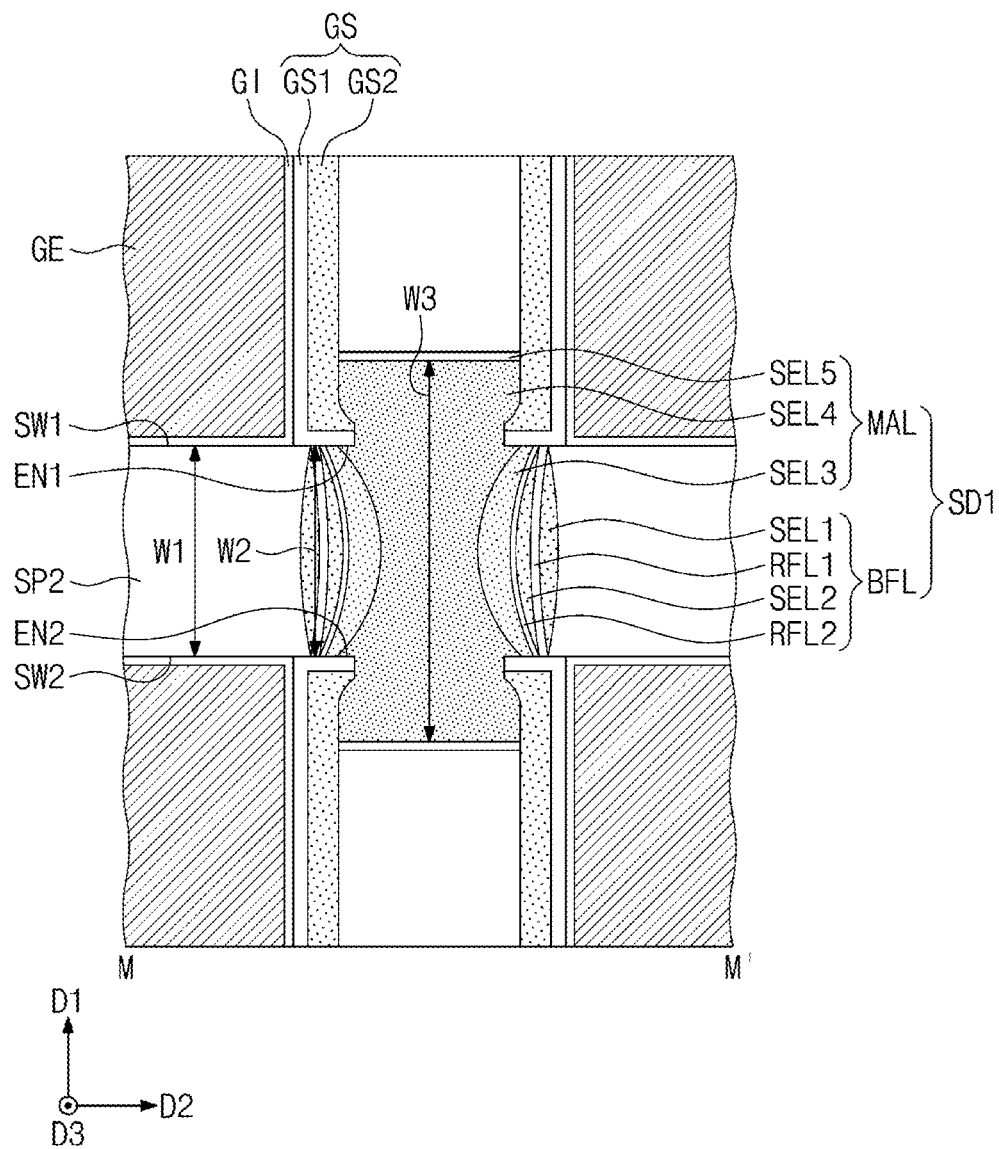
FIG. 7A is a top plan view taken at a level M-M' of FIG. 6.
Figure 7B:
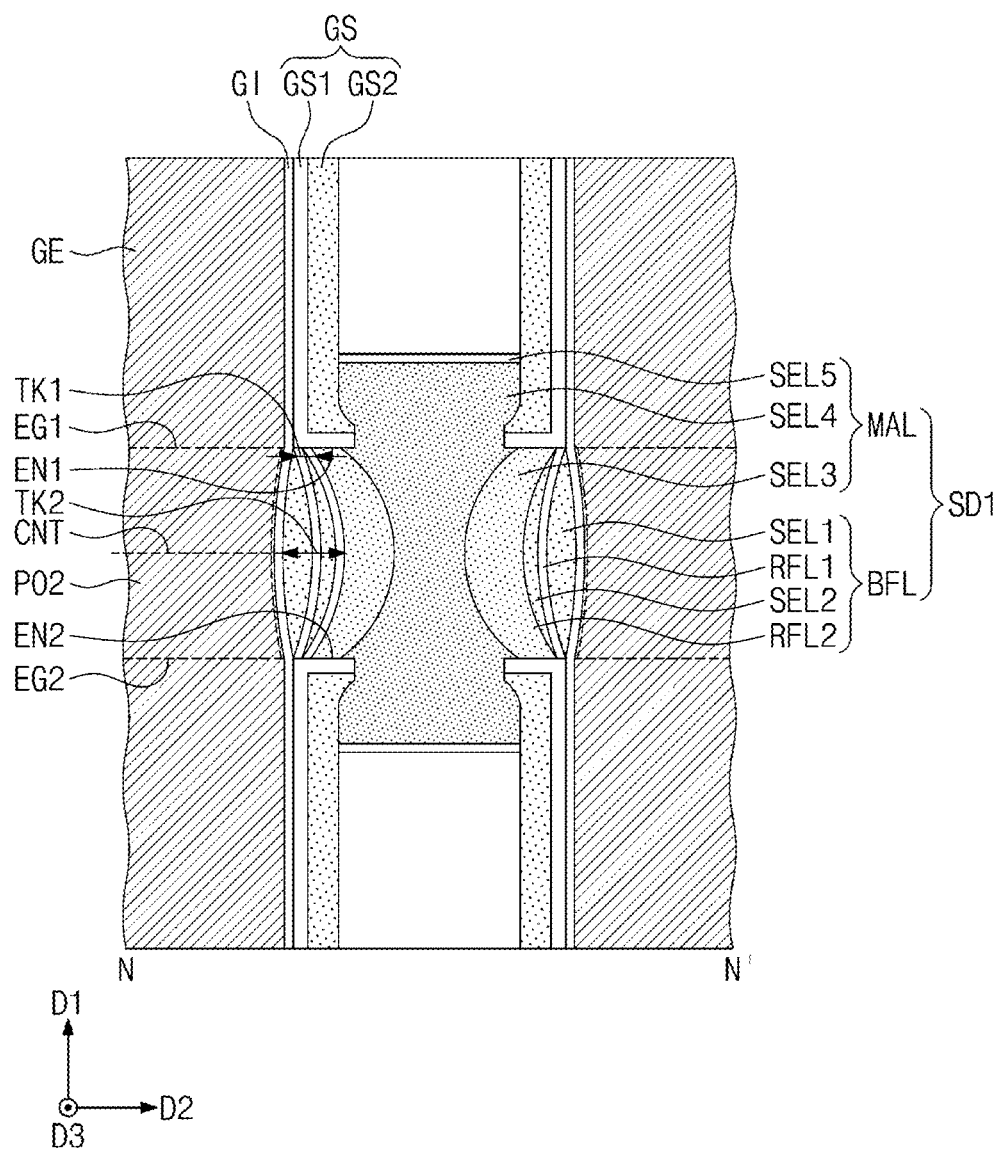
FIG. 7B is a top plan view taken at a level N-N' of FIG. 6.

FIG. 4 is a plan view of a semiconductor device according to an embodiment of the inventive concept. FIGS. 5A to 5D are sectional views that are respectively taken along lines A-A', B-B', C-C', and D-D' of FIG. 4. FIG. 6 is an enlarged view of a portion 'M' of FIG. 5A. FIG. 7A is a top plan view taken at a level M-M' of FIG. 6. FIG. 7B is a top plan view taken at a level N-N' of FIG. 6. FIGS. 4 and 5A to 5D illustrate an example of the first and second single height cells SHC1 and SHC2 of FIG. 3.

Referring to FIGS. 4 and 5A to 5D, in an embodiment, the first and second single height cells SHC1 and SHC2 are disposed on the substrate 100. Logic transistors of a logic circuit are disposed on each of the first and second single height cells SHC1 and SHC2. The substrate 100 is a semiconductor substrate that is formed of or includes at least one of silicon, germanium, silicon germanium, a compound semiconductor material, etc. In an embodiment, the substrate 100 is a silicon wafer.

The substrate 100 includes the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 extends in the second direction D2. The first single height cell SHC1 includes the first NMOSFET region NR1 and the first PMOSFET region PR1, and the second single height cell SHC2 includes the second PMOSFET region PR2 and the second NMOSFET region NR2.

A first active pattern AP1 and a second active pattern AP2 are separated by a trench TR that is formed in an upper portion of the substrate 100. The first active pattern AP1 is disposed on each of the first and second PMOSFET regions PR1 and PR2. The second active pattern AP2 is disposed on each of the first and second NMOSFET regions NR1 and NR2. The first and second active patterns AP1 and AP2 extend in the second direction D2. Each of the first and second active patterns AP1 and AP2 vertically protrudes from the substrate 100.

A device isolation layer ST fills the trench TR. The device isolation layer ST includes a silicon oxide layer. The device isolation layer ST does not cover first and second channel patterns CH1 and CH2 to be described below.

The first channel pattern CH1 is disposed on the first active pattern AP1. The second channel pattern CH2 is disposed on the second active pattern AP2. Each of the first and second channel patterns CH1 and CH2 includes a first semiconductor pattern SP1, a second semiconductor pattern SP2, and a third semiconductor pattern SP3 that are sequentially stacked. The first to third semiconductor patterns SP1, SP2, and SP3 are spaced apart from each other in a vertical direction, such as a third direction D3 that is normal to a plane defined by the first direction D1and the second direction D2.

Each of the first to third semiconductor patterns SP1, SP2, and SP3 is formed of or includes at least one of silicon (Si), germanium (Ge), or silicon germanium (SiGe). In an embodiment, each of the first to third semiconductor patterns SP1, SP2, and SP3 is formed of or includes crystalline silicon.

A plurality of first source/drain patterns SD1 are disposed on the first active pattern AP1. A plurality of first recesses RS1 are formed in an upper portion of the first active pattern AP1. The first source/drain patterns SD1 are disposed in the first recesses RS1. The first source/drain patterns SD1 are impurity regions of a first conductivity type, such as a p-type. The first channel pattern CH1 is interposed between each pair of the first source/drain patterns SD1. For example, each pair of the first source/drain patterns SD1 is connected to each other by the stacked first to third semiconductor patterns SP1, SP2, and SP3.

A plurality of second source/drain patterns SD2 are disposed on the second active pattern AP2. A plurality of second recesses RS2 are formed in an upper portion of the second active pattern AP2. The second source/drain patterns SD2 are disposed in the second recesses RS2. The second source/drain patterns SD2 are impurity regions of a second conductivity type, such as an n-type. The second channel pattern CH2 are interposed between each pair of the second source/drain patterns SD2. For example, each pair of the second source/drain patterns SD2 is connected to each other by the stacked first to third semiconductor patterns SP1, SP2, and SP3.

The first and second source/drain patterns SD1 and SD2 are epitaxial patterns formed by a selective epitaxial growth (SEG) process. In an embodiment, each of the first and second source/drain patterns SD1 and SD2 has a top surface that is higher than a top surface of the third semiconductor pattern SP3. In an embodiment, a top surface of at least one of the first and second source/drain patterns SD1 and SD2 is substantially coplanar with the top surface of the third semiconductor pattern SP3.

The first source/drain patterns SD1 include a semiconductor material, such as SiGe, whose lattice constant is greater than that of the substrate 100. The pair of the first source/drain patterns SD1 exert a compressive stress on the first channel patterns CH1 therebetween. The second source/drain patterns SD2 are formed of or include the same semiconductor element, such as Si, as the substrate 100.

Each of the first source/drain patterns SD1 includes a buffer layer BFL and a main layer MAL disposed on the buffer layer BFL. Hereinafter, a sectional shape of the first source/drain pattern SD1 in the second direction D2 will be described in more detail with reference to FIG. 5A.

The buffer layer BFL covers an inner surface of the first recess RS1. In an embodiment, the buffer layer BFL has a thickness that decreases in an upward direction. For example, a thickness of the buffer layer BFL measured in the third direction D3 from a bottom of the first recess RS1 is greater than a thickness of the buffer layer BFL as measured in the second direction D2 from a top level of the first recess RS1. In addition, the buffer layer BFL has a 'U'-shaped section along a profile of the first recess RS1.

A side surface of the buffer layer BFL has an uneven or embossing shape. For example, the side surface of the buffer layer BFL has a wavy profile. In detail, the side surface of the buffer layer BFL has portions that protrude toward first to third portions PO1, PO2, and PO3 of a gate electrode GE, which will be described below, and thus has the wavy profile.

The main layer MAL fills most of an unfilled region of the first recess RS1. A volume of the main layer MAL is greater than a volume of the buffer layer BFL. For example, a ratio of the volume of the main layer MAL to a total volume of the first source/drain pattern SD1 is greater than a ratio of the volume of the buffer layer BFL to a total volume of the first source/drain pattern SD1.

Each of the buffer and main layers BFL and MAL is formed of or includes silicon germanium (SiGe). In detail, the buffer layer BFL contains a relatively low concentration of germanium (Ge). In an embodiment, the buffer layer BFL contains only silicon (Si), without germanium (Ge). A germanium concentration of the buffer layer BFL ranges from 0 at % to 10 at % (atomic percentage). More specifically, the germanium concentration of the buffer layer BFL ranges from 2 at % to 8 at %.

The main layer MAL contains a relatively high concentration of germanium (Ge), as compared to the buffer layer BFL. For example, a germanium concentration of the main layer MAL ranges from 30 at % to 70 at %. The germanium concentration of the main layer MAL increases in the third direction D3. For example, a portion of the main layer MAL adjacent to the buffer layer BFL has a germanium concentration of about 40 at %, and an upper portion of the main layer MAL has a germanium concentration of about 60 at %.

Each of the buffer and main layers BFL and MAL contains an impurity, such as boron, gallium, or indium, that provides the first source/drain pattern SD1 with a p-type conductivity. The impurity concentration of each of the buffer and main layers BFL and MAL ranges from $1\times10^{18}$ atoms/cm$^3$ to $5\times10^{22}$ atoms/cm$^3$. An impurity concentration of the main layer MAL is greater than an impurity concentration of the buffer layer BFL.

The buffer layer BFL prevents a stacking fault between a portion of the substrate 100, such as the first active pattern AP1, and the main layer MAL, and between the first to third semiconductor patterns SP1, SP2, and SP3 and the main layer MAL. A stacking fault may increase a channel resistance. A stacking fault can occur on the bottom of the first recess RS1. Thus, to prevent a stacking fault, the buffer layer BFL has a greater thickness near the bottom of the first recess RS1.

The buffer layer BFL protects the main layer MAL during a process of replacing sacrificial layers SAL, which will be described below, with the first to third portions PO1, PO2, and PO3 of the gate electrode GE. For example, the buffer layer BFL prevents an etchant material used to remove the sacrificial layers SAL from entering and etching the main layer MAL.

Referring back to FIGS. 4 and 5A to 5D, in an embodiment, the gate electrodes GE extend in the first direction D1 on the substrate 100 and cross the first and second channel patterns CH1 and CH2. The gate electrodes GE are arranged at a first pitch in the second direction D2. Each of the gate electrodes GE vertically overlaps the first and second channel patterns CH1 and CH2.

The gate electrode GE includes a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Referring back to FIG. 5A, in an embodiment, each of the first to third portions PO1, PO2, and PO3 of the gate electrode GE on the PMOSFET region PR has a concave side surface. The concave side surfaces of the first to third portions PO1, PO2, and PO3 correspond to protruding side surface portions of the first source/drain pattern SD1. The first to third portions PO1, PO2, and PO3 of the gate electrode GE on the PMOSFET region PR have different widths from each other. For example, the largest width of the third portion PO3 in the second direction D2 is greater than the largest width of the second portion PO2 in the second direction D2. The largest width of the first portion PO1 in the second direction D2 is greater than the largest width of the third portion PO3 in the second direction D2.

Referring back to FIG. 5D, in an embodiment, the gate electrode GE surrounds a top surface TS, a bottom surface BS, and opposite side surfaces SW of each of the first to third semiconductor patterns SP1, SP2, and SP3. For example, the transistor according to an embodiment is a three-dimensional field effect transistor, such as an MBCFET or a GAAFET, in which the gate electrode GE three-dimensionally surrounds the channel pattern.

Referring back to FIGS. 4 and 5A to 5D, in an embodiment, the first single height cell SHC1 has a first border BD1 and a second border BD2 that are opposite to each other in the second direction D2. The first and second borders BD1 and BD2 extend in the first direction D1. The first single height cell SHC1 has a third border BD3 and a fourth border BD4 that are opposite to each other in the first direction D1. The third and fourth borders BD3 and BD4 extend in the second direction D2.

Gate cutting patterns CT are disposed on a border parallel to the second direction D2 of each of the first and second single height cells SHC1 and SHC2. For example, the gate cutting patterns CT are disposed on the third and fourth borders BD3 and BD4 of the first single height cell SHC1. The gate cutting patterns CT are arranged at the first pitch along the third border BD3. The gate cutting patterns CT are arranged at the first pitch along the fourth border BD4. When viewed in a plan view, the gate cutting patterns CT on the third and fourth borders BD3 and BD4 overlap the gate electrodes GE, respectively. The gate cutting patterns CT are formed of or include at least one insulating material, such as silicon oxide, silicon nitride, or combinations thereof.

The gate electrode GE on the first single height cell SHC1 is separated from the gate electrode GE on the second single height cell SHC2 by the gate cutting pattern CT. The gate cutting pattern CT is interposed between the gate electrodes GE on the first and second single height cells SHC1 and SHC2, and the gate electrodes GE are aligned with each other in the first direction D1. For example, the gate electrode GE that extends in the first direction D1 is divided into a plurality of the gate electrodes GE by the gate cutting patterns CT.

A pair of gate spacers GS are respectively disposed on opposite side surfaces of the fourth portion PO4 of the gate electrode GE. The gate spacers GS extend along the gate electrode GE and in the first direction D1. Top surfaces of the gate spacers GS are higher than a top surface of the gate electrode GE. The top surfaces of the gate spacers GS are coplanar with a top surface of a first interlayer insulating layer 110, which will be described below. In an embodiment, the gate spacers GS are formed of or include at least one of SiCN, SiCON, or SiN. In an embodiment, the gate spacers GS is a multi-layered structure that is formed of or includes at least two different materials selected from SiCN, SiCON, or SiN. In an embodiment, the gate spacer GS includes a first spacer GS1 and a second spacer GS2, as illustrated in FIG. 6.

A gate capping pattern GP is disposed on the gate electrode GE. The gate capping pattern GP extends along the gate electrode GE or in the first direction D1. The gate capping pattern GP is formed of or includes a material that has an etch selectivity with respect to first and second interlayer insulating layers 110 and 120, which will be described below. In detail, the gate capping pattern GP is formed of or includes at least one of SiON, SiCN, SiCON, or SiN.

A gate insulating layer GI is interposed between the gate electrode GE and the first channel pattern CH1 and between the gate electrode GE and the second channel pattern CH2. The gate insulating layer GI surrounds the top surface TS, the bottom surface BS, and the opposite side surfaces SW of each of the first to third semiconductor patterns SP1, SP2, and SP3. The gate insulating layer GI covers a top surface of the device isolation layer ST below the gate electrode GE.

In an embodiment, the gate insulating layer GI includes a silicon oxide layer, a silicon oxynitride layer, and/or a high-k dielectric layer. The high-k dielectric layer is formed of or includes at least one high-k dielectric material whose dielectric constant is greater than that of silicon oxide. For example, the high-k dielectric material includes at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an embodiment, the semiconductor device includes a negative capacitance (NC) FET that uses a negative capacitor. For example, the gate insulating layer GI includes a ferroelectric layer and a paraelectric layer.

The ferroelectric layer has a negative capacitance, and the paraelectric layer has a positive capacitance. When two or more capacitors are connected in series and each capacitor has a positive capacitance, a total capacitance is reduced to a value that is less than a capacitance of each of the capacitors. By contrast, when at least one of the serially-connected capacitors has a negative capacitance, a total capacitance of the serially-connected capacitors has a positive value that is greater than an absolute value of each capacitance.

When a negative capacitance ferroelectric layer and a positive capacitance paraelectric layer are connected in series, a total capacitance of the serially-connected ferroelectric and paraelectric layers increases. Due to an increase of the total capacitance, a transistor that includes a ferroelectric layer has a subthreshold swing (SS) of less than 60 mV/decade at room temperature.

The ferroelectric layer is formed of or includes at least one of, for example, hafnium oxide, hafnium zirconium oxide, barium strontium titanium oxide, barium titanium oxide, and/or lead zirconium titanium oxide. The hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer further includes dopants. For example, the dopants include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of dopants in the ferroelectric layer varies depending on the ferroelectric material in the ferroelectric layer.

When the ferroelectric layer includes hafnium oxide, the dopants in the ferroelectric layer include at least one of, for example, gadolinium (Gd), silicon (Si), zirconium (Zr), aluminum (Al), and/or yttrium (Y).

When the dopant is aluminum (Al), an aluminum content in the ferroelectric layer ranges from 3 to 8 at %. The content of the dopants is a ratio of the number of aluminum atoms to the number of hafnium and aluminum atoms.

When the dopant is silicon (Si), a silicon content in the ferroelectric layer ranges from 2 at % to 10 at %. When the dopant is yttrium (Y), a yttrium content in the ferroelectric layer ranges from 2 at % to 10 at %. When the dopant is gadolinium (Gd), a gadolinium content in the ferroelectric layer ranges from 1 at % to 7 at %. When the dopant is zirconium (Zr), a zirconium content in the ferroelectric layer ranges from 50 at % to 80 at %.

The paraelectric layer is formed of or includes at least one of, for example, silicon oxide and/or a high-k metal oxide. The metal oxides that can be used as the paraelectric layer include at least one of, for example, hafnium oxide, zirconium oxide, and/or aluminum oxide, but embodiments of the inventive concept are not necessarily limited to these examples.

The ferroelectric layer and the paraelectric layer are formed of or include the same material. The ferroelectric layer is ferroelectric, but the paraelectric layer is not ferroelectric. For example, when the ferroelectric and paraelectric layers contain hafnium oxide, a crystal structure of the hafnium oxide in the ferroelectric layer differs from a crystal structure of the hafnium oxide in the paraelectric layer.

The ferroelectric layer is ferroelectric only when its thickness is in a specific range. In an embodiment, the ferroelectric layer has a thickness ranging from 0.5 to 10 nm, but embodiments of the inventive concept is not limited to this example. Since a critical thickness associated with the occurrence of ferroelectricity varies depending on the kind of the ferroelectric material, the thickness of the ferroelectric layer can be changed depending on the kind of the ferroelectric material.

For example, the gate insulating layer GI includes a single ferroelectric layer. For example, the gate insulating layer GI includes a plurality of ferroelectric layers spaced apart from each other. For example, the gate insulating layer GI has a multi-layered structure in which a plurality of ferroelectric layers and a plurality of paraelectric layers are alternately stacked.

The gate electrode GE includes a first metal pattern and a second metal pattern disposed on the first metal pattern. The first metal pattern is disposed on the gate insulating layer GI and is adjacent to the first to third semiconductor patterns SP1, SP2, and SP3. The first metal pattern includes a work-function metal that can be used to adjust a threshold voltage of the transistor. By adjusting a thickness and composition of the first metal pattern, a transistor having a desired threshold voltage can be realized. For example, the first to third portions PO1, PO2, and PO3 of the gate electrode GE may be composed of the first metal pattern or the work-function metal.

The first metal pattern includes a metal nitride layer. For example, the first metal pattern includes a layer composed of at least one metal selected from titanium (Ti), tantalum (Ta), aluminum (Al), tungsten (W) or molybdenum (Mo), and nitrogen (N). In an embodiment, the first metal pattern further includes carbon (C). The first metal pattern may include a plurality of stacked work function metal layers.

The second metal pattern is formed of or includes a metal whose resistance is lower than that of the first metal pattern. For example, the second metal pattern is formed of or includes at least one metal selected from tungsten (W), aluminum (Al), titanium (Ti), or tantalum (Ta). The fourth portion PO4 of the gate electrode GE includes the first metal pattern and the second metal pattern on the first metal pattern.

Referring back to FIG. 5B, in an embodiment, inner spacers IP are disposed on the first and second NMOSFET regions NR1 and NR2. For example, the inner spacers IP are disposed on the second active pattern AP2. The inner spacers IP are respectively interposed between the first to third portions PO1, PO2, and PO3 of the gate electrode GE and the second source/drain pattern SD2. The inner spacers IP are in direct contact with the second source/drain pattern SD2. Each of the first to third portions PO1, PO2, and PO3 of the gate electrode GE is spaced apart from the second source/drain pattern SD2 by the inner spacer IP.

A first interlayer insulating layer 110 is disposed on the substrate 100. The first interlayer insulating layer 110 covers the gate spacers GS and the first and second source/drain patterns SD1 and SD2. The first interlayer insulating layer 110 has a top surface that is substantially coplanar with the top surface of the gate capping pattern GP and the top surface of the gate spacer GS. A second interlayer insulating layer 120 is disposed on the first interlayer insulating layer 110 and covers the gate capping pattern GP. A third interlayer insulating layer 130 is disposed on the second interlayer insulating layer 120. A fourth interlayer insulating layer 140 is disposed on the third interlayer insulating layer 130. In an embodiment, at least one of the first to fourth interlayer insulating layers 110 to 140 includes a silicon oxide layer.

A pair of division structures DB are disposed on the substrate 100 opposite to each other in the second direction D2 on both sides of each of the first and second single height cells SHC1 and SHC2. For example, a pair of the division structures DB are respectively provided on the first and second borders BD1 and BD2 of the first single height cell SHC1. The division structure DB extends in the first direction D1 parallel to the gate electrodes GE. A pitch between the division structure DB and the gate electrode GE adjacent thereto is equal to the first pitch.

The division structure DB penetrates the first and second interlayer insulating layers 110 and 120 and extends into the first and second active patterns AP1 and AP2. The division structure DB penetrates an upper portion of each of the first and second active patterns AP1 and AP2. The division structure DB electrically separates an active region of each of the first and second single height cells SHC1 and SHC2 from an active region of a neighboring cell.

Active contacts AC are disposed on the substrate 100, penetrate the first and second interlayer insulating layers 110 and 120 and are electrically connected to the first and second source/drain patterns SD1 and SD2, respectively. A pair of the active contacts AC are respectively disposed at both sides of the gate electrode GE. When viewed in a plan view, the active contact AC has a bar-shaped that extends in the first direction D1.

The active contact AC is a self-aligned contact. For example, the active contact AC is formed by a self-alignment process that uses the gate capping pattern GP and the gate spacer GS. For example, the active contact AC covers at least a portion of the side surface of the gate spacer GS. In addition, the active contact AC covers a portion of the top surface of the gate capping pattern GP.

Metal-semiconductor compound layers SC, such as a silicide layer, are respectively interposed between the active contact AC and the first source/drain pattern SD1, and between the active contact AC and the second source/drain pattern SD2. The active contact AC is electrically connected to the source/drain pattern SD1 and SD2 through the metal-semiconductor compound layer SC. The metal-semiconductor compound layer SC is formed of or includes at least one of titanium silicide, tantalum silicide, tungsten silicide, nickel silicide, or cobalt silicide.

Referring back to FIG. 5C, in an embodiment, at least one active contact AC is disposed on the first single height cell SHC1 to electrically connect the first source/drain pattern SD1 of the first PMOSFET region PR1 to the second source/drain pattern SD2 of the first NMOSFET region NR1. The active contact AC extends in the first direction D1 from the second source/drain pattern SD2 of the first NMOSFET region NR1 to the first source/drain pattern SD1 of the first PMOSFET region PR1.

Gate contacts GC are disposed on the substrate 100 that penetrate the second interlayer insulating layer 120 and the gate capping pattern GP and are electrically connected to the gate electrodes GE. When viewed in a plan view, two gate contacts GC disposed on the first single height cell SHC1 overlap the first PMOSFET region PR1. For example, two gate contacts GC on the first single height cell SHC1 are disposed on the first active pattern AP1, as shown FIG. 5A. When viewed in a plan view, a single gate contact GC disposed on the first single height cell SHC1 overlaps the first NMOSFET region NR1. For example, the single gate contact GC on the first single height cell SHC1 is disposed on the second active pattern AP2, as shown in FIG. 5B.

The gate contact GC can be freely disposed on the gate electrode GE, without any limitation in its position. For example, the gate contacts GC on the second single height cell SHC2 may be respectively disposed on the second PMOSFET region PR2, the second NMOSFET region NR2, or the device isolation layer ST that fills the trench TR, as shown in FIG. 4.

Figure 5A:
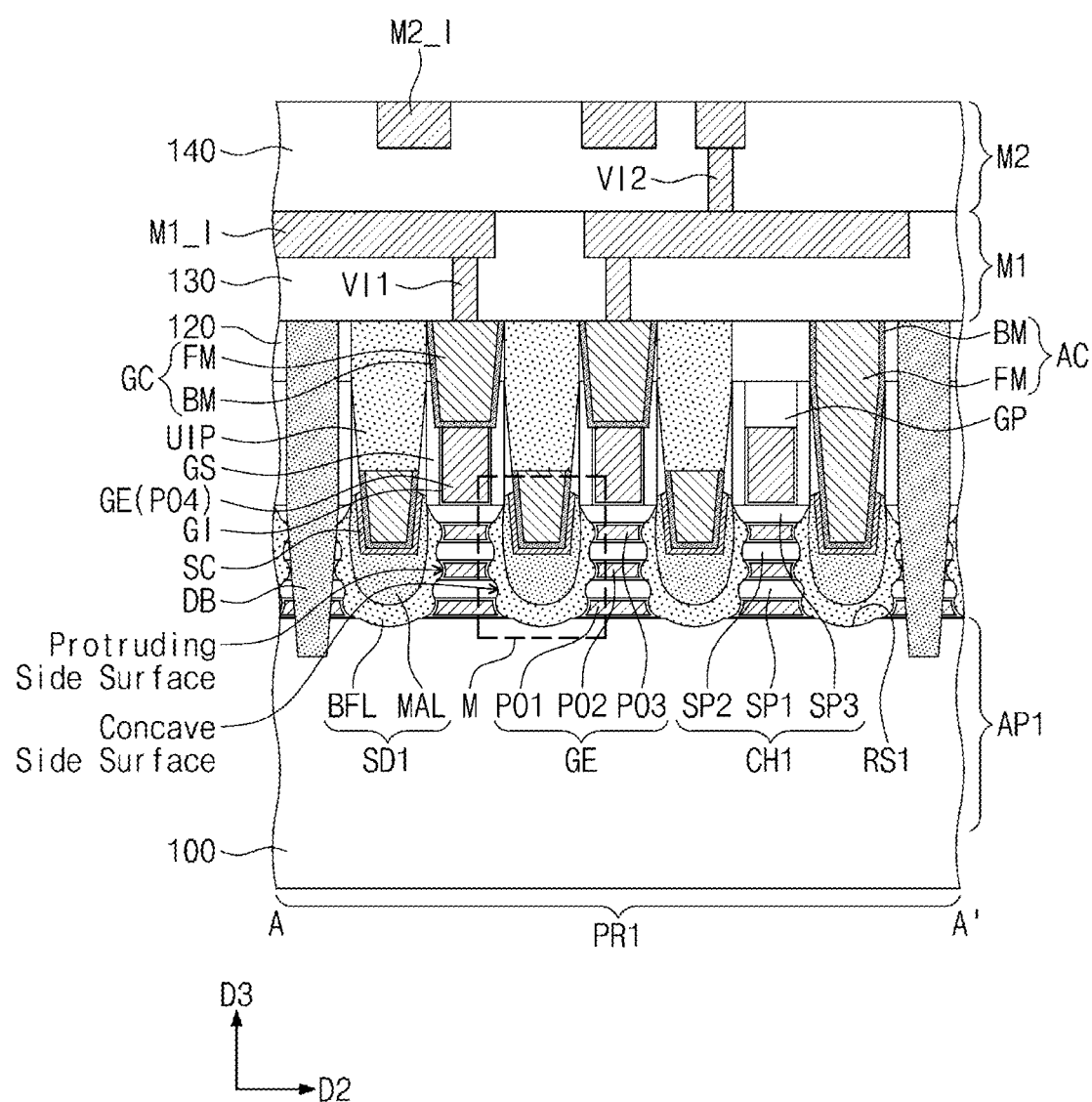
FIGS. 5A to 5D are sectional views that are respectively taken along lines A-A', B-B', C-C', and D-D' of FIG. 4.
Figure 5B:
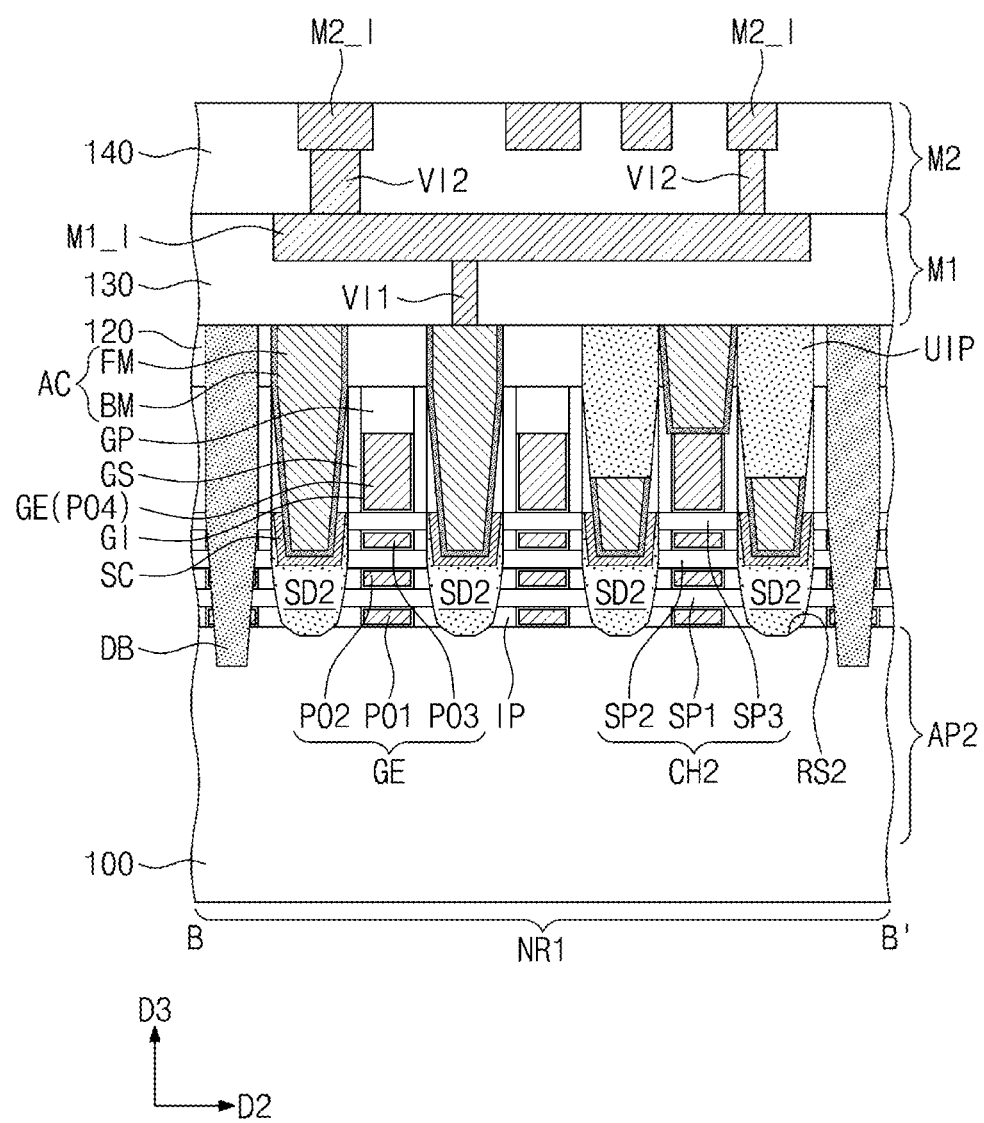
Figure 5C:
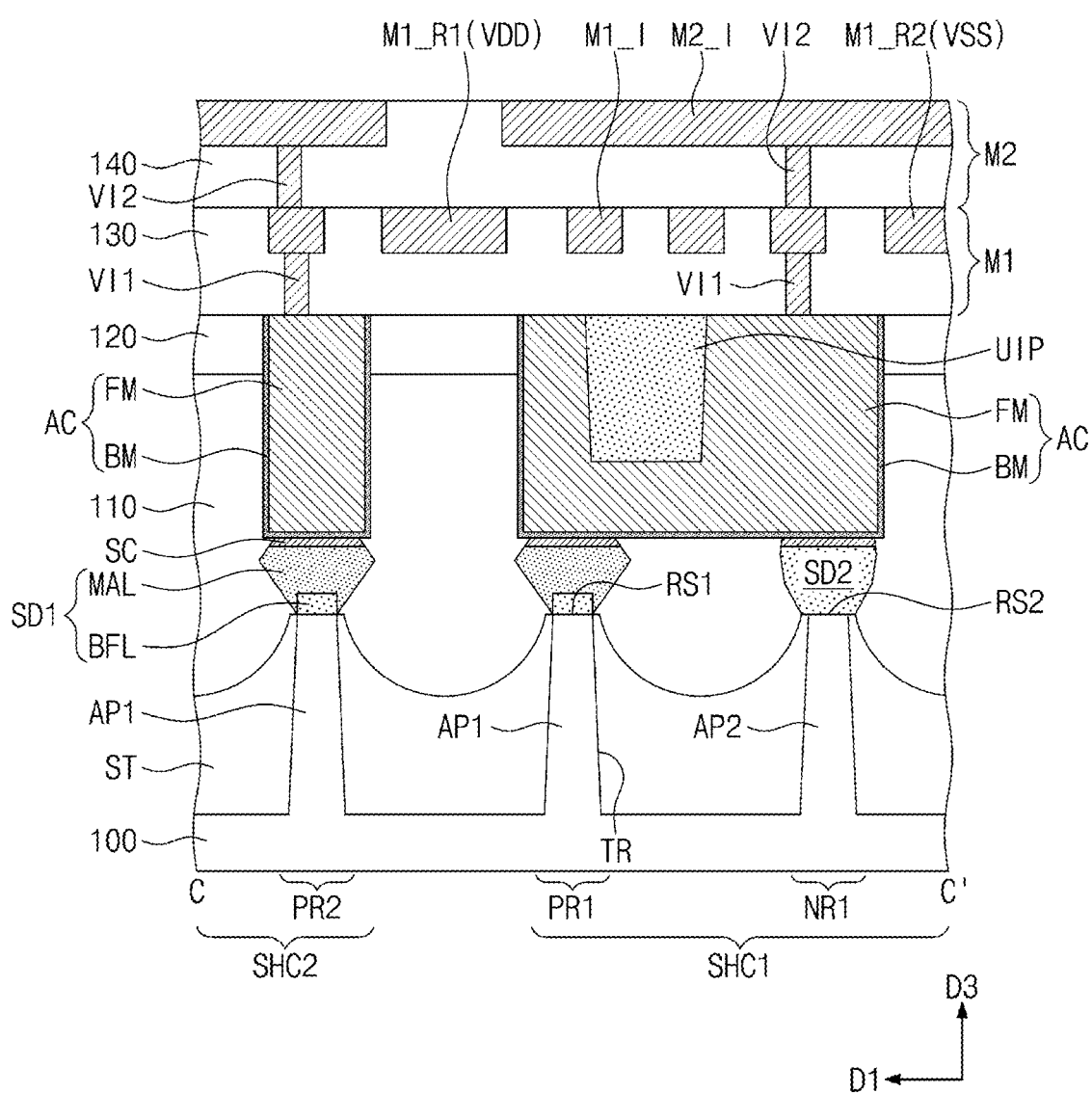
Figure 5D:
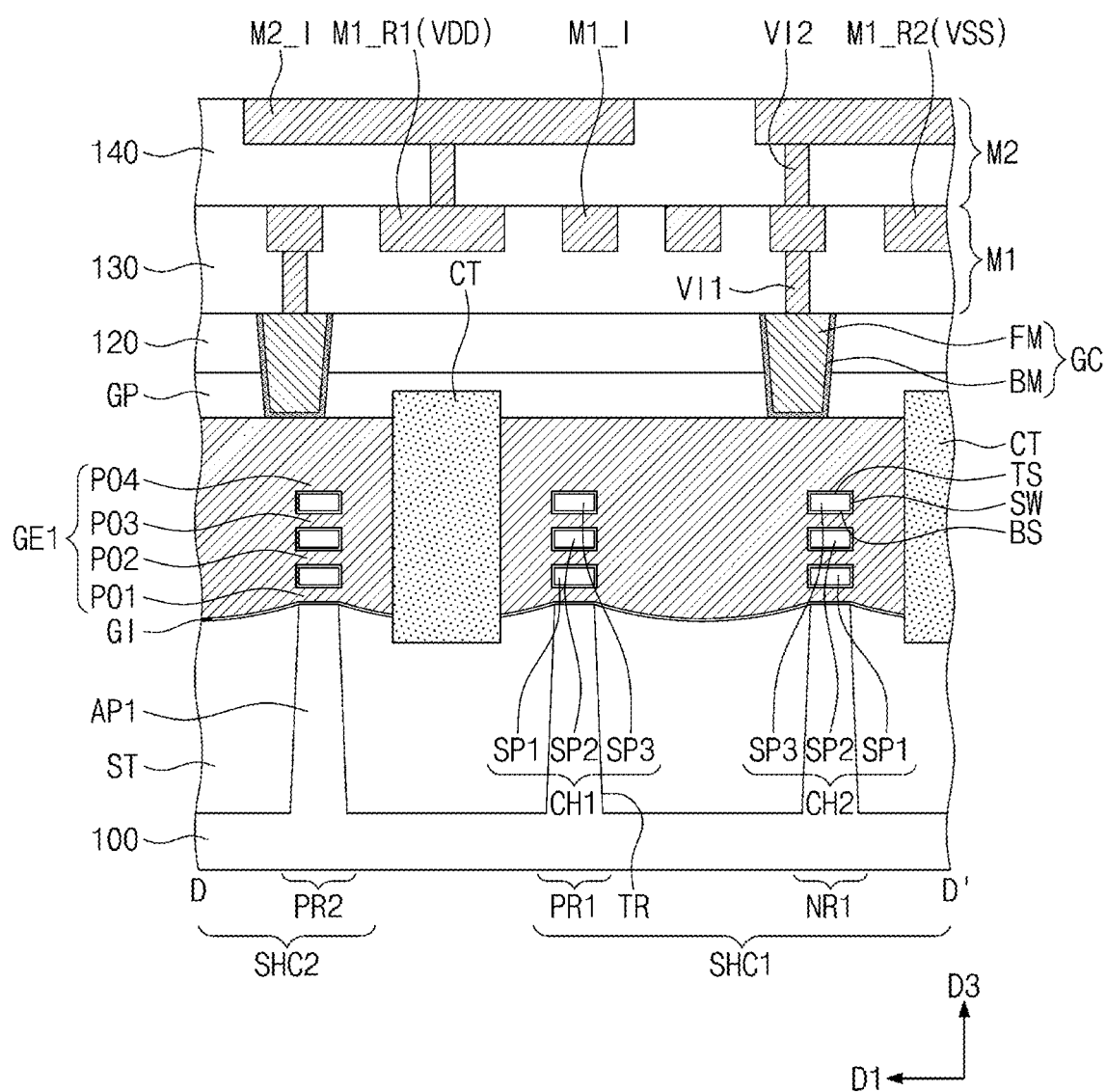

In an embodiment, referring to FIGS. 5A and 5C, an upper portion of the active contact AC adjacent to the gate contact GC is filled with an upper insulating pattern UIP. A bottom surface of the upper insulating pattern UIP is lower than a bottom surface of the gate contact GC. For example, a bottom surface of the active contact AC adjacent to the gate contact GC is located at a lower level than the bottom surface of the gate contact GC adjacent to the upper insulating pattern UIP. Accordingly, the gate contact GC and the active contact AC, which are adjacent to each other, are prevented from being in contact with each other, and which prevents a short circuit issue from occurring therebetween.

Each of the active and gate contacts AC and GC includes a conductive pattern FM and a barrier pattern BM that encloses the conductive pattern FM. The conductive pattern FM is formed of or includes at least one metal, such as aluminum, copper, tungsten, molybdenum, or cobalt. The barrier pattern BM cover side and bottom surfaces of the conductive pattern FM. In an embodiment, the barrier pattern BM includes a metal layer and a metal nitride layer. The metal layer is formed of or includes at least one of titanium, tantalum, tungsten, nickel, cobalt, or platinum. The metal nitride layer is formed of or includes at least one of titanium nitride (TiN), tantalum nitride (TaN), tungsten nitride (WN), nickel nitride (NiN), cobalt nitride (CON), or platinum nitride (PtN).

A first metal layer M1 is disposed in the third interlayer insulating layer 130. The first metal layer M1 includes the first power line M1_R1, the second power line M1_R2, the third power line M1_R3, and first interconnection lines M1_I. The interconnection lines M1_R1, M1_R2, M1_R3, and M1_I of the first metal layer M1 extend in the second direction D2 parallel to each other.

In detail, the first and second power lines M1_R1 and M1_R2 are disposed on the third and fourth borders BD3 and BD4 of the first single height cell SHC1, respectively. The first power line M1_R1 extends in the second direction D2 along the third border BD3. The second power line M1_R2 extends in the second direction D2 along the fourth border BD4.

The first interconnection lines M1_I of the first metal layer M1 are arranged at a second pitch in the first direction D1. The second pitch is less than the first pitch. A linewidth of each of the first interconnection lines M1_I is less than a linewidth of each of the first to third power lines M1_R1, M1_R2, and M1_R3.

The first metal layer M1 further includes first vias VI1. The first vias VI1 are respectively provided below the interconnection lines M1_R1, M1_R2, M1_R3, and M1_I of the first metal layer M1. The active contact AC and the interconnection lines of the first metal layer M1 are electrically connected to each other through the first via VI1. The gate contact GC and the interconnection lines of the first metal layer M1 are electrically connected to each other through the first via VI1.

The interconnection lines of the first metal layer M1 and the first vias VI1 thereunder are formed by separate processes. For example, the interconnection lines and the first via VI1 of the first metal layer M1 are independently formed by respective single damascene processes. A semiconductor device according to an embodiment can be fabricated using a sub-20 nm process.

A second metal layer M2 is disposed in the fourth interlayer insulating layer 140. The second metal layer M2 includes a plurality of second interconnection lines M2_I. Each of the second interconnection lines M2_I of the second metal layer M2 has a line- or a bar-shape that extends in the first direction D1. For example, the second interconnection lines M2_I extend in the first direction D1 parallel to each other.

The second metal layer M2 further includes second vias VI2 that are respectively provided below the second interconnection lines M2_I. The interconnection lines of the first and second metal layers M1 and M2 are electrically connected to each other through the second vias VI2. The interconnection line of the second metal layer M2 and the second via VI2 thereunder can be formed together by a dual damascene process.

The interconnection lines of the first metal layer M1 are formed of or include a conductive material that is the same as or different from those of the second metal layer M2. For example, the interconnection lines of the first and second metal layers M1 and M2 are formed of or include at least one metal, such as aluminum, copper, tungsten, ruthenium, molybdenum, or cobalt. In addition, a plurality of metal layers may be additionally stacked on the fourth interlayer insulating layer 140. Each of the additional stacked metal layers include interconnection lines that are used as routing paths between cells.

The first source/drain pattern SD1 will be described in more detail with reference to FIG. 6. Referring now to FIG. 6, in an embodiment, the buffer layer BFL of the first source/drain pattern SD1 includes a first semiconductor layer SEL1, a first reflow layer RFL1, a second semiconductor layer SEL2, and a second reflow layer RFL2.

The first semiconductor layer SEL1 is in direct contact with the inner surface of the first recess RS1. The first reflow layer RFL1 is interposed between the first semiconductor layer SEL1 and the second semiconductor layer SEL2. The second reflow layer RFL2 is interposed between the second semiconductor layer SEL2 and a third semiconductor layer SEL3 to be described below.

In an embodiment, all of the first semiconductor layer SEL1, the first reflow layer RFL1, the second semiconductor layer SEL2, and the second reflow layer RFL2 of the buffer layer BFL contain silicon germanium (SiGe). However, the germanium concentration may vary between the layers.

The germanium concentration of the first reflow layer RFL1 is less than the germanium concentration of the first semiconductor layer SEL1. For example, the germanium concentration of the first reflow layer RFL1 ranges from 2 at % to 5 at %. The germanium concentration of the first semiconductor layer SEL1 ranges from 4 at % to 8 at %. A mean thickness of the first reflow layer RFL1 is less than a mean thickness of the first semiconductor layer SEL1. For example, the mean thickness of the first reflow layer RFL1 is about 2 nm, and the mean thickness of the first semiconductor layer SEL1 is about 3 nm.

The first reflow layer RFL1 is formed by performing a reflow process on the first semiconductor layer SEL1. In an embodiment, the reflow process is not a solder reflow process that is usually used in a semiconductor fabrication process. In an embodiment, the reflow process is a thermal treatment process that is performed on an epitaxial layer of silicon germanium (SiGe) under hydrogen ambient to cause migration of germanium atoms in the epitaxial layer. The first reflow layer RFL1 has a super lattice structure that includes germanium and formed by the migration of germanium atoms on a surface of the first semiconductor layer SEL1.

In an embodiment, the first reflow layer RFL1 has a profile that corresponds to a sidewall profile of the first semiconductor layer SEL1. The first semiconductor layer SEL1 includes a first side surface SIW1 that protrudes toward the first portion PO1 of the gate electrode GE, a second side surface SIW2 that protrudes toward the second portion PO2 of the gate electrode GE, and a third side surface SIW3 between the first and second side surfaces SIW1 and SIW2 and that has a concave shape. In an embodiment, the first to third side surfaces SIW1 to SIW3 of the first semiconductor layer SEL1 are repeated several times in a vertical direction, and thus, the overall side surface of the first semiconductor layer SEL1 has a wavy profile.

Due to the wavy side surface of the first semiconductor layer SEL1, the first reflow layer RFL1 formed along the first semiconductor layer SEL1 also has a wavy shape. For example, the first reflow layer RFL1 includes a first protruding portion PRP1 adjacent to the first side surface SIW1, a second protruding portion PRP2 adjacent to the second side surface SIW2, and a concave portion RCP between the first protruding portion PRP1 and the second protruding portion PRP2.

The germanium concentration of the second reflow layer RFL2 is less than the germanium concentration of the second semiconductor layer SEL2. In an embodiment, the germanium concentration of the second reflow layer RFL2 is equal to the germanium concentration of the first reflow layer RFL1. The germanium concentration of the second semiconductor layer SEL2 is equal to the germanium concentration of the first semiconductor layer SEL1.

A thickness of the second reflow layer RFL2 is less than a thickness of the second semiconductor layer SEL2. In an embodiment, a mean thickness of the second reflow layer RFL2 is equal to a mean thickness of the first reflow layer RFL1. A mean thickness of the second semiconductor layer SEL2 is equal to a mean thickness of the first semiconductor layer SEL1.

In an embodiment, the germanium concentration of the second reflow layer RFL2 differs from the germanium concentration of the first reflow layer RFL1. For example, the germanium concentration (5 at %) of the second reflow layer RFL2 is greater than the germanium concentration (3 at %) of the first reflow layer RFL1. Similarly, the germanium concentration of the second semiconductor layer SEL2 differs from the germanium concentration of the first semiconductor layer SEL1. For example, the germanium concentration (8 at %) of the second semiconductor layer SEL2 is greater than the germanium concentration (5 at %) of the first semiconductor layer SEL1.

The main layer MAL of the first source/drain pattern SD1 includes a third semiconductor layer SEL3 disposed on the second reflow layer RFL2, a fourth semiconductor layer SEL4 disposed on the third semiconductor layer SEL3, and a fifth semiconductor layer SEL5 that conformally covers a surface of the fourth semiconductor layer SEL4.

A germanium concentration of the third semiconductor layer SEL3 is less than a germanium concentration of the fourth semiconductor layer SEL4. For example, the germanium concentration of the third semiconductor layer SEL3 ranges from 30 at % to 50 at %. The germanium concentration of the fourth semiconductor layer SEL4 ranges from 50 at % to 70 at %.

The fifth semiconductor layer SEL5 is a capping layer that covers and protects an exposed surface of the fourth semiconductor layer SEL4. The fifth semiconductor layer SEL5 is formed of or includes silicon (Si). In an embodiment, the fifth semiconductor layer SEL5 contains a tiny amount of germanium atoms that have diffused from the fourth semiconductor layer SEL4. A silicon concentration of the fifth semiconductor layer SEL5 ranges from 98 at % to 100 at %.

According to a comparative example, the buffer layer BFL has an inner side surface that is not inclined or is perpendicular to the top surface of the substrate 100, and in this case, defects can occur in the main layer MAL on the buffer layer BFL. This occurs because a growth rate of the main layer MAL is greater in the second direction D2 than in the third direction D3, when the main layer MAL is formed on the buffer layer BFL through a selective epitaxial growth process.

According to an embodiment, due to the first and second reflow layers RFL1 and RFL2, the buffer layer BFL has an inclined inner side surface ISW. For example, due to a reflow process that forms the second reflow layer RFL2, the inner side surface ISW of the buffer layer BFL has an inclined profile. Due to the inclined inner side surface ISW defect can be prevented from occurring in the main layer MAL when forming the main layer MAL on the buffer layer BFL.

The first source/drain pattern SD1 is disposed on the PMOSFET region PR and has a planar structure that will be described in more detail with reference to FIGS. 7A and 7B. In detail, FIG. 7A is a plan view of a semiconductor device taken at a level of the second semiconductor pattern SP2, for example, obtained if a semiconductor device is planarized to the line M-M' of FIG. 6. FIG. 7B is a plan view of a semiconductor device taken at a level of the second portion PO2 of the gate electrode GE, for example, obtained if a semiconductor device is planarized to the line N-N' of FIG. 6.

Referring to FIG. 7A, in an embodiment, the second semiconductor pattern SP2 has a first width W1 in the first direction D1. The second semiconductor pattern SP2 includes a first side surface SW1 and a second side surface SW2. The first side surface SW1 and the second side surface SW2 are opposite to each other in the first direction D1. The first and second side surfaces SW1 and SW2 are covered with the gate insulating layer GI. The gate electrode GE is adjacent to the first and second side surfaces SW1 and SW2, and the gate insulating layer GI is interposed therebetween.

The gate spacer GS is disposed on a side surface of the gate electrode GE. The gate spacer GS includes the first spacer GS1 and the second spacer GS2 disposed on the first spacer GS1. Each of the first and second spacers GS1 and GS2 is formed of or includes a silicon-containing insulating material. In detail, the first spacer GS1 is formed of or includes a silicon-containing low-k dielectric material, such as SiCON. The second spacer GS2 is formed of or includes a silicon-containing insulating material, such as SiN, that is etch resistant.

The gate spacer GS includes a first end EN1 adjacent to the first side surface SW1 of the second semiconductor pattern SP2, and a second end EN2 adjacent to the second side surface SW2 of the second semiconductor pattern SP2. The buffer layer BFL of the first source/drain pattern SD1 is interposed between the first and second ends EN1 and EN2 of the gate spacer GS. The buffer layer BFL has a second width W2 in the first direction D1. In an embodiment, the second width W2 is substantially equal to the first width W1. In an embodiment, the second width W2 is greater than the first width W1.

The buffer layer BFL of the first source/drain pattern SD1 is in direct contact with the second semiconductor pattern SP2. In detail, the first semiconductor layer SEL1 of the buffer layer BFL is in direct contact with the second semiconductor pattern SP2. The buffer layer BFL includes at least one reflow layer, such as RFL1 or RFL2.

The main layer MAL of the first source/drain pattern SD1 is disposed on the buffer layer BFL. The third semiconductor layer SEL3 of the main layer MAL is in direct contact with the buffer layer BFL. A width of the third semiconductor layer SEL3 in the first direction D1 is substantially equal to the second width W2.

The fourth semiconductor layer SEL4 is disposed on the third semiconductor layer SEL3. At least a portion of the fourth semiconductor layer SEL4 is interposed between a pair of gate spacers GS adjacent to each other in the second direction D2. The largest width of the fourth semiconductor layer SEL4 in the first direction D1 is a third width W3. The third width W3 is greater than the second width W2. The fifth semiconductor layer SEL5 is disposed on a side surface of the fourth semiconductor layer SEL4.

Referring to FIG. 7B, in an embodiment, the second portion PO2 of the gate electrode GE vertically overlaps the second semiconductor pattern SP2 described with reference to FIG. 7A. The first source/drain pattern SD1 is interposed between a pair of second portions PO2 adjacent to each other in the second direction D2.

The second portion PO2 of the gate electrode GE includes a first edge EG1 and a second edge EG2 that are opposite to each other in the first direction D1. The first and second edges EG1 and EG2 are respectively located below the first and second side surfaces SW1 and SW2 of the second semiconductor pattern SP2.

The buffer layer BFL of the first source/drain pattern SD1 is in direct contact with the gate insulating layer GI on the second portion PO2. For example, the gate insulating layer GI is interposed between the second portion PO2 of the gate electrode GE and the first semiconductor layer SEL1 of the buffer layer BFL.

An edge portion of the buffer layer BFL is adjacent to the first or second edge EG1 or EG2 of the second portion PO2 and has a first thickness TK1 in the second direction D2. The edge portion of the buffer layer BFL is in contact with the first or second end EN1 or EN2 of the gate spacer GS. A center portion of the buffer layer BFL is adjacent to a center CNT of the second portion PO2 and has a second thickness TK2 in the second direction D2. The second thickness TK2 is greater than the first thickness TK1. In an embodiment, a ratio TK1/TK2 of the first thickness TK1 to the second thickness TK2 ranges from 0.2 to 0.8.

In an embodiment, since the buffer layer BFL includes at least one reflow layer, such as RFL1 or RFL2, the edge portion of the buffer layer BFL has a relatively large thickness, such as the first thickness TK1. For example, the first semiconductor layer SEL1 has a small thickness at an edge portion thereof and a larger thickness at a center portion thereof. However, the first reflow layer RFL1 has substantially the same thickness at edge and center portions thereof. Since the buffer layer BFL includes the first and second reflow layers RFL1 and RFL2, the first thickness TK1 of the edge portion of the buffer layer BFL has a relatively large value.

Figure 8:
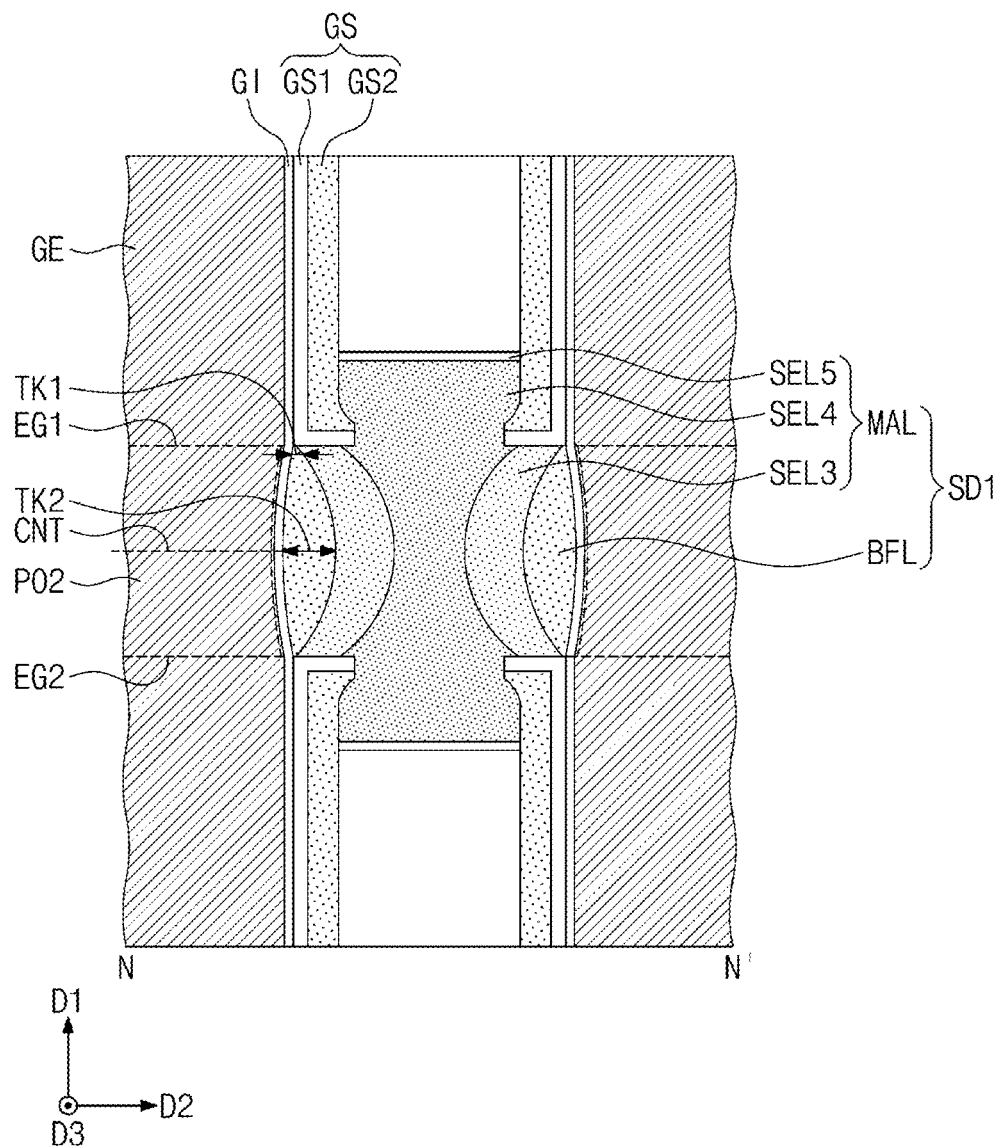
FIG. 8 is a top plan view at the level N-N' of FIG. 6 to illustrate a semiconductor device according to a comparative example.

FIG. 8 is a top plan view taken at the level N-N' of FIG. 6 that illustrates a semiconductor device according to a comparative example. Referring to FIG. 8, a portion of the buffer layer BFL adjacent to the first edge EG1 of the second portion PO2 has a small thickness, such as a first thickness TK1. Another portion of the buffer layer BFL adjacent to the center CNT of the second portion PO2 has a second thickness TK2. In the comparative example, a ratio TK1/TK2 of the first thickness TK1 to the second thickness TK2 is less than 0.2.

The buffer layer BFL according to the comparative example does not include the reflow layer according to embodiments of the inventive concept. Thus, the first thickness TK1 of the buffer layer BFL has a small value. When the first thickness TK1 of the buffer layer BFL is small, process defects, such as damage to the first source/drain pattern SD1, can occur during a process of forming the second portion PO2 of the gate electrode GE.

By contrast, in an embodiment of the inventive concept, the first thickness TK1 of the edge portion of the buffer layer BFL has a relatively large value as compared to the first thickness TK1 in the comparative example. Thus, an etchant material is not supplied to the main layer MAL through the edge portion of the buffer layer BFL when the second portion PO2 of the gate electrode GE is formed. For example, according to an embodiment of the inventive concept, the buffer layer BFL prevents process defects such as damage to the first source/drain pattern SD1 and thus increases reliability of the semiconductor device.

FIGS. 9A to 15D are sectional views that illustrate a method of fabricating a semiconductor device according to an embodiment of the inventive concept. In detail, FIGS. 9A, 10A, 11A, 12A, 13A, 14A, and 15A are sectional views taken along a line A-A' of FIG. 4. FIGS. 11B, 12B, 13B, 14B, and 15B are sectional views taken along a line B-B' of FIG. 4. FIGS. 11C, 12C, 13C, 14C, and 15C are sectional views taken along a line C-C' of FIG. 4. FIGS. 9B, 10B, 11D, 12D, 13D, 14D, and 15D are sectional views taken along a line D-D' of FIG. 4.

Figure 9A:
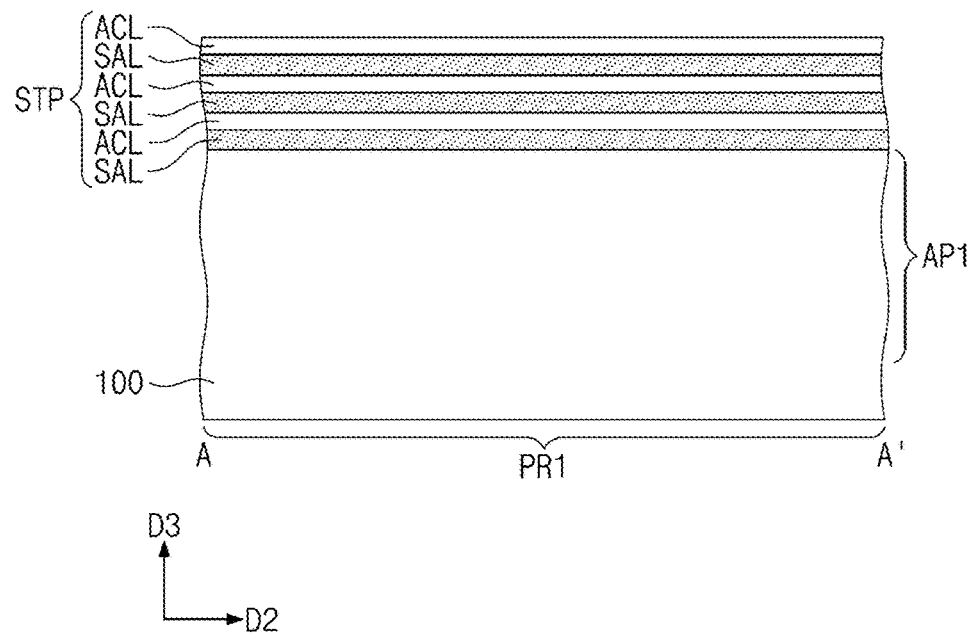
FIGS. 9A to 15D are sectional views that illustrate a method of fabricating a semiconductor device according to an embodiment of the inventive concept.
Figure 9B:
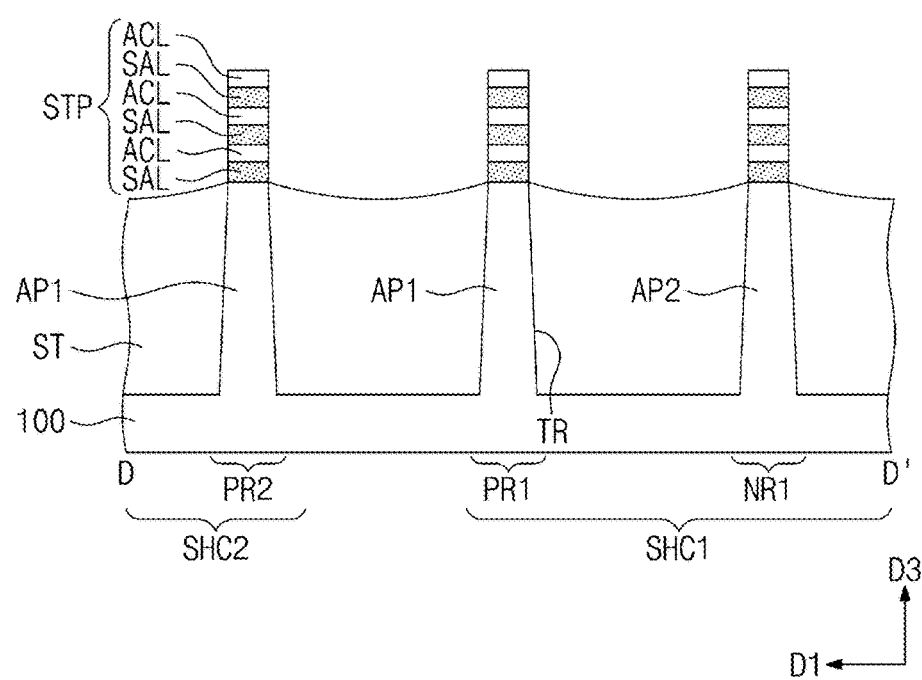

Referring to FIGS. 9A and 9B, in an embodiment, the substrate 100 is provided, and in an embodiment, the substrate includes the first and second PMOSFET regions PR1 and PR2 and the first and second NMOSFET regions NR1 and NR2. Active layers ACL and the sacrificial layers SAL are alternately stacked on the substrate 100. The active layers ACL are formed of or include one of silicon (Si), germanium (Ge), or silicon germanium (SiGe), and the sacrificial layers SAL are formed of or include another of silicon (Si), germanium (Ge), or silicon germanium (SiGe).

The sacrificial layer SAL are formed of or include a material that has an etch selectivity with respect to the active layer ACL. For example, the active layers ACL are formed of or include silicon (Si), and the sacrificial layers SAL are formed of or include silicon germanium (SiGe). A germanium concentration of each of the sacrificial layers SAL ranges from 10 at % to 30 at %.

Mask patterns are respectively formed on the first and second PMOSFET regions PR1 and PR2 and the first and second NMOSFET regions NR1 and NR2 of the substrate 100. The mask pattern may be a line- or bar-shaped pattern that extends in the second direction D2.

A patterning process that uses the mask patterns as an etch mask is performed that forms the trench TR that separates the first and second active patterns AP1 and AP2. The first active pattern AP1 is formed on each of the first and second PMOSFET regions PR1 and PR2. The second active pattern AP2 is formed on each of the first and second NMOSFET regions NR1 and NR2.

A stacking pattern STP is formed on each of the first and second active patterns AP1 and AP2. The stacking pattern STP includes the alternately stacked active layers ACL and sacrificial layers SAL. The stacking pattern STP is formed during the patterning process along with the first and second active patterns AP1 and AP2.

The device isolation layer ST is formed that fills the trench TR. In detail, an insulating layer is formed on the substrate 100 that covers the first and second active patterns AP1 and AP2 and the stacking patterns STP. The device isolation layer ST is formed by recessing the insulating layer to expose the stacking patterns STP.

The device isolation layer ST is formed of or includes at least one insulating material, such as silicon oxide. The stacking patterns STP are disposed above the device isolation layer ST and are exposed outside of the device isolation layer ST. For example, the stacking patterns STP protrude vertically above the device isolation layer ST.

Figure 10A:
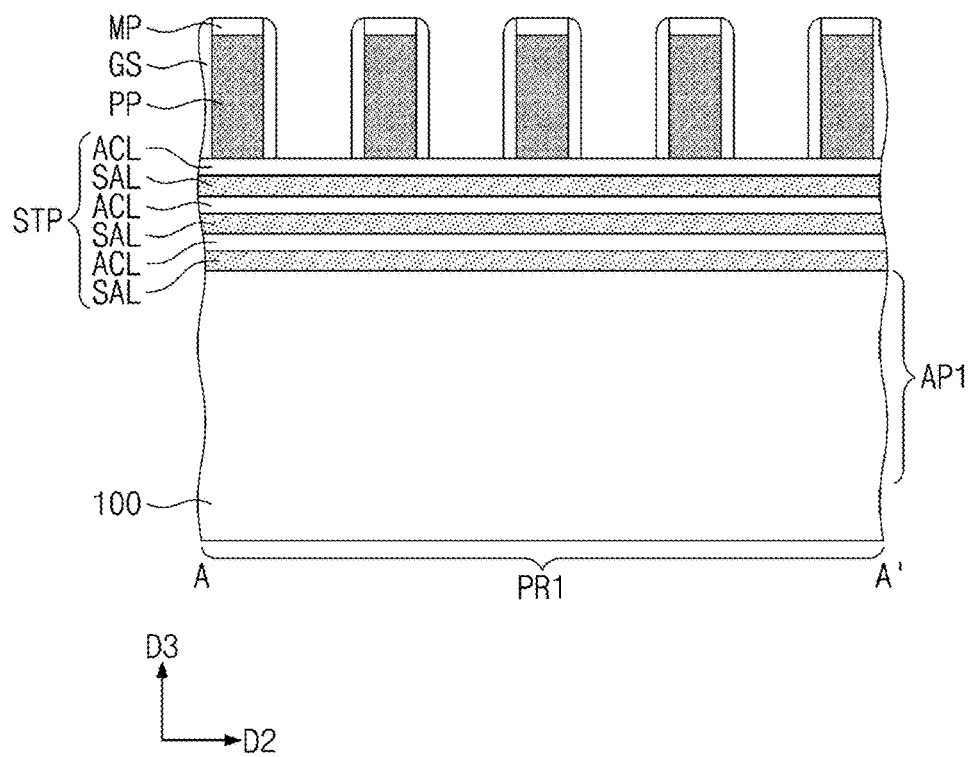
Figure 10B:
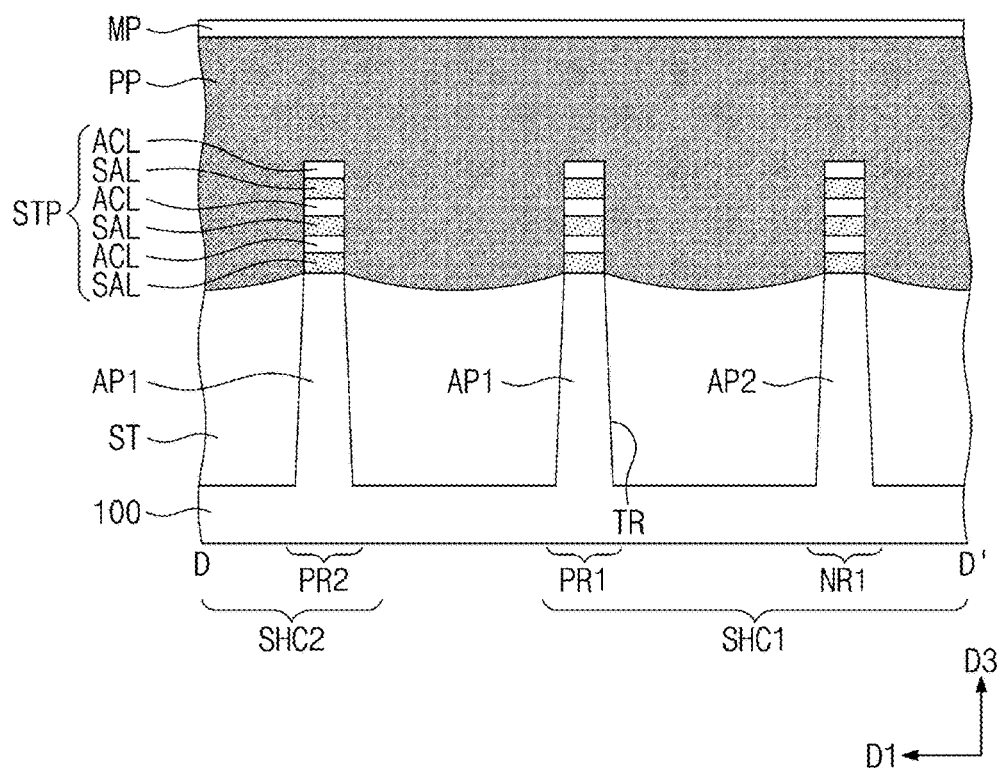

Referring to FIGS. 10A and 10B, in an embodiment, sacrificial patterns PP that cross the stacking patterns STP are formed on the substrate 100. Each of the sacrificial patterns PP is a line- or bar-shaped pattern that extends in the first direction D1. The sacrificial patterns PP are arranged at a first pitch in the second direction D2.

In detail, the formation of the sacrificial patterns PP includes forming a sacrificial layer on the substrate 100, forming hard mask patterns MP on the sacrificial layer, and patterning the sacrificial layer using the hard mask patterns MP as an etch mask. The sacrificial layer is formed of or includes polysilicon.

A pair of gate spacers GS are formed on opposite side surfaces of each of the sacrificial patterns PP. The formation of the gate spacers GS includes conformally forming a gate spacer layer on the substrate 100 and anisotropically etching the gate spacer layer. The gate spacer GS is a multi-layered structure that includes the first spacer GS1 and the second spacer GS2 previously described with reference to FIG. 6.

Figure 11A:
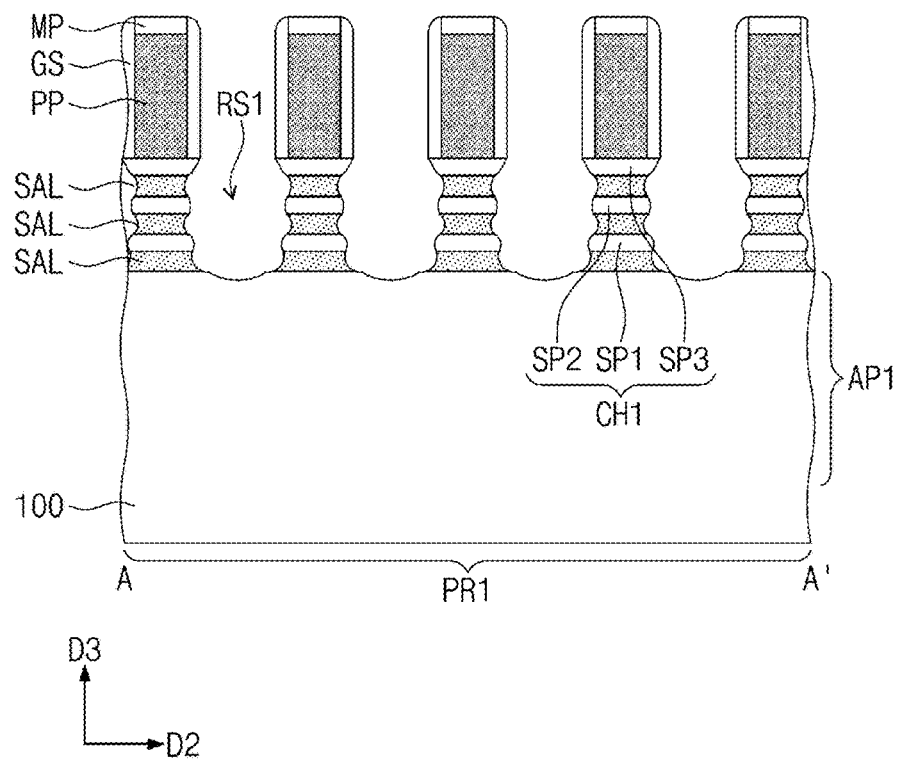
Figure 11B:
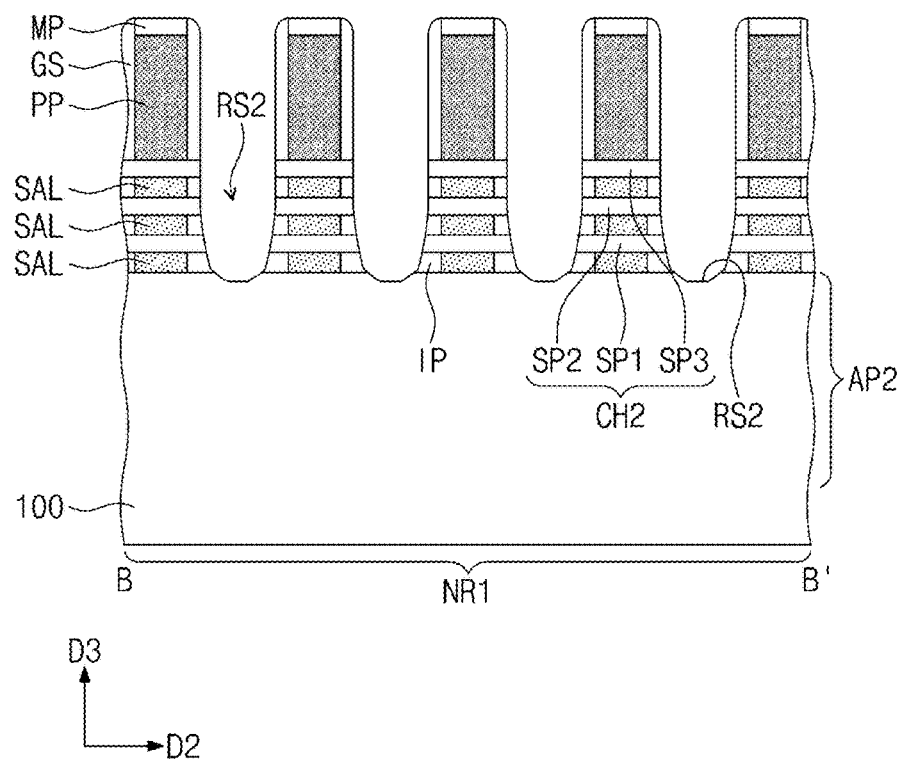
Figure 11C:
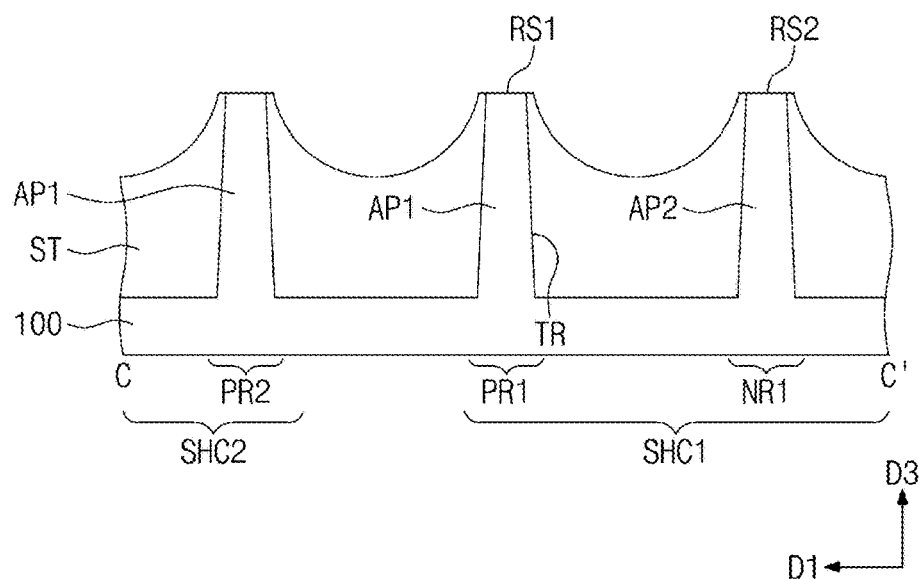
Figure 11D:
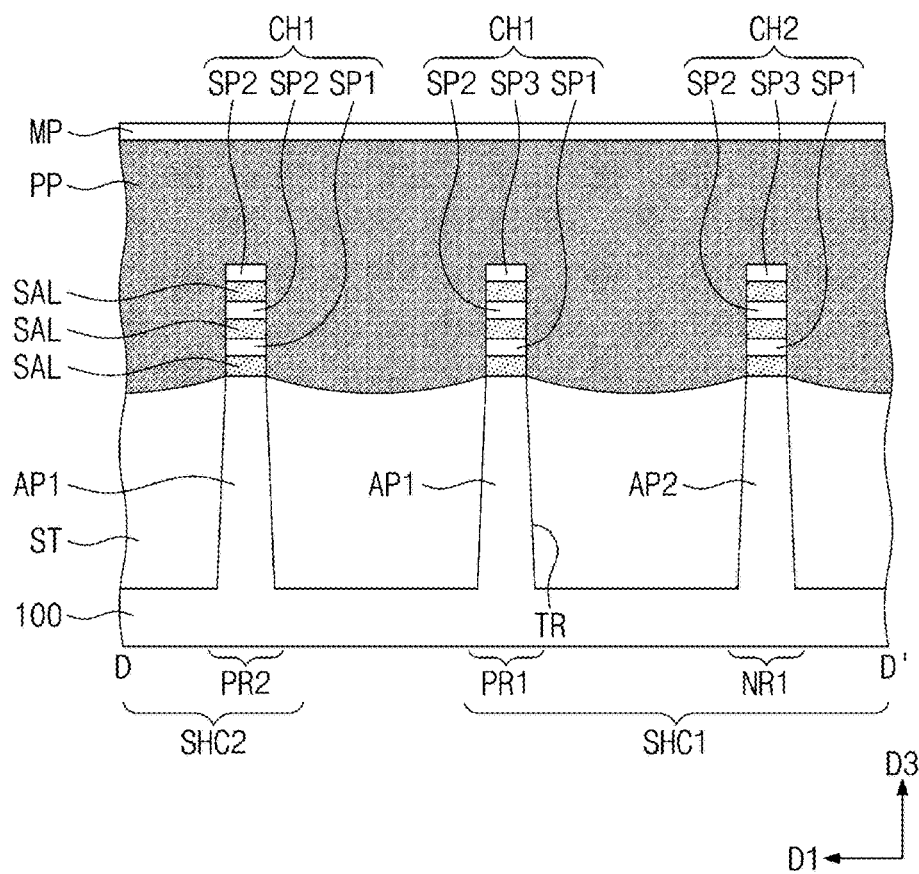

Referring to FIGS. 11A to 11D, in an embodiment, the first recesses RS1 are formed in the stacking pattern STP on the first active pattern AP1. The second recesses RS2 are formed in the stacking pattern STP on the second active pattern AP2. During the formation of the first and second recesses RS1 and RS2, the device isolation layer ST is also recessed at both sides of each of the first and second active patterns AP1 and AP2, as shown in FIG. 11C.

In detail, the first recesses RS1 are formed by etching the stacking pattern STP on the first active pattern AP1 using the hard mask patterns MP and the gate spacers GS as an etch mask. The first recess RS1 are formed between a pair of the sacrificial patterns PP. The formation of the first recess RS1 additionally includes performing a selective etching process on exposed portions of the sacrificial layers SAL. Accordingly, the first recess RS1 is formed to have a wavy inner side surface.

The second recesses RS2 in the stacking pattern STP on the second active pattern AP2 are formed by the same method as that for the first recesses RS1. However, the formation of the second recess RS2 further includes forming the inner spacers IP in recessed regions that are formed by selectively etching the sacrificial layer SAL. As a result, an inner surface of the second recess RS2 is not wavy, unlike the inner surface of the first recess RS1.

The first to third semiconductor patterns SP1, SP2, and SP3 that are sequentially stacked between adjacent first recesses RS1 are respectively formed from the active layers ACL. The first to third semiconductor patterns SP1, SP2, and SP3 that are sequentially stacked between adjacent second recesses RS2 are respectively formed from the active layers ACL. The first to third semiconductor patterns SP1, SP2, and SP3 between adjacent first recesses RS1 constitute the first channel pattern CH1. The first to third semiconductor patterns SP1, SP2, and SP3 between adjacent second recesses RS2 constitute the second channel pattern CH2.

Referring to FIGS. 12A to 12D, in an embodiment, the first source/drain patterns SD1 are formed in the first recesses RS1, respectively. In detail, the buffer layer BFL is formed by a SEG process that uses an inner surface of the first recess RS1 as a seed layer. The buffer layer BFL is grown using the first to third semiconductor patterns SP1, SP2, and SP3 and the substrate 100, which are exposed through the first recess RS1, as a seed layer. In an embodiment, the SEG process includes a chemical vapor deposition (CVD) process or a molecular beam epitaxy (MBE) process.

The buffer layer BFL contains a semiconductor material, such as SiGe, whose lattice constant is greater than that of a semiconductor material of the substrate 100. The buffer layer BFL contains a relatively low concentration of germanium (Ge). The germanium concentration of the buffer layer BFL ranges from 0 at % to 10 at %. In an embodiment, the buffer layer BFL contains only silicon (Si) without germanium (Ge).

A SEG process is performed on the buffer layer BFL to form the main layer MAL. The main layer MAL is formed to fully fill the first recess RS1. The main layer MAL contains a relatively high concentration of germanium. In an embodiment, the germanium concentration of the main layer MAL ranges from 30 at % to 70 at %.

The first source/drain pattern SD1 are doped in-situ with p-type impurities, such as boron, gallium, or indium, during the formation of the buffer and main layers BFL and MAL. Alternatively, in an embodiment, impurities are injected into the first source/drain pattern SD1 after forming the first source/drain pattern SD1.

The second source/drain patterns SD2 are formed in the second recesses RS2, respectively. In detail, the second source/drain patterns SD2 are formed by a SEG process, in which an inner surface of the second recess RS2 is used as a seed layer. In an embodiment, the second source/drain patterns SD2 are formed of or include the same semiconductor material, such as Si, as the substrate 100.

During the formation of the second source/drain pattern SD2, the second source/drain pattern SD2 are doped in-situ with n-type impurities, such as phosphorus, arsenic, or antimony. Alternatively, in an embodiment, impurities are injected into the second source/drain pattern SD2, after forming the second source/drain pattern SD2.

Referring to FIGS. 13A to 13D, in an embodiment, the first interlayer insulating layer 110 is formed that covers the first and second source/drain patterns SD1 and SD2, the hard mask patterns MP, and the gate spacers GS. The first interlayer insulating layer 110 includes a silicon oxide layer.

The first interlayer insulating layer 110 is planarized to expose the top surfaces of the sacrificial patterns PP. The planarization of the first interlayer insulating layer 110 is performed using an etch-back or chemical-mechanical polishing (CMP) process. All of the hard mask patterns MP are removed during the planarization process. Accordingly, the first interlayered insulating layer 110 has a top surface that is coplanar with the top surfaces of the sacrificial patterns PP and the top surfaces of the gate spacers GS.

A photolithography process is performed to selectively open a region of the sacrificial pattern PP. For example, a region of the sacrificial pattern PP on the third and fourth borders BD3 and BD4 of the first single height cell SHC1 is selectively opened. The opened region of the sacrificial pattern PP is selectively etched and removed. The gate cutting pattern CT is formed by filling a space that is formed by removing the sacrificial pattern PP with an insulating material.

Figure 14A:
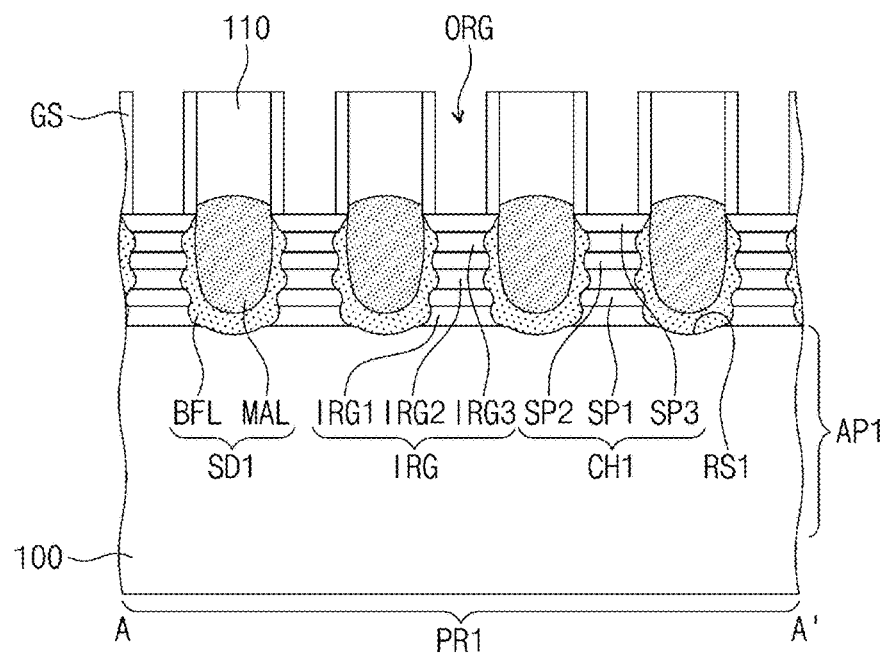
Figure 14B:
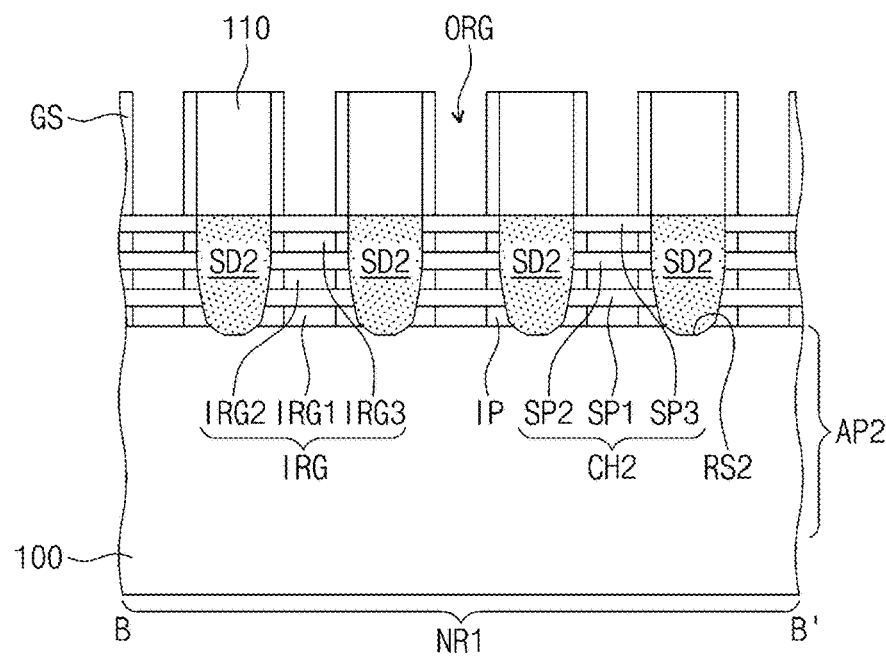
Figure 14C:
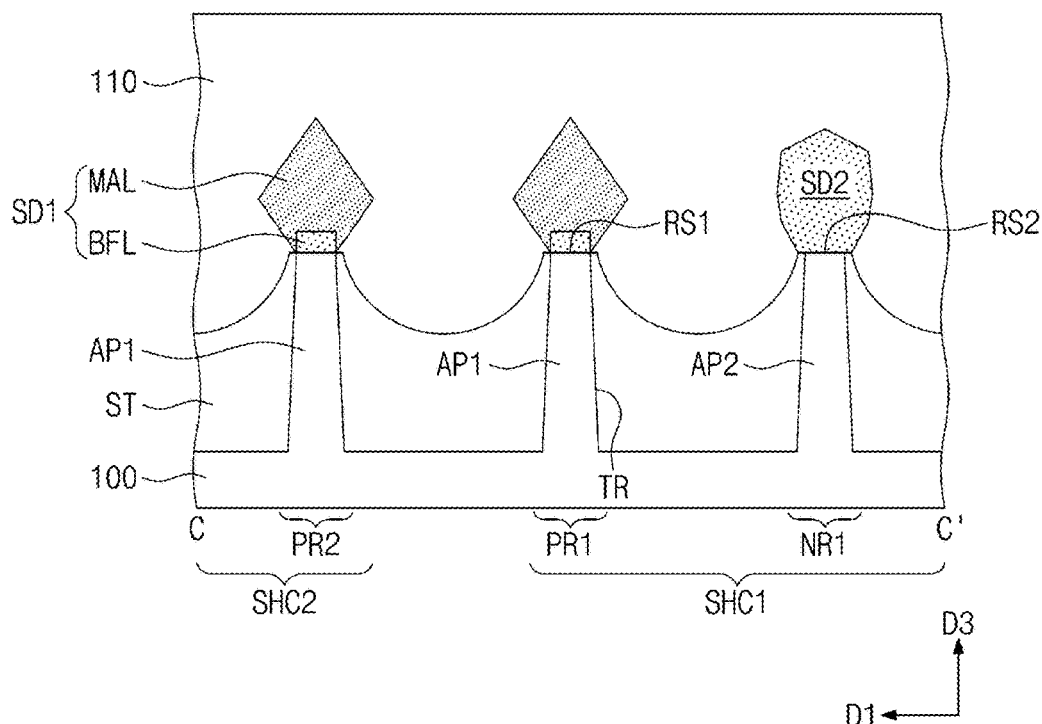
Figure 14D:
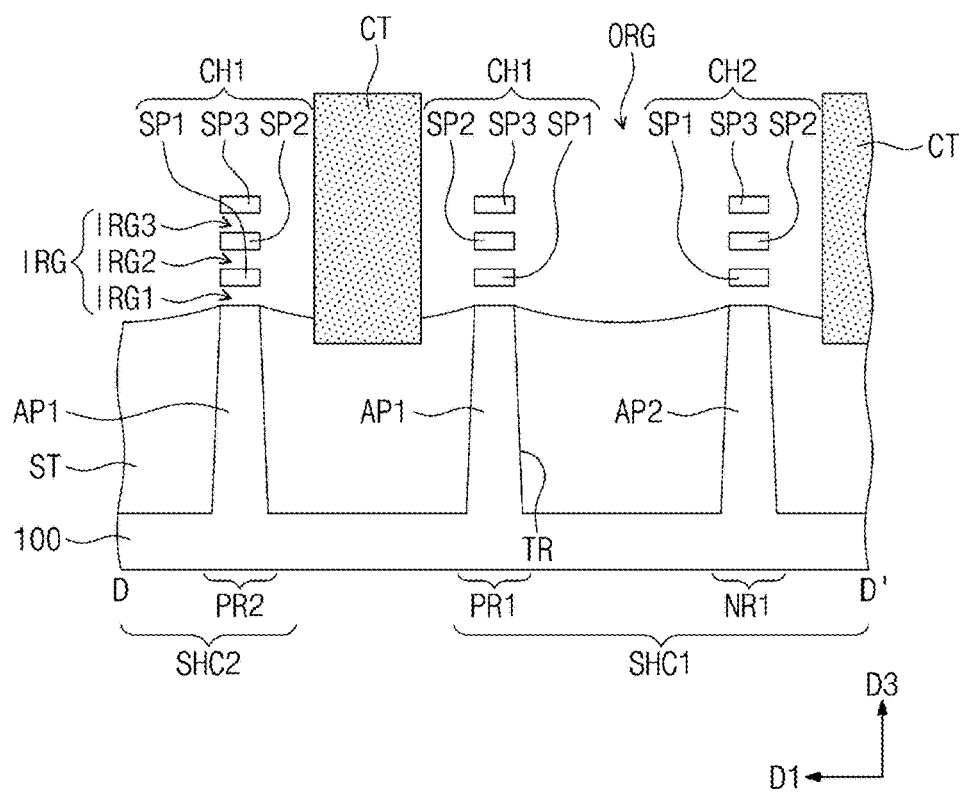
Figure 15A:
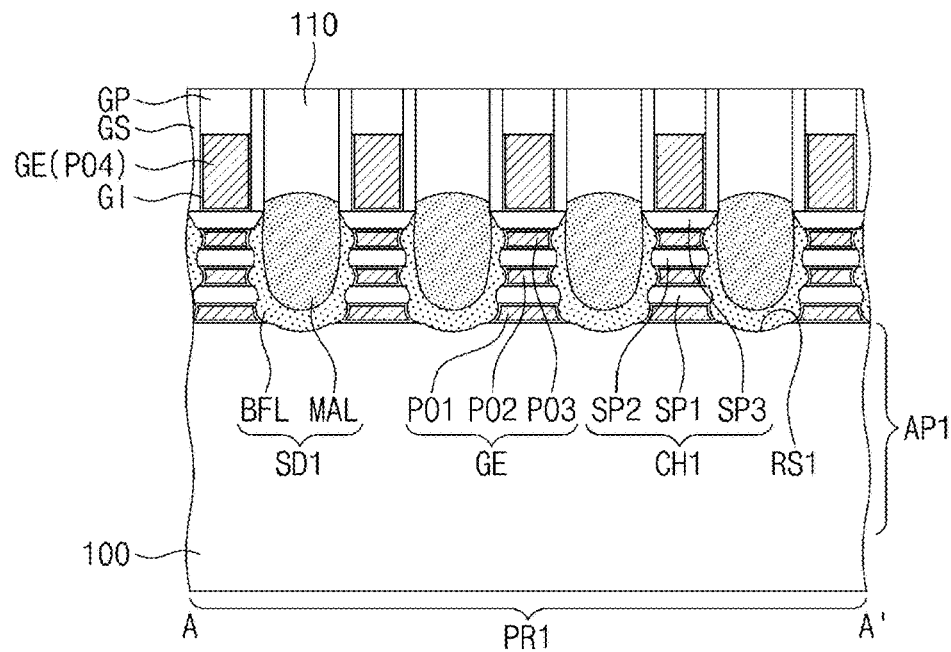
Figure 15B:
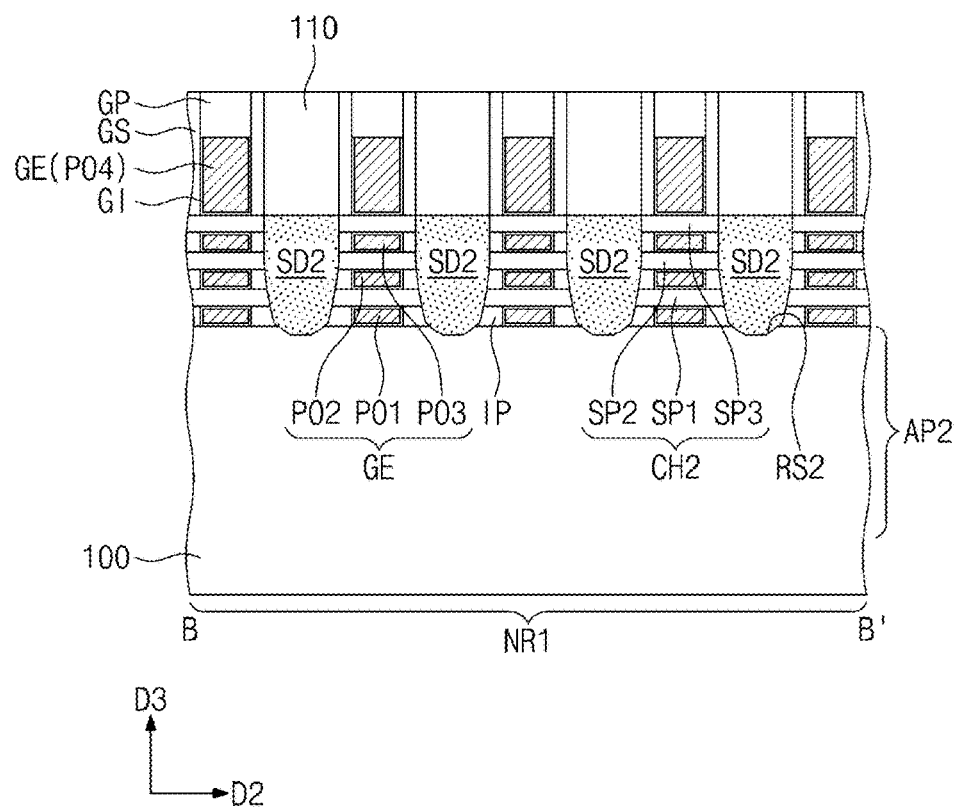
Figure 15C:
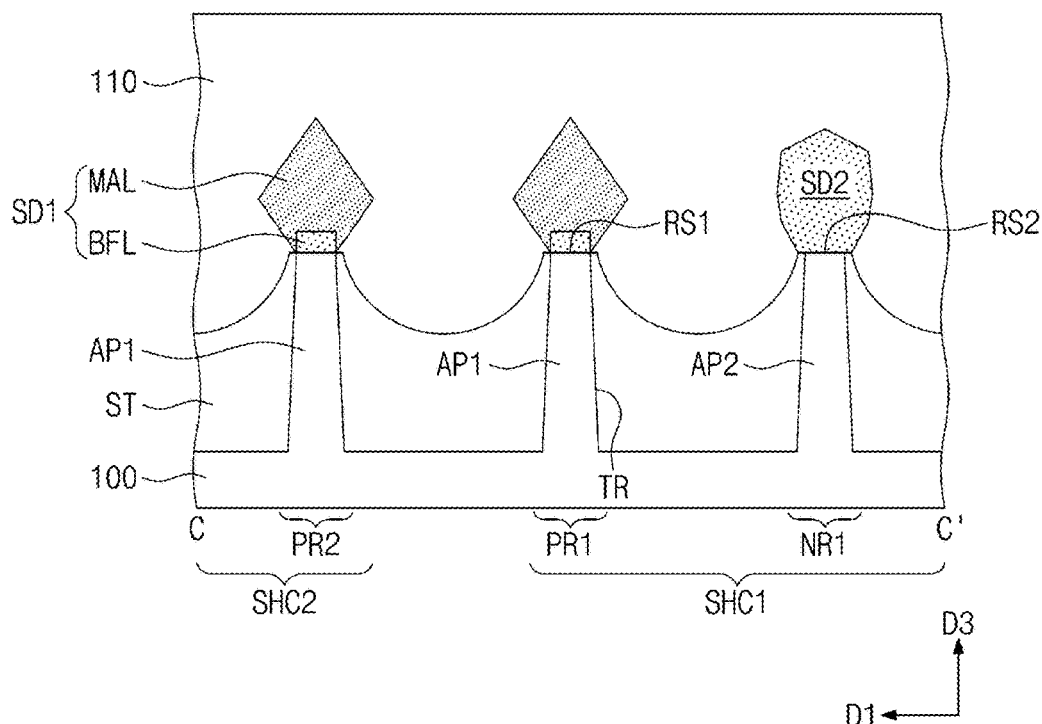
Figure 15D:
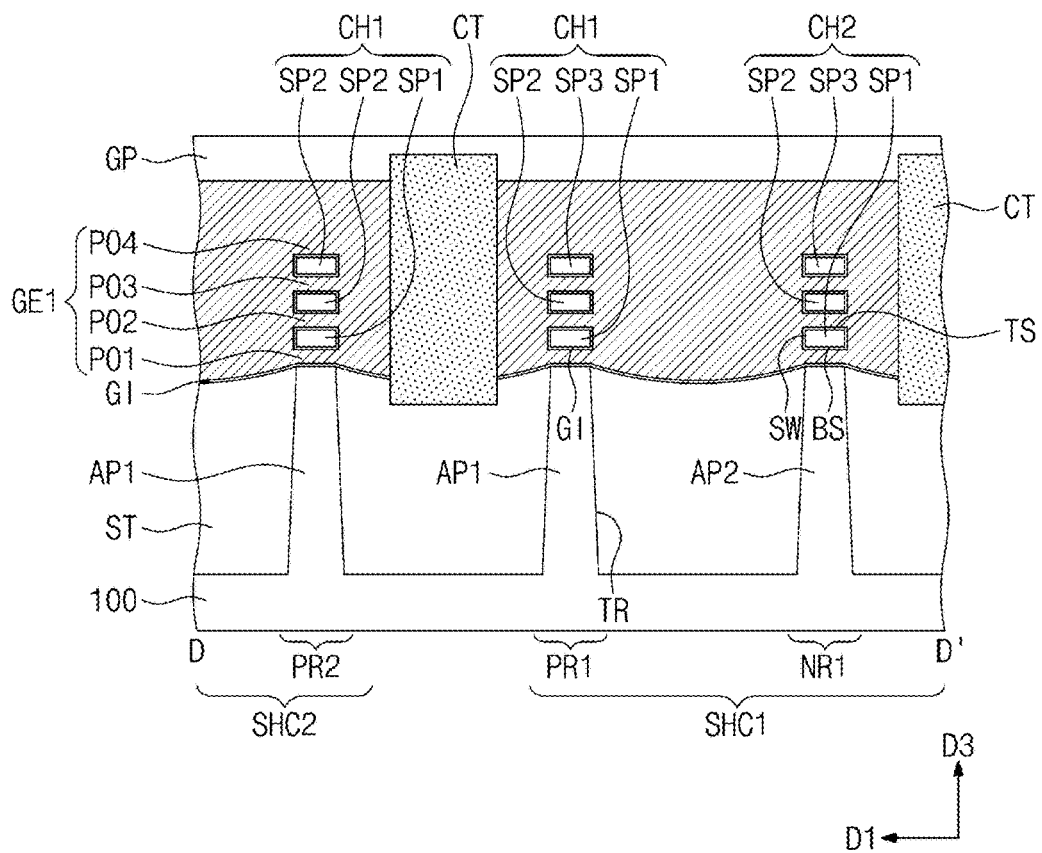

Referring to FIGS. 14A to 14D, in an embodiment, the exposed sacrificial patterns PP are selectively removed. As a result of removing the sacrificial patterns PP, an outer region ORG is formed that exposes the first and second channel patterns CH1 and CH2, as shown in FIG. 14D. The removal of the sacrificial patterns PP includes a wet etching process that is performed using an etching solution that can selectively etch polysilicon.

The sacrificial layers SAL exposed through the outer region ORG are selectively removed to form inner regions IRG, as shown in FIG. 14D. In detail, by selectively etching the sacrificial layers SAL, it is possible to leave the first to third semiconductor patterns SP1, SP2, and SP3 and to remove only the sacrificial layers SAL. The etching process is chosen to have a high etch rate for a material, such as SiGe, that has a relatively high germanium concentration. For example, the etching process has a high etch rate for a silicon germanium layer whose germanium concentration is greater than 10 at %.

The sacrificial layers SAL on the first and second PMOSFET regions PR1 and PR2 and the first and second NMOSFET regions NR1 and NR2 are removed during the etching process. The etching process is a wet etching process. An etchant material used in the etching process is chosen to quickly remove the sacrificial layer SAL, which has a relatively high germanium concentration. Meanwhile, the first source/drain pattern SD1 on the first and second PMOSFET regions PR1 and PR2 are protected from the etching process by the buffer layer BFL, which has a relatively low germanium concentration.

Referring back to FIG. 14D, in an embodiment, since the sacrificial layers SAL are selectively removed, only the first to third semiconductor patterns SP1, SP2, and SP3, which are stacked on each of the first and second active patterns AP1 and AP2, are left. Empty regions that are formed by removing the sacrificial layers SAL form first to third inner regions IRG1, IRG2, and IRG3, respectively.

In detail, the first inner region IRG1 is formed between the active pattern AP1 or AP2 and the first semiconductor pattern SP1, the second inner region IRG2 is formed between the first semiconductor pattern SP1 and the second semiconductor pattern SP2, and the third inner region IRG3 is formed between the second semiconductor pattern SP2 and the third semiconductor pattern SP3.

Referring to FIGS. 15A to 15D, in an embodiment, the gate insulating layer GI is conformally formed on the exposed first to third semiconductor patterns SP1, SP2, and SP3. The gate electrode GE is formed on the gate insulating layer GI. The gate electrode GE includes the first to third portions PO1, PO2, and PO3, which are respectively formed in the first to third inner regions IRG1, IRG2, and IRG3, and the fourth portion PO4, which is formed in the outer region ORG.

The gate electrode GE is recessed to have a reduced height. Upper portions of the gate cutting patterns CT are slightly recessed during the recessing of the gate electrode GE. The gate capping pattern GP is formed on the recessed gate electrode GE.

Referring back to FIGS. 4 and 5A to 5D, in an embodiment, the second interlayer insulating layer 120 is formed on the first interlayer insulating layer 110. The second interlayer insulating layer 120 includes a silicon oxide layer. The active contacts AC are formed that penetrate the second interlayer insulating layer 120 and the first interlayer insulating layer 110 and are electrically connected to the first and second source/drain patterns SD1 and SD2. The gate contact GC is formed that penetrates the second interlayer insulating layer 120 and the gate capping pattern GP and is electrically connected to the gate electrode GE.

The formation of each of the active and gate contacts AC and GC includes forming the barrier pattern BM and forming the conductive pattern FM on the barrier pattern BM. The barrier pattern BM is conformally formed and includes a metal layer and a metal nitride layer. The conductive pattern FM is formed of or includes a low resistance metal.

A pair of division structures DB is formed at both sides of each of the first and second single height cells SHC1 and SHC2. The division structure DB penetrates the second interlayer insulating layer 120 and the gate electrode GE and extends into the active pattern AP1 or AP2. The division structure DB is formed of or includes an insulating material, such as silicon oxide or silicon nitride).

The third interlayer insulating layer 130 is formed on the active contacts AC and the gate contacts GC. The first metal layer M1 is formed in the third interlayer insulating layer 130. The fourth interlayer insulating layer 140 is formed on the third interlayer insulating layer 130. The second metal layer M2 is formed in the fourth interlayer insulating layer 140.

Figure 12A:
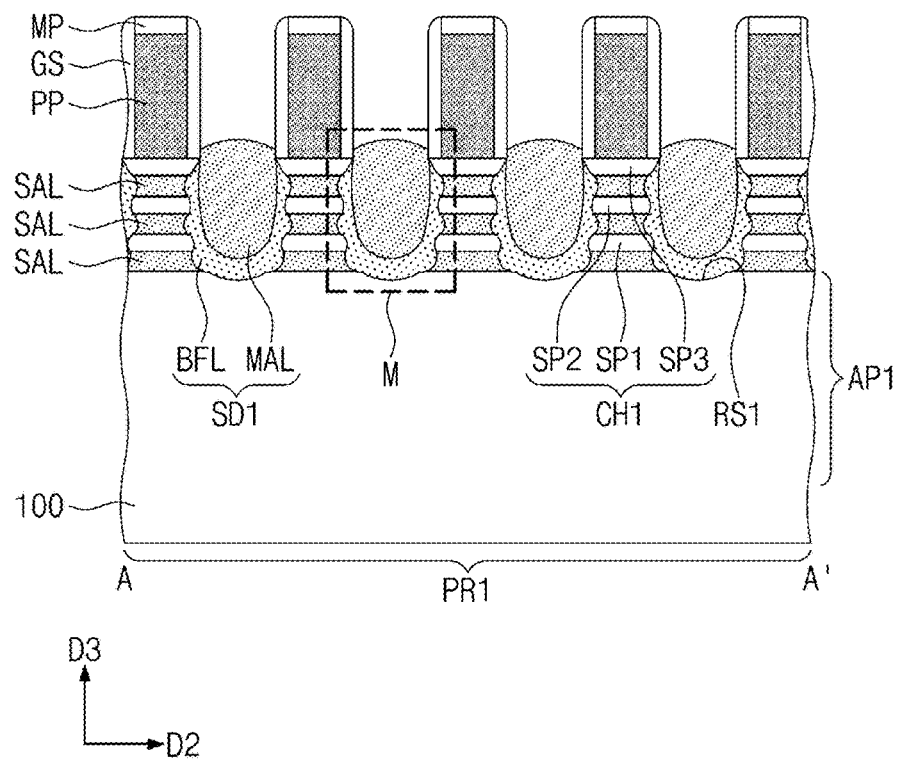
Figure 12B:
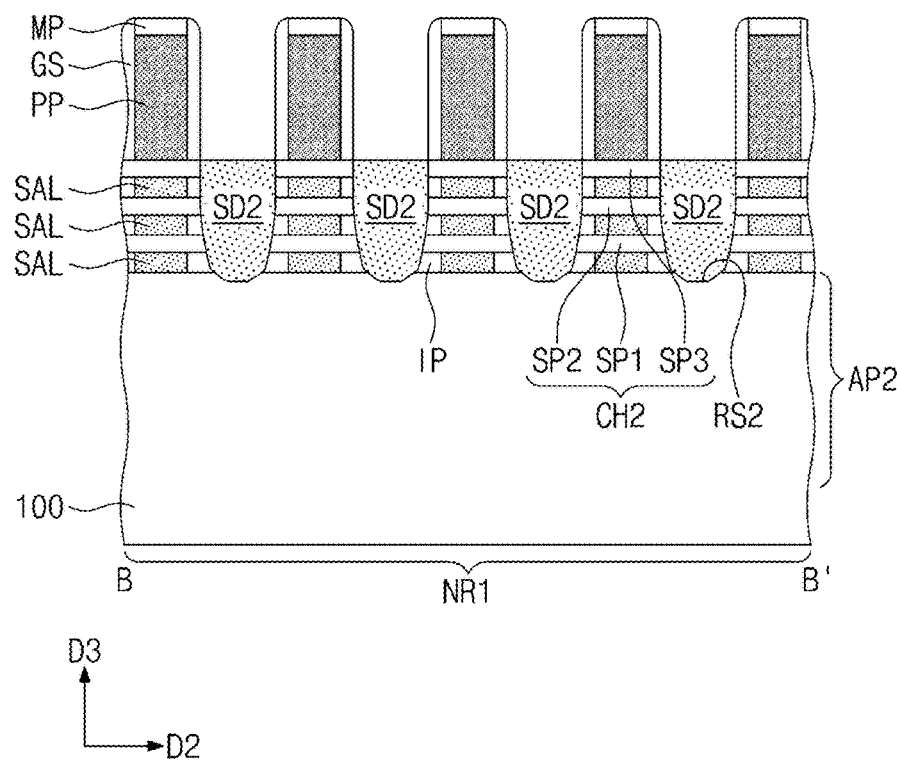
Figure 12C:
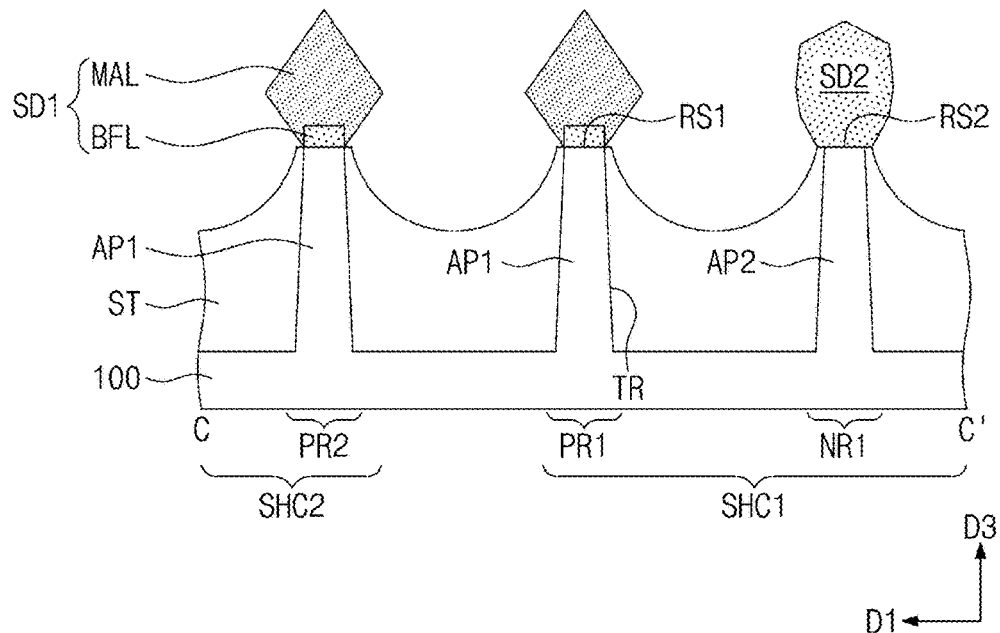
Figure 12D:
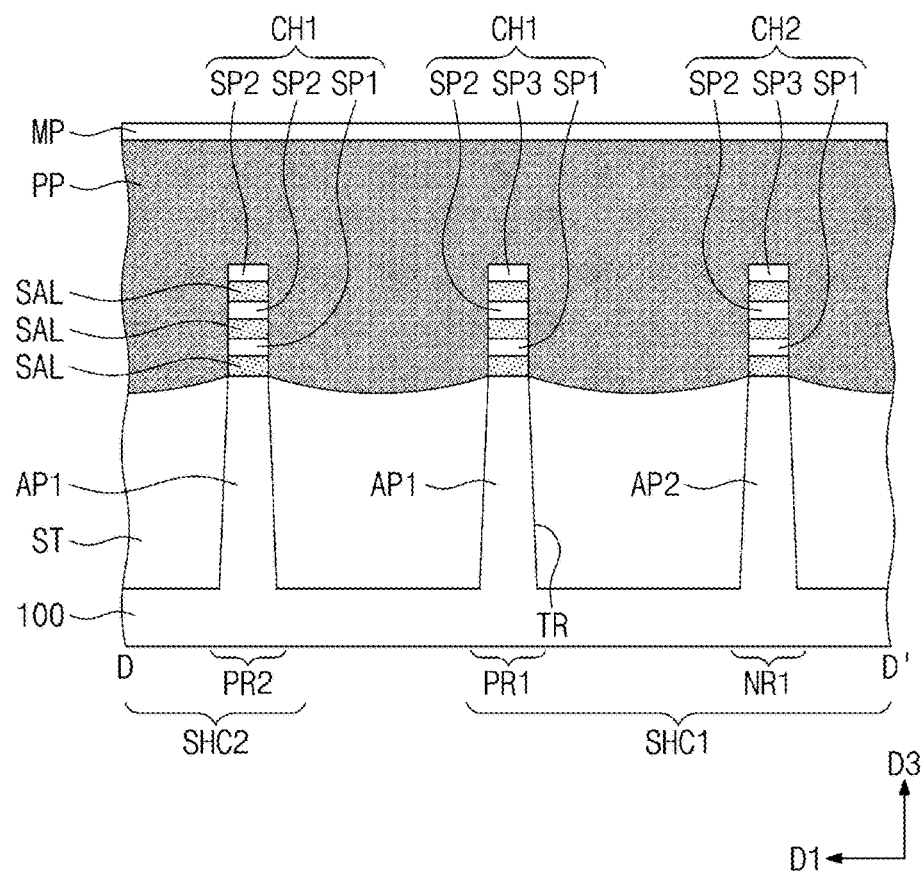
Figure 13A:
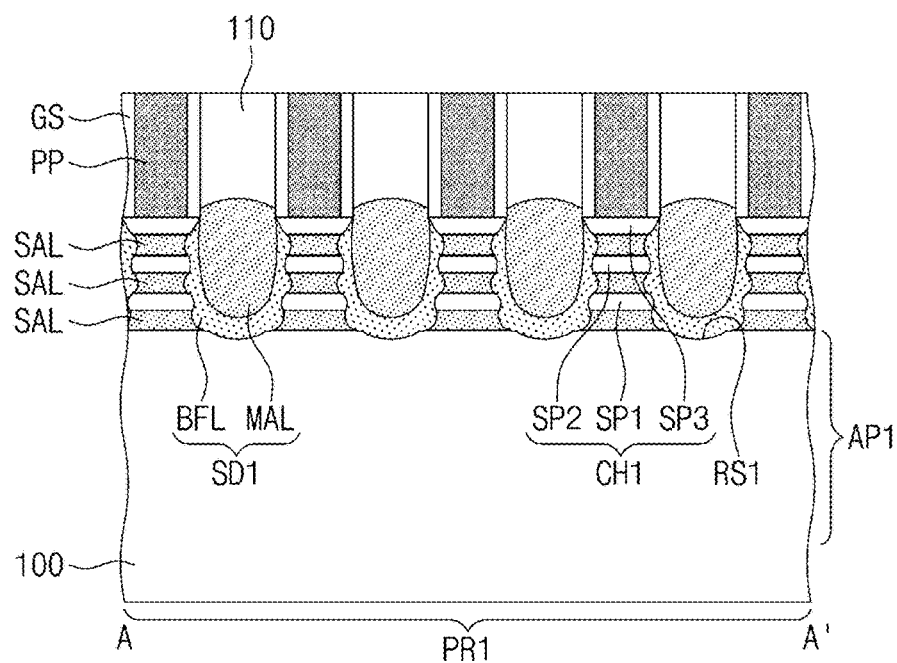
Figure 13B:
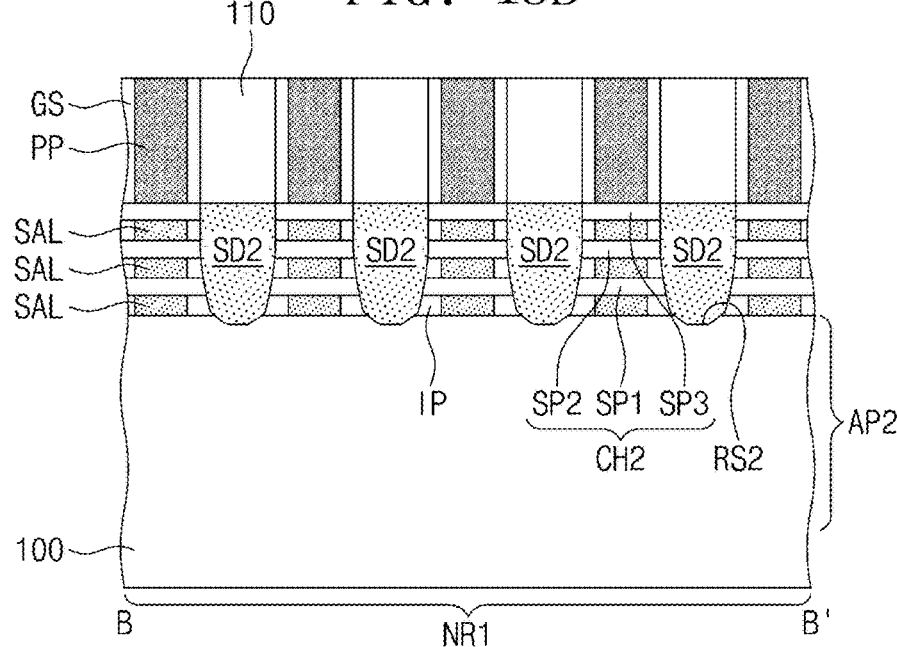
Figure 13C:
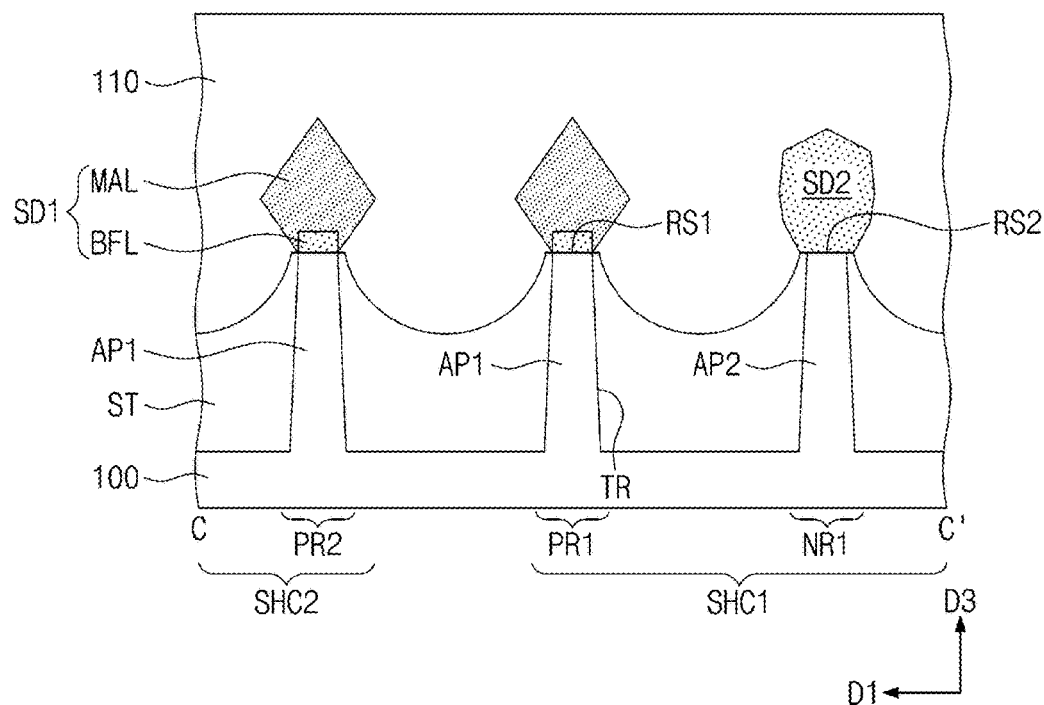
Figure 13D:
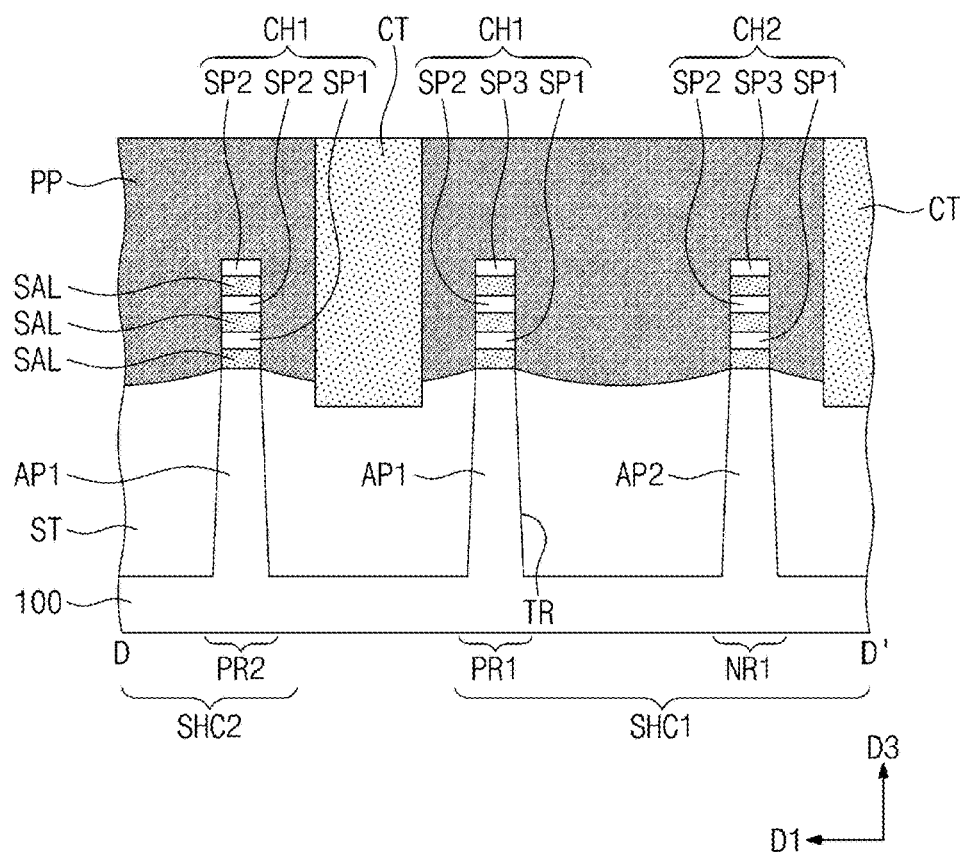

FIGS. 16A, 17A, 18A, and 19A are enlarged sectional views that illustrate a method of fabricating a first source/drain pattern in a portion 'M' of FIG. 12A. FIGS. 16B, 17B, 18B, and 19B are top plan views taken at levels M-M' of FIGS. 16A, 17A, 18A, and 19A, respectively.

Figure 16A:
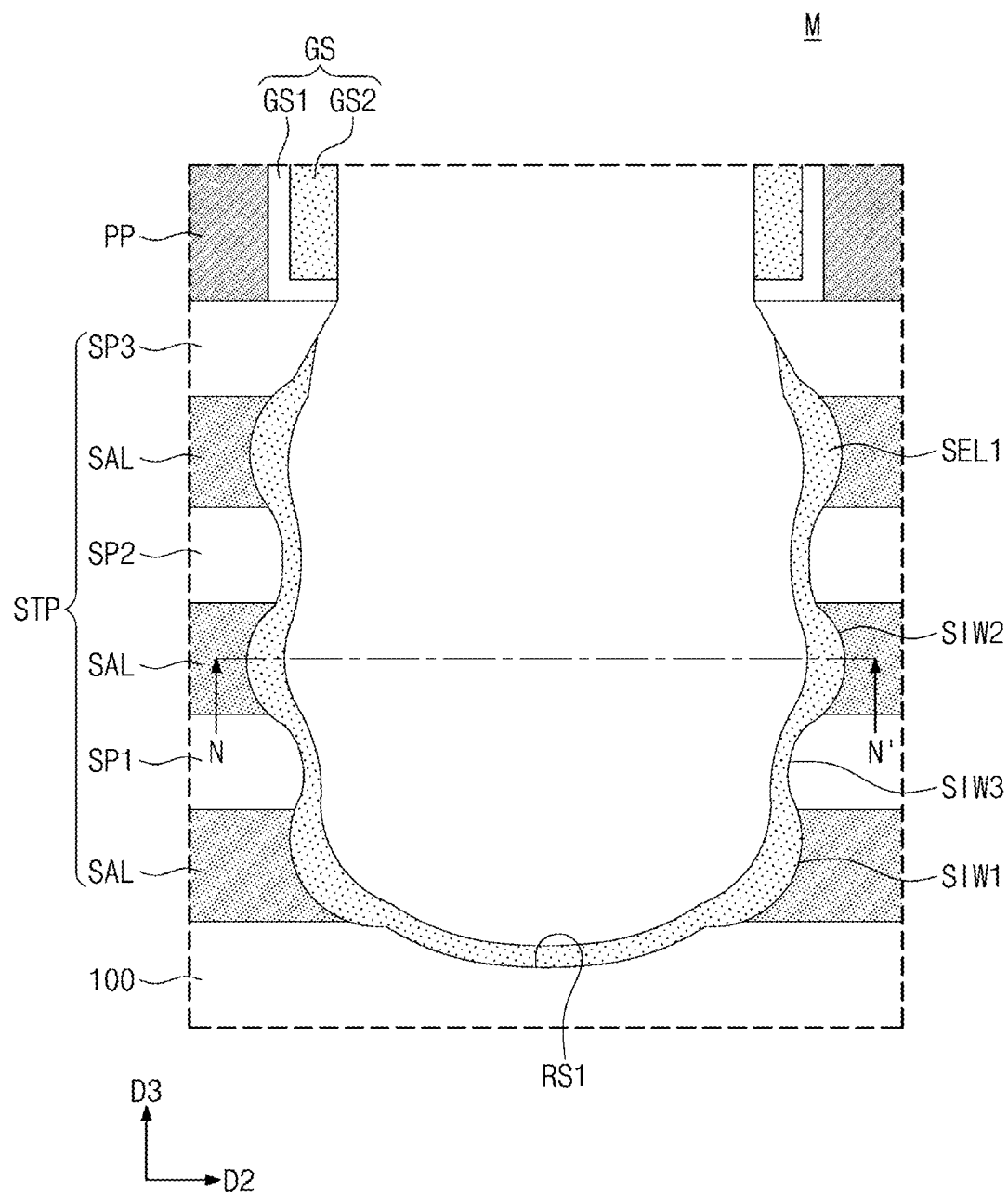
FIGS. 16A, 17A, 18A, and 19A are enlarged sectional views that illustrate a method of fabricating a first source/drain pattern in a portion 'M' of FIG. 12A.
Figure 16B:
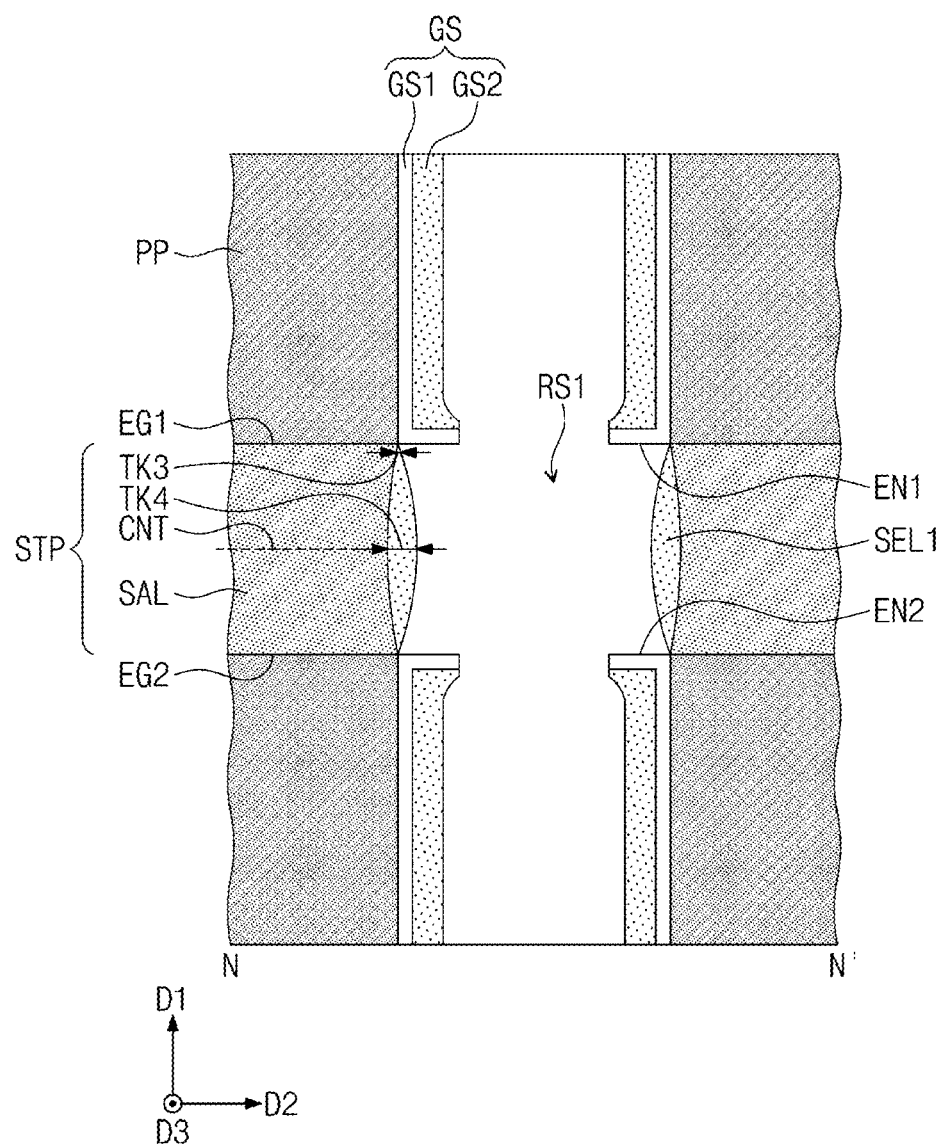
FIGS. 16B, 17B, 18B, and 19B are top plan views taken at levels M-M' of FIGS. 16A, 17A, 18A, and 19A, respectively.

Referring to FIGS. 16A and 16B, in an embodiment, the first recess RS1 is formed to penetrate the stacking pattern STP. The first recess RS1 is formed between a pair of adjacent sacrificial patterns PP. The first recess RS1 is formed using a pair of adjacent gate spacers GS as an etch mask.

The sacrificial layers SAL that are exposed through the first recess RS1 are further recessed such that the first recess RS1 has a wavy inner surface. In detail, the inner surface of the first recess RS1 includes the first side surface SIW1 that protrudes toward the sacrificial layer SAL, the second side surface SIW2 that protrudes toward the sacrificial layer SAL, and the third side surface SIW3 between the first and second side surfaces SIW1 and SIW2 and that has a concave shape.

A first SEG process is performed that forms the first semiconductor layer SEL1 on the inner surface of the first recess RS1. In an embodiment, the first semiconductor layer SEL1 is formed of or includes silicon germanium (SiGe). The first semiconductor layer SEL1 has a germanium concentration of 4 at % to 8 at %. Due to the wavy profile of the inner surface of the first recess RS1, the first semiconductor layer SEL1 also has a wavy profile.

Referring to FIG. 16B, in an embodiment, the first semiconductor layer SEL1 is formed on the sacrificial layer SAL between the first and second ends EN1 and EN2 of the gate spacer GS. The first semiconductor layer SEL1 includes an edge portion adjacent to the first or second edge EG1 or EG2 of the sacrificial layer SAL and a center portion adjacent to the center CNT of the sacrificial layer SAL. The edge portion of the first semiconductor layer SEL1 is in contact with the first or second end EN1 or EN2 of the gate spacer GS.

The edge portion of the first semiconductor layer SEL1 has a third thickness TK3, and the center portion of the first semiconductor layer SEL1 has a fourth thickness TK4. The fourth thickness TK4 is greater than the third thickness TK3. For example, a ratio TK3/TK4 of the third thickness TK3 to the fourth thickness TK4 is less than 0.2. This is because, during the first SEG process, a growth rate of the first semiconductor layer SEL1 is much lower at the edge portion than at the center portion.

Figure 17A:
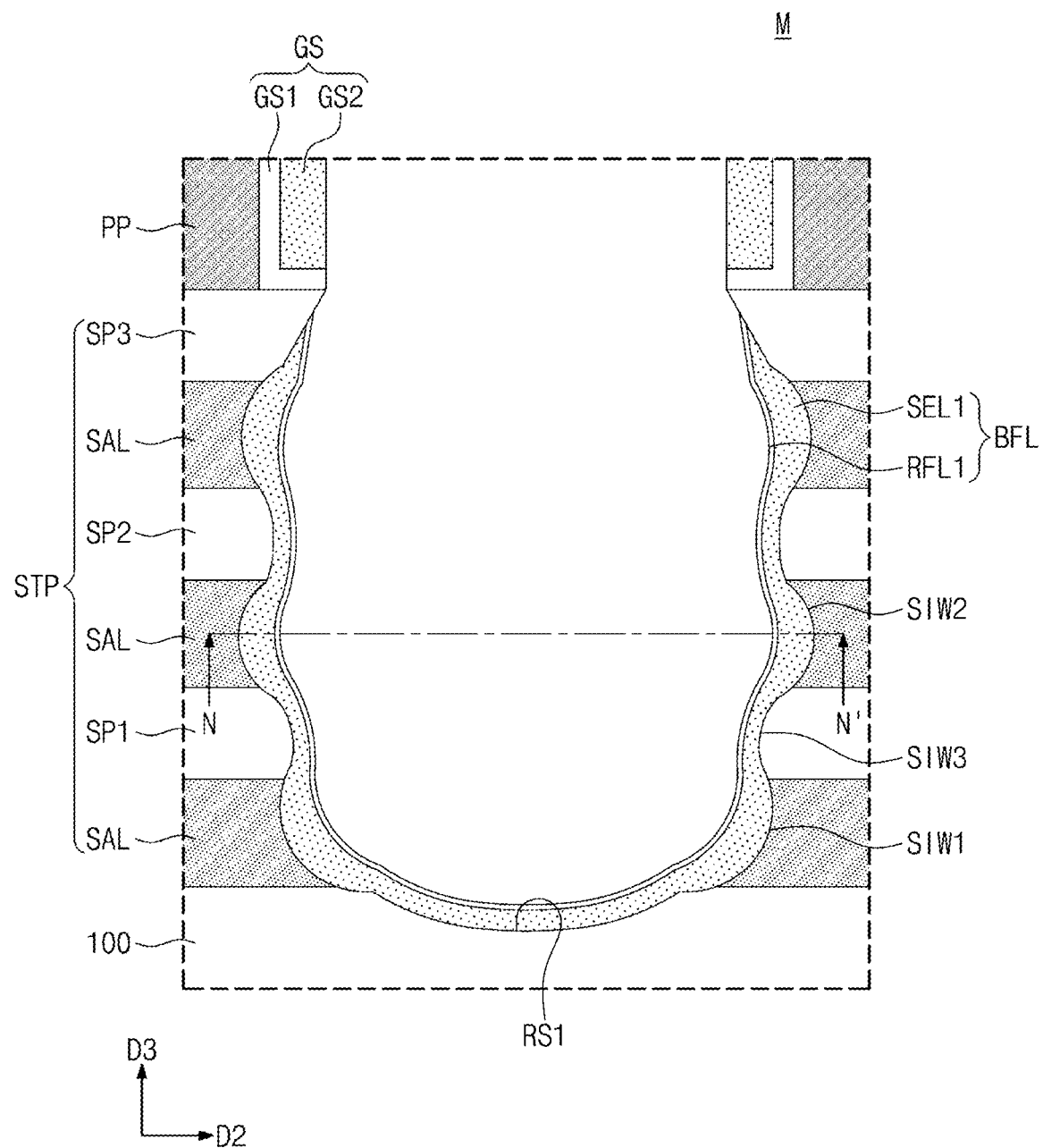
Figure 17B:
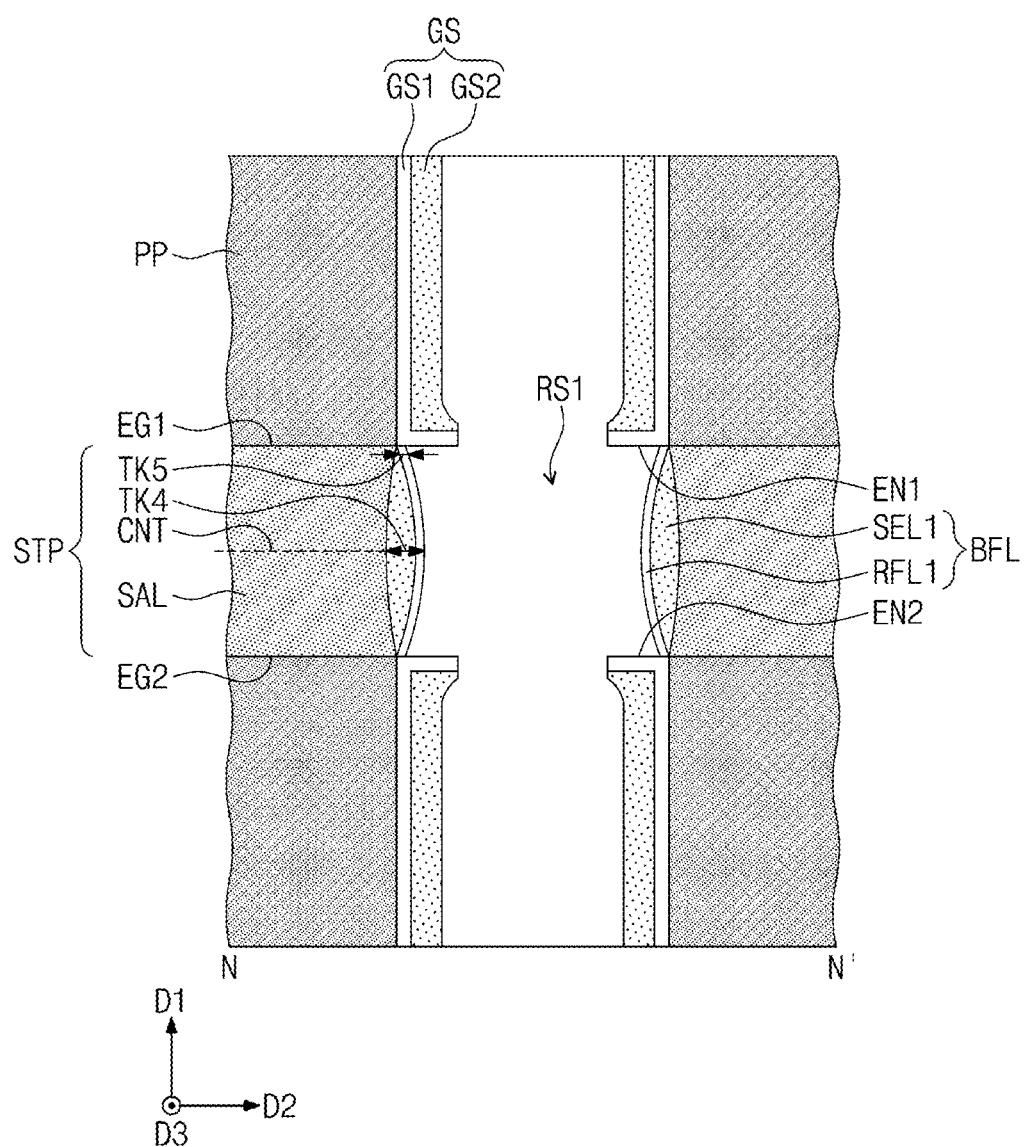

Referring to FIGS. 17A and 17B, in an embodiment, a first reflow process is performed on the first semiconductor layer SEL1 that forms the first reflow layer RFL1 on the first semiconductor layer SEL1. The first reflow process includes thermally treating the first semiconductor layer SEL1 at a predetermined temperature and for a predetermined time, under hydrogen ambient.

During the first reflow process, some of germanium atoms that are present on an exposed surface of the first semiconductor layer SEL1 react with hydrogen atoms and are volatized, and others participate in a migration process. As a result of the migration of the germanium atoms, the first semiconductor layer SEL1 has a changed surface profile, and the first reflow layer RFL1, which contains a low concentration of germanium, is formed.

Referring to FIG. 17B, in an embodiment, the first reflow layer RFL1 is formed on the exposed surface of the first semiconductor layer SEL1. For example, by controlling a process condition in the first reflow process, the first reflow layer RFL1 is formed to have a uniform thickness, as illustrated in FIG. 17B. Accordingly, a thickness of a center portion of the buffer layer BFL is maintained at a substantially uniform value, such as the fourth thickness TK4, whereas an edge portion of the buffer layer BFL has an increased thickness, such as a fifth thickness TK5 that is greater than the third thickness TK3 of FIG. 16B.

As a result, according to an embodiment of the inventive concept, since at least one reflow layer is formed in the buffer layer BFL, a thickness of the edge portion of the buffer layer BFL is increased. This can prevent process defects, which will be described with reference to FIG. 20.

Figure 18A:
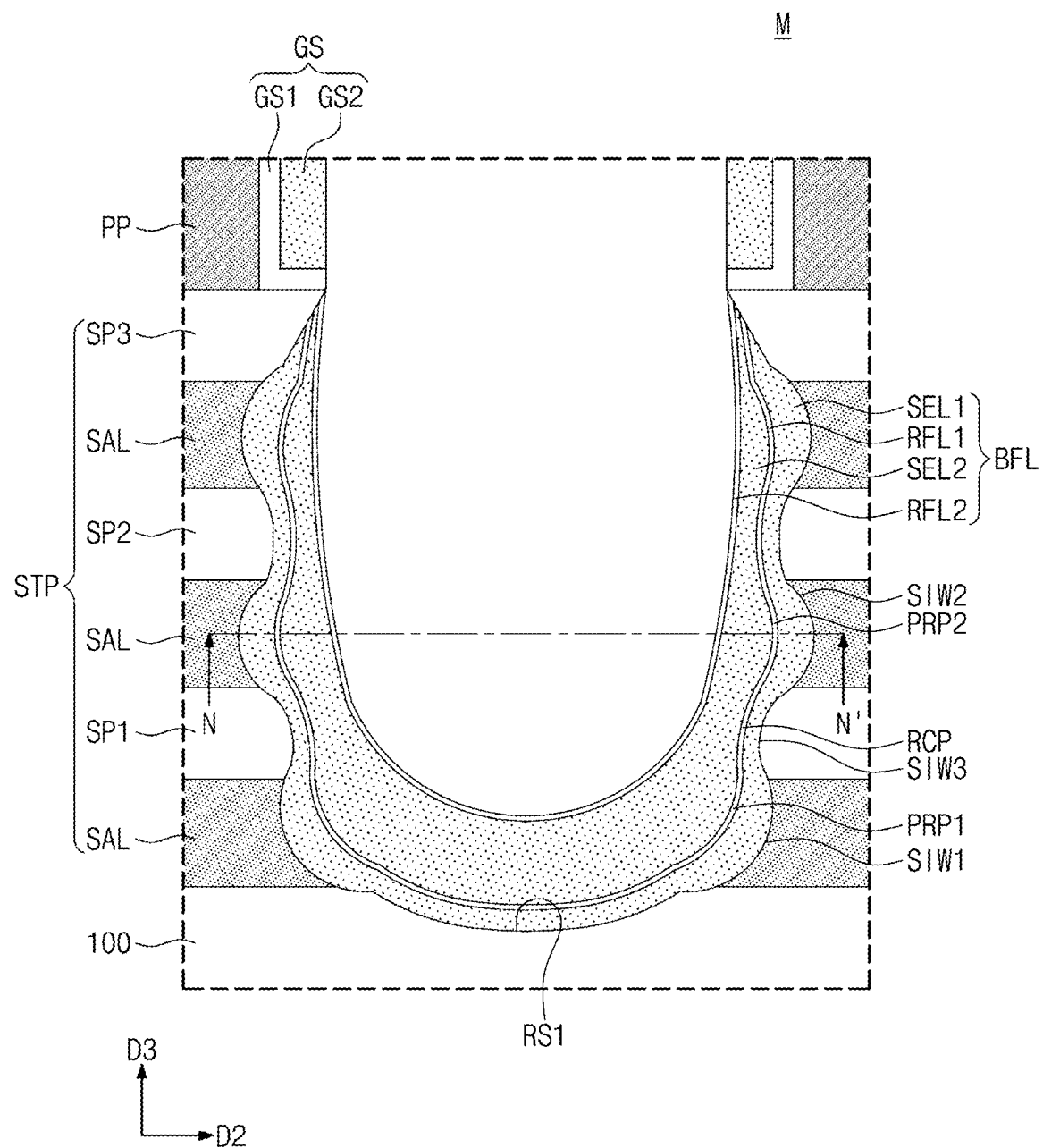
Figure 18B:
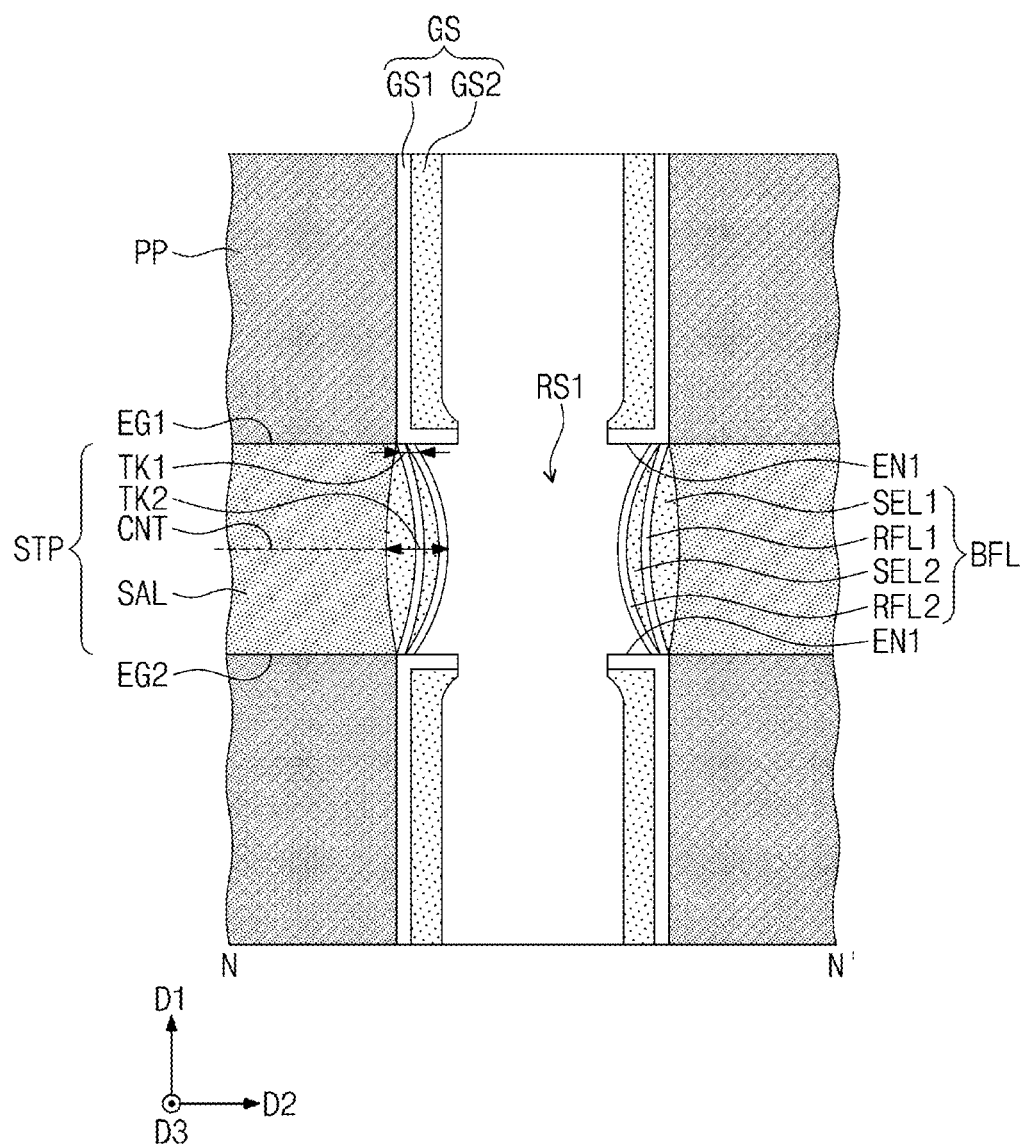

Referring to FIGS. 18A and 18B, in an embodiment, a second SEG process is performed on the first reflow layer RFL1 that forms the second semiconductor layer SEL2. In an embodiment, the second semiconductor layer SEL2 is formed of or includes silicon germanium (SiGe). The second semiconductor layer SEL2 has a germanium concentration of 4 at % to 10 at %.

In an embodiment, the second semiconductor layer SEL2 has the same germanium concentration as the first semiconductor layer SEL1. In an embodiment, the second semiconductor layer SEL2 has a germanium concentration that is greater than that of the first semiconductor layer SEL1.

A second reflow process is performed on the second semiconductor layer SEL2 that forms the second reflow layer RFL2 on the second semiconductor layer SEL2. The second reflow process includes thermally treating the second semiconductor layer SEL2 at a predetermined temperature and for a predetermined time, under hydrogen ambient. The second reflow process is performed under process conditions that are the same as or differ from those for the first reflow process.

Referring to FIG. 18B, in an embodiment, the buffer layer BFL is formed between the first and second ends EN1 and EN2 of the gate spacer GS. The edge portion of the buffer layer BFL has the first thickness TK1, and the center portion of the buffer layer BFL has the second thickness TK2 greater than the first thickness TK1. In an embodiment, a ratio TK1/TK2 of the first thickness TK1 to the second thickness TK2 range from 0.2 to 0.8. According to an embodiment, due to the presence of the first and second reflow layers RFL1 and RFL2, the first thickness TK1 of the buffer layer BFL has a relatively large value.

Figure 19A:
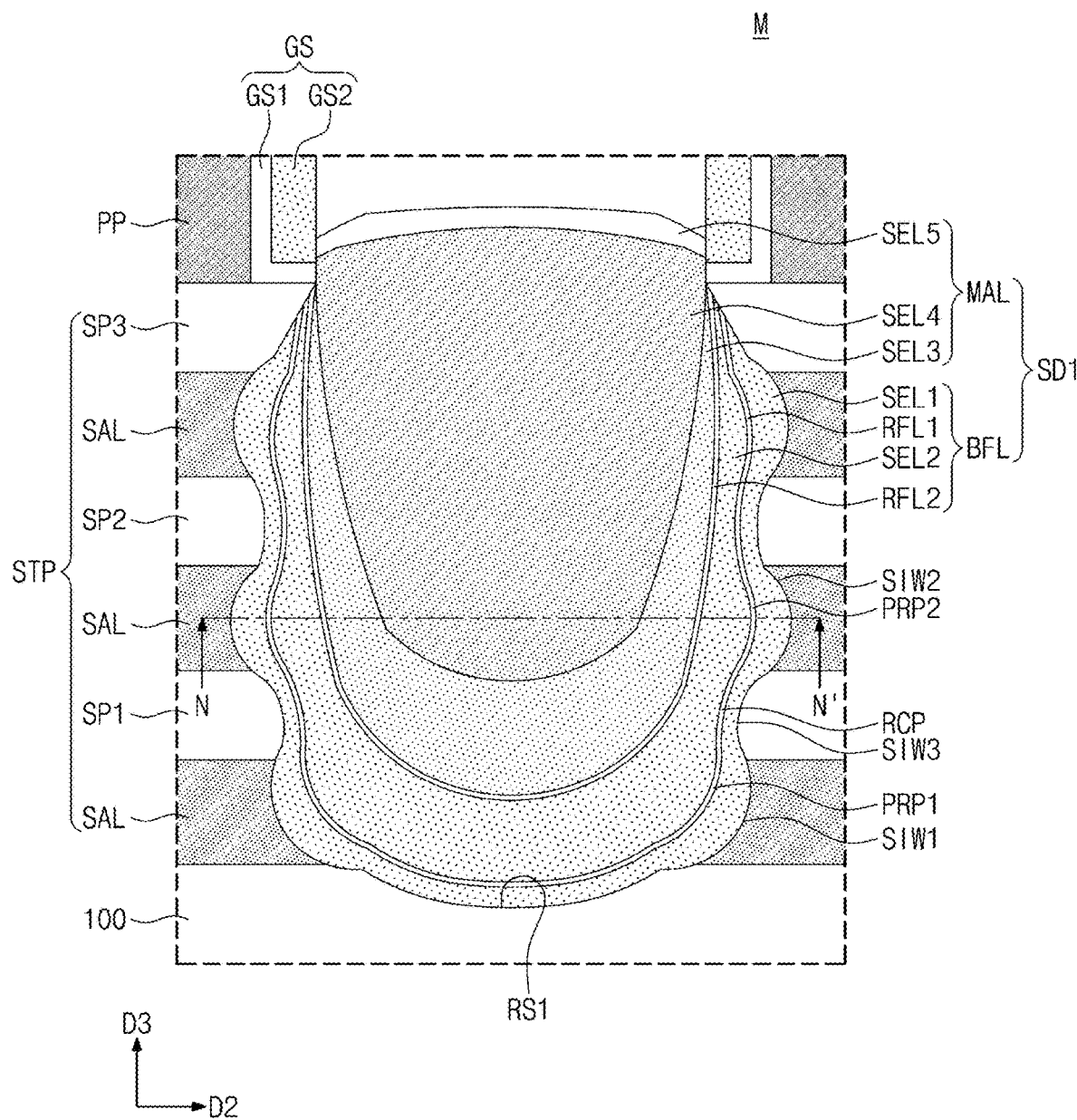
Figure 19B:
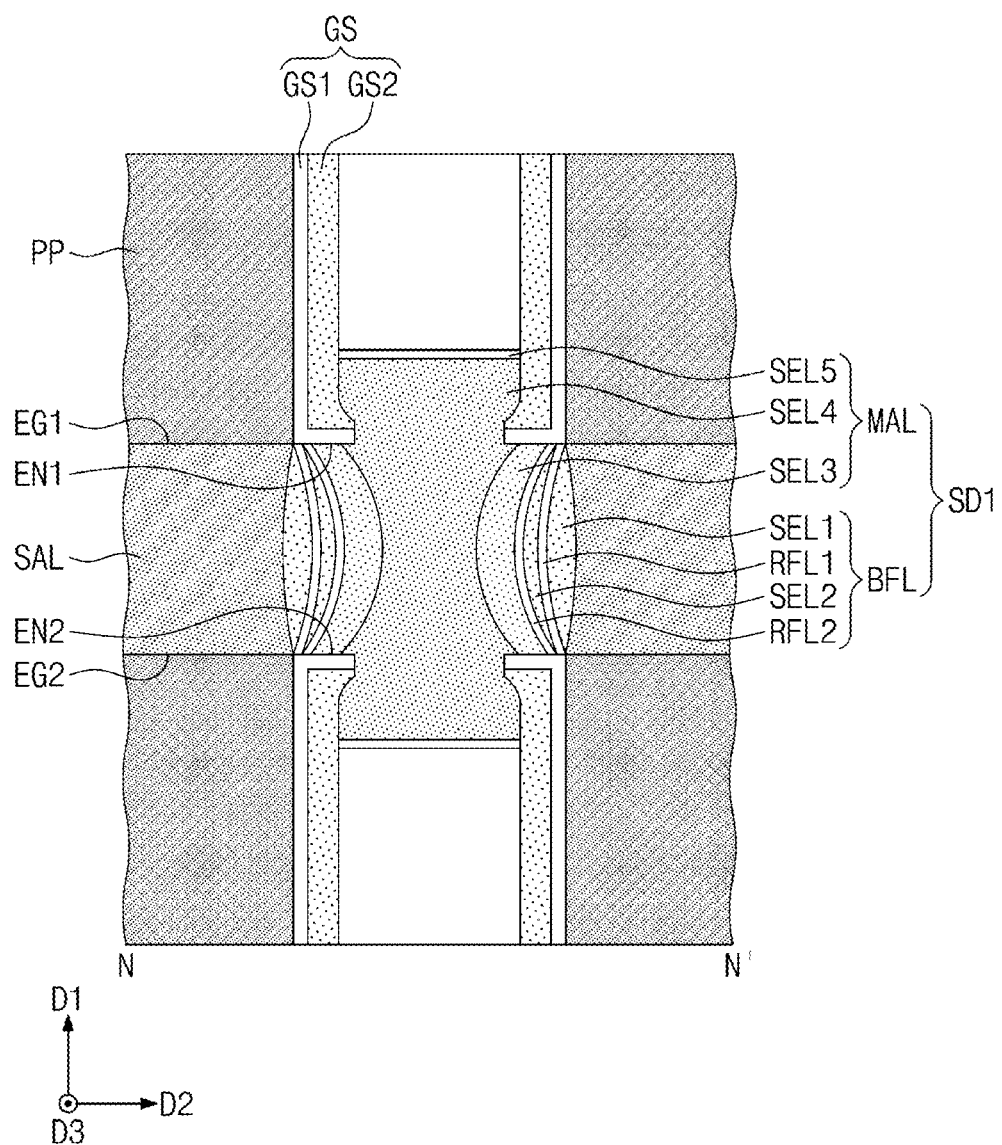

Referring to FIGS. 19A and 19B, in an embodiment, a third SEG process is performed on the buffer layer BFL that forms the third semiconductor layer SEL3. In an embodiment, the third semiconductor layer SEL3 is formed of or includes silicon germanium (SiGe). The third semiconductor layer SEL3 has a germanium concentration of 30 at % to 50 at %.

A fourth SEG process is performed on the third semiconductor layer SEL3 that forms the fourth semiconductor layer SEL4. The fourth semiconductor layer SEL4 fully fills the first recess RS1. The fourth semiconductor layer SEL4 has a top surface that is higher than that of the third semiconductor pattern SP3. In an embodiment, the fourth semiconductor layer SEL4 is formed of or includes silicon germanium (SiGe). The fourth semiconductor layer SEL4 has a germanium concentration of 50 at % to 70 at %.

A fifth SEG process is performed on the fourth semiconductor layer SEL4 that forms the fifth semiconductor layer SEL5. The fifth semiconductor layer SEL5 conformally covers an exposed surface of the main layer MAL. The fifth semiconductor layer SEL5 is formed of or includes silicon (Si), and a silicon concentration of the fifth semiconductor layer SEL5 ranges from 98 at % to 100 at %.

Figure 20:
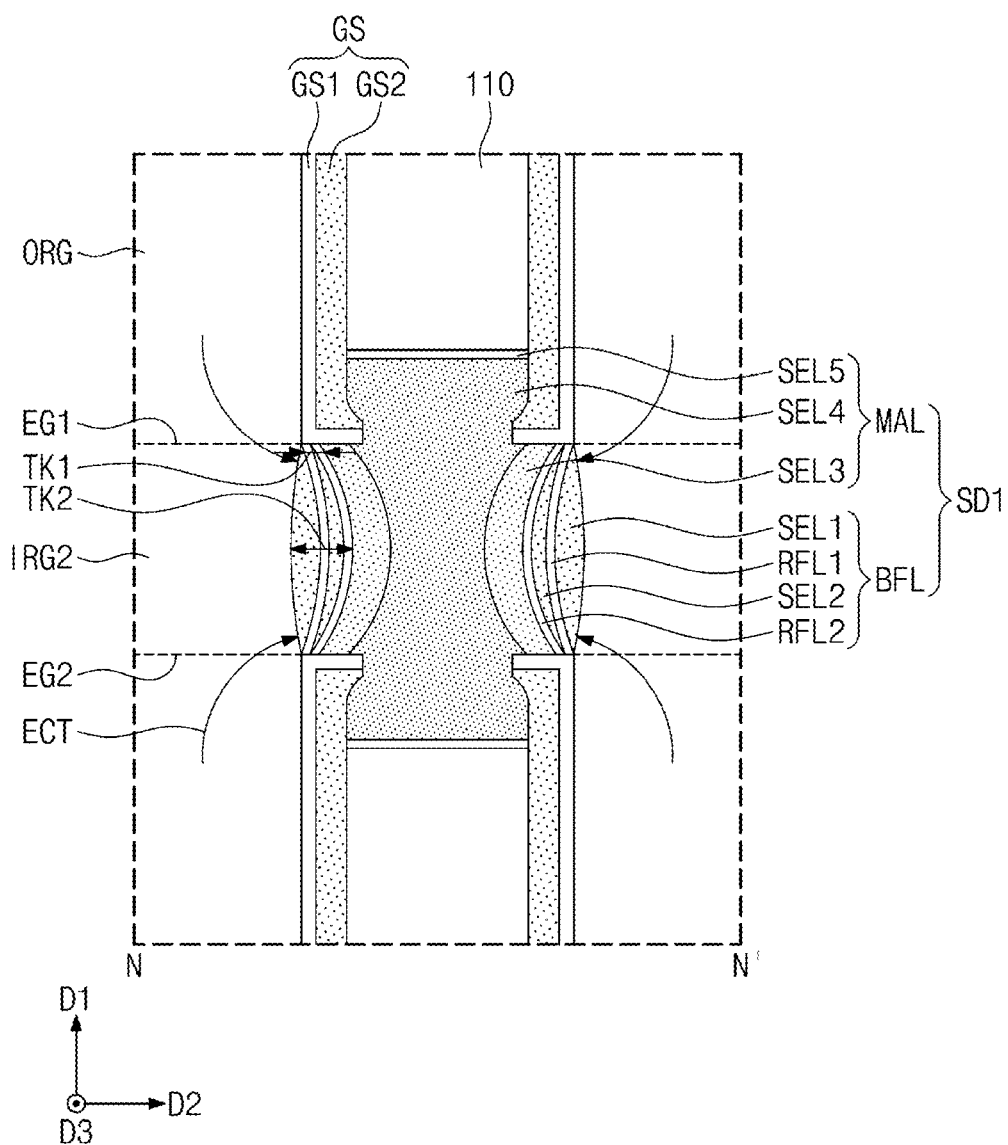
FIG. 20 is a plan view that illustrates a method of forming inner regions shown in FIG. 14A to 14D.

FIG. 20 is a plan view that illustrates a method of forming inner regions shown in FIG. 14A to 14D. Referring to FIG. 20, in an embodiment, the sacrificial pattern PP is removed to form the outer region ORG that exposes the sacrificial layer SAL. The sacrificial layer SAL exposed through the outer region ORG is selectively removed by an etchant material ECT that is chosen to etch a SiGe material whose germanium concentration is higher than 10 at %.

Since the sacrificial layer SAL is removed, the etchant material ECT is in direct contact with the buffer layer BFL of the first source/drain pattern SD1. However, since the buffer layer BFL includes a SiGe layer that has a germanium concentration lower than 10 at %, the buffer layer BFL is not etched by the etchant material ECT.

The edge portion of the conventional buffer layer BFL shown in FIG. 8 is a relatively thin. In this case, the etchant material ECT is easily supplied to the main layer MAL through the edge portion of the buffer layer BFL.

By contrast, since the buffer layer BFL according to an embodiment of the inventive concept includes the reflow layers RFL1 and RFL2 as shown in FIG. 20, the edge portion of the buffer layer BFL is relatively thick, for example, equal to the first thickness TK1. Thus, the etchant material ECT is effectively prevented from being in contact with the main layer MAL. As a result, damage to the first source/drain pattern SD1 is prevented, which increases the reliability of the semiconductor device.

Some embodiments of the inventive concept will be described below. In the following description, an element previously described with reference to FIGS. 4 to 6 may be identified by the same reference number without repeating an overlapping description thereof, for concise description.

Figure 21:
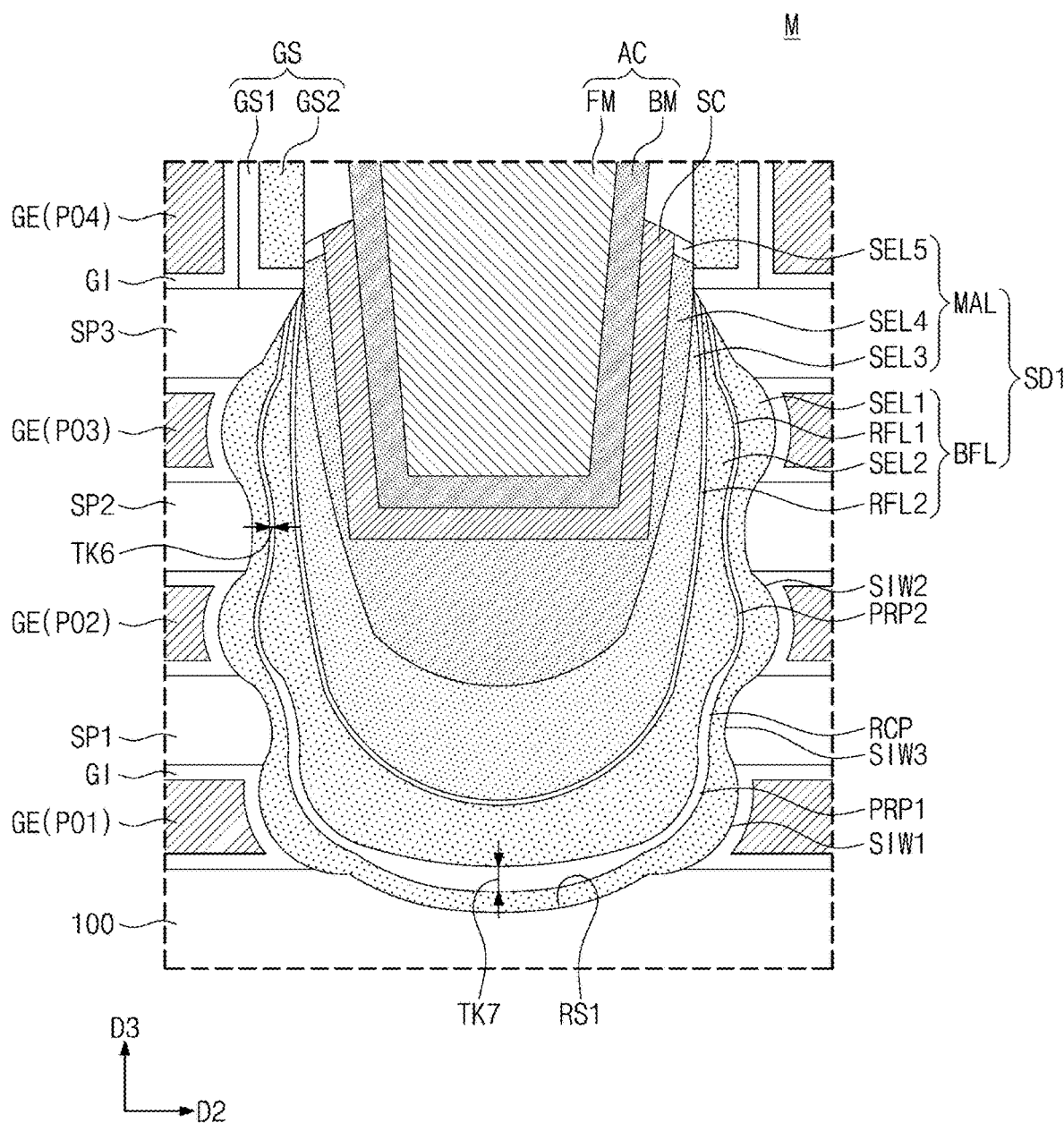
FIGS. 21 to 23 are enlarged views that illustrate other examples of the portion 'M' of FIG. 5A.
Figure 22:
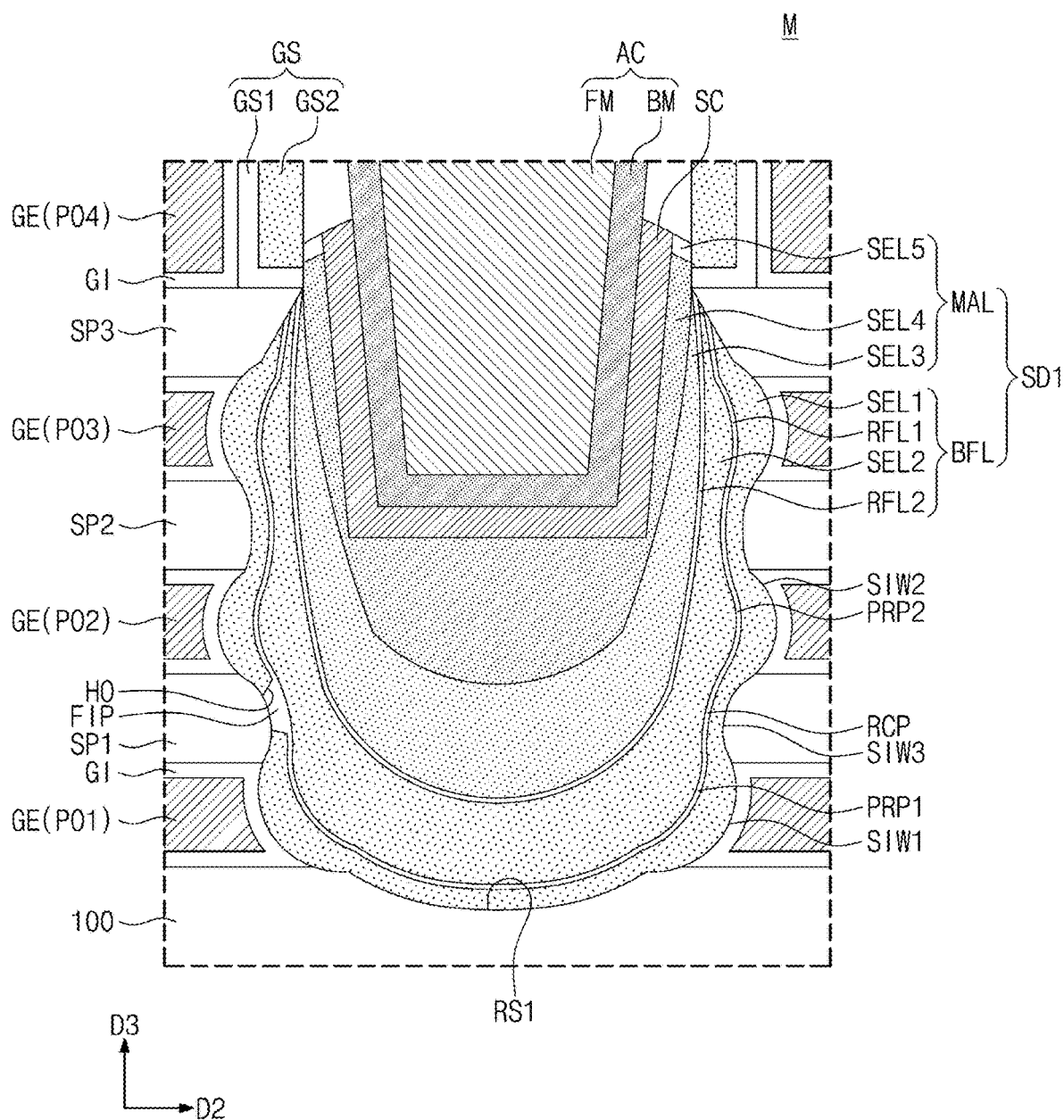
Figure 23:
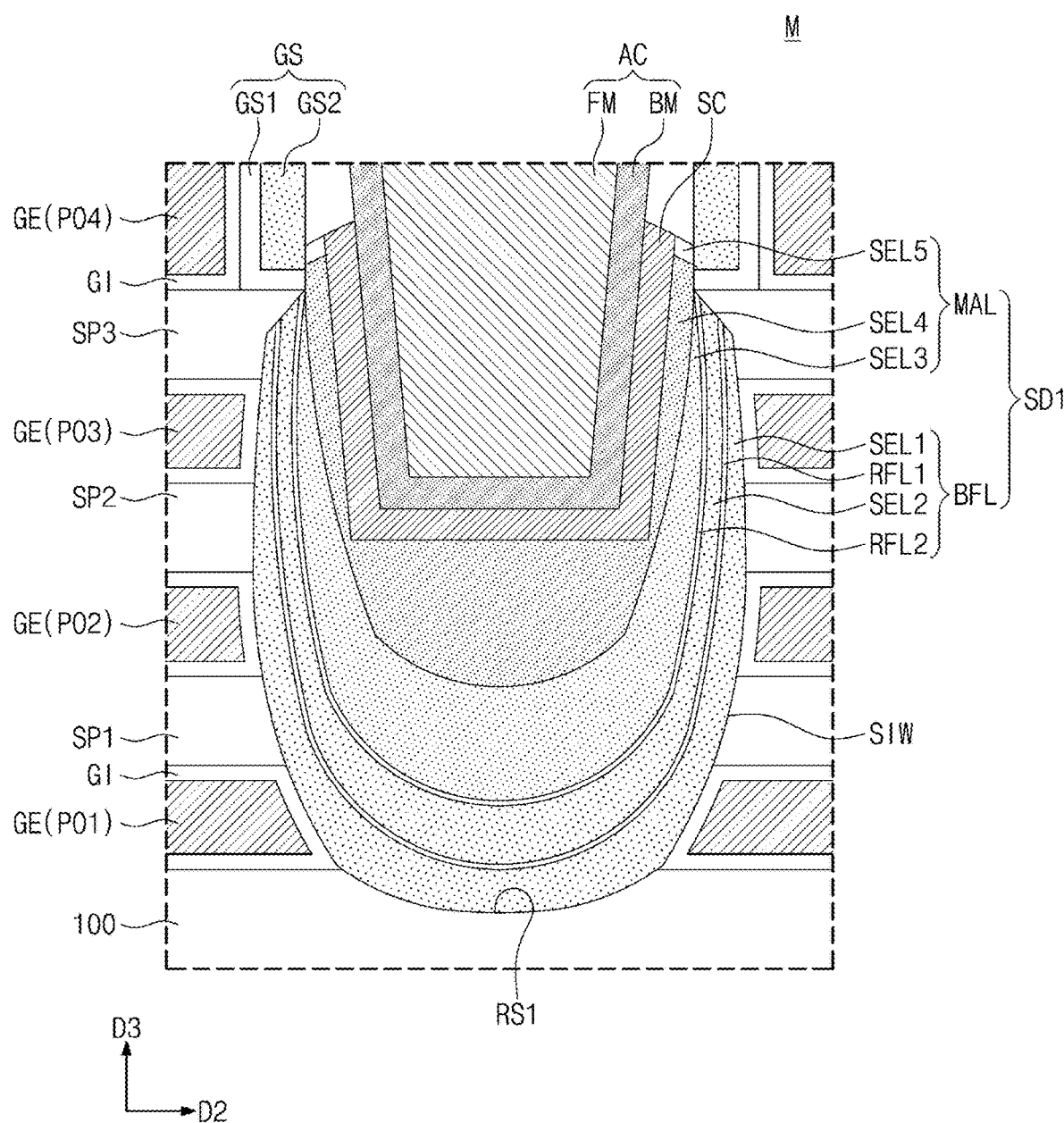

FIGS. 21 to 23 are enlarged views of other examples of the portion 'M' of FIG. 5A. Referring to FIG. 21, in an embodiment, a thickness of the first reflow layer RFL1 varies depending on a height or a vertical level. For example, the first reflow layer RFL1 adjacent to the second semiconductor pattern SP2 has a sixth thickness TK6, and the first reflow layer RFL1 adjacent to a bottom of the first recess RS1 may have a seventh thickness TK7. The seventh thickness TK7 is greater than the sixth thickness TK6.

In an embodiment, by controlling a process condition in a reflow process, the first reflow layer RFL1 is formed to have a height-dependent thickness. In particular, since the first reflow layer RFL1 has the lower thickness TK7 greater than the upper thickness TK6, the stacking fault can be prevented from occurring near the bottom of the first recess RS1. Furthermore, the first recess RS1 is fully filled with the main layer MAL, which can prevent defects from occurring in the main layer MAL.

Referring to FIG. 22, in an embodiment, the first semiconductor layer SEL1 includes at least one hole HO. For example, the hole HO of the first semiconductor layer SEL1 is formed on a side surface of the first semiconductor pattern SP1. The hole HO of the first semiconductor layer SEL1 is a defective region that is formed when the first semiconductor layer SEL1 is insufficiently formed on the side surface of the first semiconductor pattern SP1. That is, when the hole HO is formed, at least a portion of the side surface of the first semiconductor pattern SP1 is not covered with the first semiconductor layer SEL1.

The first reflow layer RFL1 include a filler portion FIP that fills the hole HO. The filler portion FIP of the first reflow layer RFL1 covers the portion of the side surface of the first semiconductor pattern SP1 that is exposed by the hole HO. During the process of forming the first reflow layer RFL1, germanium atoms migrate into the hole HO, and as a result, the filler portion FIP is formed.

The hole HO of the first semiconductor layer SEL1 degrades electric characteristics of a semiconductor device. However, in an embodiment, since the first reflow layer RFL1 includes the filler portion FIP that fills the hole HO, the defect in the first semiconductor layer SEL1 can be cured. Thus, the electric characteristics of the semiconductor device are increased.

Referring to FIG. 23, in an embodiment, a side surface SIW of the first source/drain pattern SD1 has a rounded profile, not a wavy profile. That is, the first reflow layer RFL1 does not include the first protruding portion PRP1, the second protruding portion PRP2, and the concave portion RCP therebetween, described with reference to FIG. 6. For example, each of the first and second reflow layers RFL1 and RFL2 has a 'U'-shaped section.

According to an embodiment of the inventive concept, a source/drain pattern includes a buffer layer that contains silicon germanium (SiGe) and includes at least one reflow layer. The reflow layer allows an inner side surface of the buffer layer to have a desired profile, and thus, a defect-free main layer can be formed on the buffer layer. By forming the reflow layer, a thickness of an edge portion of the buffer layer is increased, which prevents process defect, such as damage to the source/drain pattern, from occurring in a process of forming a gate electrode. As a result, reliability of a semiconductor device is increased.

While embodiments of the inventive concept have been particularly shown and described, it will be understood by one of ordinary skill in the art that variations in form and detail may be made therein without departing from the spirit and scope of the attached claims.

What is claimed is:
1. A semiconductor device, comprising:
   a substrate that includes an active pattern;

a channel pattern disposed on the active pattern, wherein the channel pattern includes a plurality of semiconductor patterns that are vertically stacked and spaced apart from each other;
a source/drain pattern connected to the plurality of semiconductor patterns; and
a gate electrode disposed on the plurality of semiconductor patterns,
wherein the gate electrode includes a plurality of portions that are respectively interposed between the plurality of semiconductor patterns,
the source/drain pattern includes a buffer layer in contact with the plurality of semiconductor patterns and a main layer disposed on the buffer layer,
the buffer layer contains silicon germanium (SiGe) and includes a first semiconductor layer and a first reflow layer disposed on the first semiconductor layer,
a germanium concentration of the first reflow layer is less than a germanium concentration of the first semiconductor layer,
a side surface of the first semiconductor layer includes a protruding side surface that protrudes toward a first portion of the plurality of portions of the gate electrode, and a concave side surface in contact with a first semiconductor pattern of the plurality of semiconductor patterns, and
the first reflow layer includes a protruding portion that corresponds to the protruding side surface and a concave portion that corresponds to the concave side surface.

2. The semiconductor device of claim 1, wherein
the side surface of the first semiconductor layer has a wavy profile, and
the first reflow layer has a wavy shape that corresponds to the side surface of the first semiconductor layer.

3. The semiconductor device of claim 1, wherein a mean thickness of the first reflow layer is less than a mean thickness of the first semiconductor layer.

4. The semiconductor device of claim 1, wherein
the germanium concentration of the first reflow layer ranges from 2 at % to 5 at %, and
the germanium concentration of the first semiconductor layer ranges from 4 at % to 8 at %.

5. The semiconductor device of claim 1, wherein
a germanium concentration of the buffer layer ranges from 2 at % to 8 at %, and
a germanium concentration of the main layer ranges from 30 at % to 70 at %.

6. The semiconductor device of claim 1, wherein a thickness of the first reflow layer adjacent to the first semiconductor layer is less than a thickness of the first reflow layer adjacent to a bottom of the source/drain pattern.

7. The semiconductor device of claim 1, wherein
the first reflow layer includes a filler portion that is configured to fill a hole in the first semiconductor layer.

8. The semiconductor device of claim 1, wherein
the buffer layer further comprises a second semiconductor layer disposed on the first reflow layer and a second reflow layer interposed between the second semiconductor layer and the main layer, and
a germanium concentration of the second reflow layer is less than a germanium concentration of the second semiconductor layer.

9. The semiconductor device of claim 8, wherein
the germanium concentration of the second reflow layer is greater than the germanium concentration of the first reflow layer, and the germanium concentration of the second semiconductor layer is greater than the germanium concentration of the first semiconductor layer.

10. The semiconductor device of claim 1, wherein the first reflow layer has a super lattice structure that includes germanium.

11. A semiconductor device, comprising:
a substrate that includes an active pattern;
a pair of channel patterns disposed on the active pattern;
a source/drain pattern interposed between the pair of channel patterns;
a pair of gate electrodes disposed on the pair of channel patterns, respectively; and
a gate spacer disposed on a side surface of each of the pair of gate electrodes,
wherein, when viewed in a plan view, the source/drain pattern comprises:
a buffer layer interposed between a first end and a second end of the gate spacer; and
a main layer disposed on the buffer layer,
wherein the buffer layer includes at least one reflow layer,
an edge portion of the buffer layer has a first thickness,
a center portion of the buffer layer has a second thickness greater than the first thickness, and
a ratio of the first thickness to the second thickness ranges from 0.2 to 0.8.

12. The semiconductor device of claim 11, wherein
the buffer layer contains silicon germanium (SiGe) and further includes a semiconductor layer in direct contact with the pair of channel patterns,
a germanium concentration of the at least one reflow layer is less than a germanium concentration of the semiconductor layer, and
a thickness of the at least one reflow layer is less than a thickness of the semiconductor layer.

13. The semiconductor device of claim 12, wherein
the germanium concentration of the reflow layer ranges from 2 at % to 5 at %, and
the germanium concentration of the semiconductor layer ranges from 4 at % to 8 at %.

14. The semiconductor device of claim 11, wherein the edge portion of the buffer layer is in contact with the first or second end of the gate spacer.

15. The semiconductor device of claim 11, wherein
a germanium concentration of the buffer layer ranges from 2 at % to 8 at %, and
a germanium concentration of the main layer ranges from 30 at % to 70 at %.

16. A semiconductor device, comprising:
a substrate that includes a PMOSFET region and an NMOSFET region that are spaced apart from each other;
a first active pattern disposed on the PMOSFET region and a second active pattern disposed on the NMOSFET region;
a first channel pattern and a first source/drain pattern disposed on the first active pattern;
a second channel pattern and a second source/drain pattern disposed on the second active pattern;
a gate electrode disposed on the first and second channel patterns;
a gate insulating layer interposed between the gate electrode and the first and second channel patterns;
a gate spacer disposed on a side surface of the gate electrode;
a gate capping pattern disposed on a top surface of the gate electrode;

a gate cutting pattern that penetrates the gate electrode;

an interlayer insulating layer disposed on the gate capping pattern and the gate cutting pattern;

first and second active contacts that penetrate the interlayer insulating layer and are electrically connected to the first and second source/drain patterns, respectively;

metal-semiconductor compound layers respectively interposed between the first and second active contacts and the first and second source/drain patterns;

a gate contact that penetrates the interlayer insulating layer and the gate capping pattern and is electrically connected to the gate electrode;

a first metal layer disposed on the interlayer insulating layer, wherein the first metal layer includes a power line that vertically overlaps the gate cutting pattern, and first interconnection lines that are electrically and connected to the first and second active contacts and the gate contact, respectively; and a second metal layer disposed on the first metal layer, wherein the second metal layer includes second interconnection lines electrically connected to the first metal layer, the first channel pattern includes a plurality of semiconductor patterns that are vertically stacked and are spaced apart from each other, the first source/drain pattern includes a buffer layer in contact with the plurality of semiconductor patterns and a main layer disposed on the buffer layer, and the buffer layer comprises a first semiconductor layer and a first reflow layer disposed on the first semiconductor layer.

17. The semiconductor device of claim 16, wherein the gate electrode comprises a plurality of portions, which are respectively provided between the plurality of semiconductor patterns, a side surface of the first semiconductor layer comprises a protruding side surface, which protrudes toward a first portion of the plurality of portions of the gate electrode, and a concave side surface, which is in contact with a first semiconductor pattern of the plurality of semiconductor patterns, and the first reflow layer comprises a protruding portion corresponding to the protruding side surface and a concave portion corresponding to the concave side surface.

18. The semiconductor device of claim 16, wherein the buffer layer contains silicon germanium (SiGe), and a germanium concentration of the first reflow layer is less than a germanium concentration of the first semiconductor layer.

19. The semiconductor device of claim 18, wherein the buffer layer further comprises a second semiconductor layer disposed on the first reflow layer and a second reflow layer interposed between the second semiconductor layer and the main layer, and a germanium concentration of the second reflow layer is less than a germanium concentration of the second semiconductor layer.

20. The semiconductor device of claim 16, wherein a mean thickness of the first reflow layer is less than a mean thickness of the first semiconductor layer.

* * * * *